(12) United States Patent
Fricker et al.

(10) Patent No.: US 11,145,530 B2
(45) Date of Patent: Oct. 12, 2021

(54) SYSTEM AND METHOD FOR ALIGNMENT OF AN INTEGRATED CIRCUIT

(71) Applicant: Cerebras Systems Inc., Los Altos, CA (US)

(72) Inventors: Jean-Philippe Fricker, Los Altos, CA (US); Tim Botsford, Los Altos, CA (US); Philip Ferolito, Los Alto, CA (US); Paul Kennedy, Los Altos, CA (US)

(73) Assignee: Cerebras Systems Inc., Los Altos, CA (US)

( * ) Notice: Subject to any disclaimer, the term of this patent is extended or adjusted under 35 U.S.C. 154(b) by 0 days.

(21) Appl. No.: 17/093,283

(22) Filed: Nov. 9, 2020

(65) Prior Publication Data
US 2021/0143041 A1 May 13, 2021

Related U.S. Application Data

(60) Provisional application No. 62/932,615, filed on Nov. 8, 2019.

(51) Int. Cl.
*H01L 21/68* (2006.01)
*H01L 21/48* (2006.01)
(Continued)

(52) U.S. Cl.
CPC ............ *H01L 21/681* (2013.01); *G06T 7/001* (2013.01); *H01L 21/4853* (2013.01);
(Continued)

(58) Field of Classification Search
CPC ................. H01L 21/681; H01L 23/544; H01L 2224/80148–8018; H01L 2224/81148–8118; H01L 2224/08121; H01L 2224/80121–80132; H01L 2224/81121–81132;
(Continued)

(56) References Cited

U.S. PATENT DOCUMENTS 4,100,566 A 7/1978 Okikawa et al.
4,932,883 A 6/1990 Hsia et al.
(Continued)

FOREIGN PATENT DOCUMENTS

CN 106952973 A 7/2017
CN 111172484 A * 5/2020

OTHER PUBLICATIONS

University of California—Berkeley, "Using Vernier Scales", Electrical Engineering and Computer Science Department, Nov. 1997 (Year: 1997).*

(Continued)

*Primary Examiner* — Selim U Ahmed
*Assistant Examiner* — Evan G Clinton
(74) *Attorney, Agent, or Firm* — Jeffrey Schox

(57) ABSTRACT

The integrated circuit assembly can include: a semiconductor and a substrate (e.g., PCB). The integrated circuit assembly can optionally include: a compliant connector, a thermal management, and a securing element. The semiconductor 210 can include a first alignment feature. (e.g., orifice). The substrate can include a second alignment feature (e.g., alignment target) and conductive pads. The substrate can optionally include a cavity.

21 Claims, 37 Drawing Sheets

(51) Int. Cl.
*G06T 7/00* (2017.01)
*H01L 21/66* (2006.01)
*H01L 23/544* (2006.01)

(52) U.S. Cl.
CPC ............ *H01L 22/20* (2013.01); *H01L 23/544* (2013.01); *G06T 2207/30141* (2013.01); *G06T 2207/30148* (2013.01)

(58) Field of Classification Search
CPC ............... H01L 2224/82121–82132; H01L 2224/83121–83132; H01L 2224/84121–84132; H01L 2224/85121–85132; H01L 2224/86121–86132; H01L 2224/95121–95134; H01L 2021/60075; H01L 2224/75753; H01L 2223/54426; H01L 2224/0213; H01L 2224/0217; H01L 2224/0224; H01L 2221/68309; H01L 2224/10135; H01L 2224/10165; H01L 2224/26135; H01L 2224/26165; H01L 2224/40993; H01L 2224/40998; H01L 2224/48993; H01L 2224/18998; H01L 2225/06593; B81C 3/004; B81C 2203/051; B81C 99/007
See application file for complete search history.

(56) References Cited

U.S. PATENT DOCUMENTS

| | | | |
|---|---|---|---|
| 4,949,035 A | 8/1990 | Palmer | |
| 4,998,885 A | 3/1991 | Beaman | |
| 5,140,405 A | 8/1992 | King et al. | |
| 5,308,682 A | 5/1994 | Morikawa | |
| 5,378,928 A | 1/1995 | Anderson et al. | |
| 5,430,611 A * | 7/1995 | Patel | H01L 23/433 257/724 |
| 5,770,336 A | 6/1998 | Choi | |
| 5,898,227 A | 4/1999 | Geffken et al. | |
| 6,211,935 B1 * | 4/2001 | Yamada | H01L 23/544 349/149 |
| 6,281,577 B1 | 8/2001 | Oppermann et al. | |
| 6,477,058 B1 | 11/2002 | Luebs et al. | |
| 6,641,745 B2 | 11/2003 | Tan et al. | |
| 6,925,411 B1 * | 8/2005 | Drost | H01L 22/34 257/797 |
| 6,936,521 B2 | 8/2005 | Chien | |
| 7,141,450 B2 * | 11/2006 | Pardo | G01B 11/27 438/108 |
| 7,564,554 B2 | 7/2009 | Weiss | |
| 7,598,167 B2 | 10/2009 | Watkins et al. | |
| 7,681,309 B2 | 3/2010 | Miller | |
| 7,803,714 B2 | 9/2010 | Ramiah et al. | |
| 8,316,329 B1 | 11/2012 | Rigby et al. | |
| 8,962,474 B2 | 2/2015 | Yu et al. | |
| 9,337,124 B1 | 5/2016 | Herrault et al. | |
| 10,242,891 B2 | 3/2019 | Fricker et al. | |
| 10,366,967 B2 | 7/2019 | Fricker et al. | |
| 10,468,369 B2 | 11/2019 | Fricker | |
| 10,672,732 B2 | 6/2020 | Fricker | |
| 2002/0185661 A1 | 12/2002 | Kawanobe et al. | |
| 2003/0006493 A1 | 1/2003 | Shimoishizaka et al. | |
| 2003/0146510 A1 | 8/2003 | Chien | |
| 2003/0189705 A1 * | 10/2003 | Pardo | G01B 11/27 356/401 |
| 2004/0043614 A1 | 3/2004 | Koizumi | |
| 2005/0110160 A1 | 5/2005 | Faroog et al. | |
| 2005/0202651 A1 | 9/2005 | Akram | |
| 2006/0043567 A1 | 3/2006 | Palanduz | |
| 2006/0141667 A1 | 6/2006 | Milbrand et al. | |
| 2006/0292866 A1 | 12/2006 | Borwick et al. | |
| 2008/0157396 A1 | 7/2008 | Yang | |
| 2008/0164053 A1 | 7/2008 | Matsubara et al. | |
| 2009/0108441 A1 | 4/2009 | Barr et al. | |
| 2009/0250823 A1 | 10/2009 | Racz et al. | |
| 2010/0025828 A1 | 2/2010 | Sakai | |
| 2011/0108313 A1 | 5/2011 | Kung | |
| 2011/0147911 A1 | 6/2011 | Kohl et al. | |
| 2013/0155796 A1 | 6/2013 | Sugawara | |
| 2013/0344683 A1 | 12/2013 | Lazerand et al. | |
| 2014/0017880 A1 | 1/2014 | Lei et al. | |
| 2014/0035093 A1 | 2/2014 | Pincu et al. | |
| 2014/0035106 A1 | 2/2014 | Vu et al. | |
| 2014/0070423 A1 | 3/2014 | Woychik et al. | |
| 2014/0084427 A1 | 3/2014 | Gaskins | |
| 2015/0076714 A1 | 3/2015 | Haba et al. | |
| 2015/0079760 A1 | 3/2015 | Lei et al. | |
| 2016/0218057 A1 | 7/2016 | Lee et al. | |
| 2016/0240420 A1 * | 8/2016 | Wagenleitner | H01L 21/6838 |
| 2017/0032981 A1 | 2/2017 | Chinnusamy | |
| 2017/0084539 A1 | 3/2017 | Gao et al. | |
| 2017/0196075 A1 | 7/2017 | Barron et al. | |
| 2017/0374738 A1 | 12/2017 | Lee | |
| 2018/0033924 A1 * | 2/2018 | Andrews | H01L 33/507 |
| 2018/0068938 A1 | 3/2018 | Yazdani | |
| 2018/0166328 A1 | 6/2018 | Tang et al. | |
| 2019/0246491 A1 | 8/2019 | Zinn | |
| 2020/0043831 A1 | 2/2020 | Cheah et al. | |
| 2021/0036179 A1 * | 2/2021 | Sung | H01L 31/1888 |

OTHER PUBLICATIONS

International Search Report and Written Opinion for PCT Application No. PCT/US2018039700 dated Sep. 13, 2018.

International Search Report and Written Opinion for PCT Application No. PCT/US18/45519, dated Oct. 26, 2018, dated Oct. 26, 2018.

International Search Report and Written Opinion for PCT Application No. PCT/US18/041090, dated Sep. 19, 2018, dated Sep. 19, 2018.

West, Perry, "Anatomy of an Application: Automatic Alignment in the Semiconductor Industry", Imagination Corporation and Automated Vision Systems, Inc. 2000, http://www.imagenation.com/pdf/align.pdf.

Lee, Sang Hwui, et al., "Wafer-to-Wafer Alignment for Three-Dimensional Integration: A Review", Journal of Microelectromechanical Systems, vol. 20, No. 4, Aug. 2011.

* cited by examiner

SYSTEM AND METHOD FOR ALIGNMENT OF AN INTEGRATED CIRCUIT

CROSS-REFERENCE TO RELATED APPLICATIONS

This application claims the benefit of U.S. Provisional Application No. 62/932,615, filed 8 Nov. 2019, which is incorporated in its entirety by this reference.

TECHNICAL FIELD

The inventions described herein relate generally to the integrated circuit architecture and fabrication fields, and more specifically to a new and useful integrated circuit architecture and integrated circuit manufacturing methods in the integrated circuit architecture field.

BACKGROUND

While the concept of artificial intelligence has been explored for some time, the modern applications of artificial intelligence have exploded such that artificial intelligence is being integrated into many devices and decision-making models to improve their learning, reasoning, data processing capabilities, and the like of the devices. The most apparent and broad applications of artificial intelligence include machine learning, natural language processing, computer vision, robotics, knowledge reasoning, planning, and general artificial intelligence.

To be effective, many of the above-noted broad applications of artificial intelligence require the consumption of extremely large data sets in the initial training of the artificial intelligence algorithms (e.g., deep learning algorithms, recurrent neural networks algorithms, etc.) being implemented in the specific applications and/or devices (e.g., autonomous vehicles, medical diagnostics, etc.). Because the data sets used in training are often very large and the underlying computer architecture may not be specifically designed for artificial intelligence training, the training of an artificial intelligence algorithm may require thousands of hours of data processing by the underlying computer architecture. While it may be possible to scale or increase the number of computers or servers used in ingesting data sets for training an artificial intelligence algorithm, this course of action often proves to not be economically feasible.

Similar data processing issues arise in the implementation or execution of the artificial intelligence algorithms due to the large amount of data being captured such as data originating from billions of Internet transactions, remote sensors for computer vision, and the like. The modern remote distributed networked servers (e.g., the cloud) and onboard computer processors (e.g., GPUs, CPUs, etc.) appear to be inadequate for ingesting and processing such great volumes of data efficiently to maintain pace with the various implementations of the artificial intelligence algorithms.

Accordingly, there is a need in the semiconductor space and specifically in the computer chip architecture field for an advanced computing processor, computing server, or the like that is capable of rapidly and efficiently ingesting large volumes of data for at least the purposes of allowing enhanced artificial intelligence algorithms and machine learning models to be implemented. Additionally, these advanced computing systems may function to enable improved data processing techniques and related or similar complex and processor-intensive computing to be achieved.

The inventors of the inventions described in the present application have designed an integrated circuit architecture that allows for enhanced data processing capabilities and have further discovered related methods and architectures for fabricating the integrated circuit(s), packaging the integrated circuit(s), powering/cooling the integrated circuit(s), and the like.

The below-described embodiments of the present application provide such advanced and improved computer chip architecture and related IC fabrication techniques and alignment techniques.

DESCRIPTION OF THE PREFERRED EMBODIMENTS

The following description of preferred embodiments of the present application are not intended to limit the inventions to these preferred embodiments, but rather to enable any person skilled in the art of to make and use these inventions.

1. Overview

Figure 2:
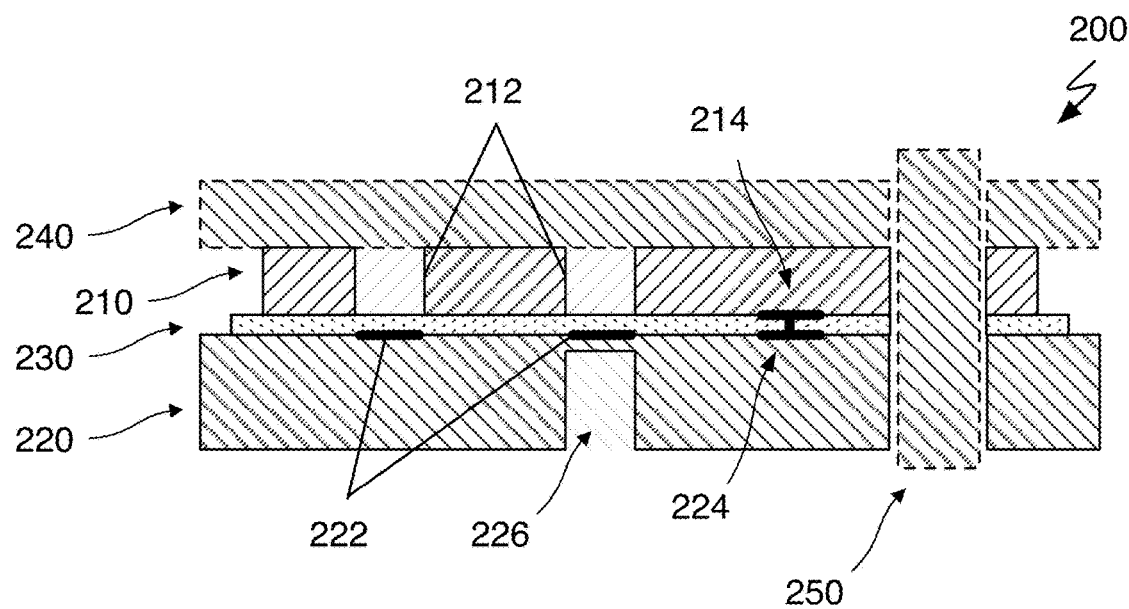
FIG. 2 illustrates a schematic of a variant of the integrated circuit assembly 200 in accordance with one or more embodiments of the present application.

The integrated circuit assembly 200 can include: a semiconductor 210 and a substrate (e.g., PCB) 220. The integrated circuit assembly 200 can optionally include: a compliant connector 230, thermal management 24o, and a securing element 250. The semiconductor 210 can include a first alignment feature 212. The substrate 220 can include a second alignment feature 222 (e.g., alignment target) and conductive pads 224. The substrate 220 can optionally include a cavity 226. However, the integrated circuit assembly can include any other suitable components. The integrated circuit assembly 200 functions to enable alignment and/or electrical connectivity between the semiconductor 210 and the substrate 220. An example of the integrated circuit assembly 200 is shown in FIG. 2. In variants, the semiconductor 210 is the integrated circuit 100.

Figure 1A:
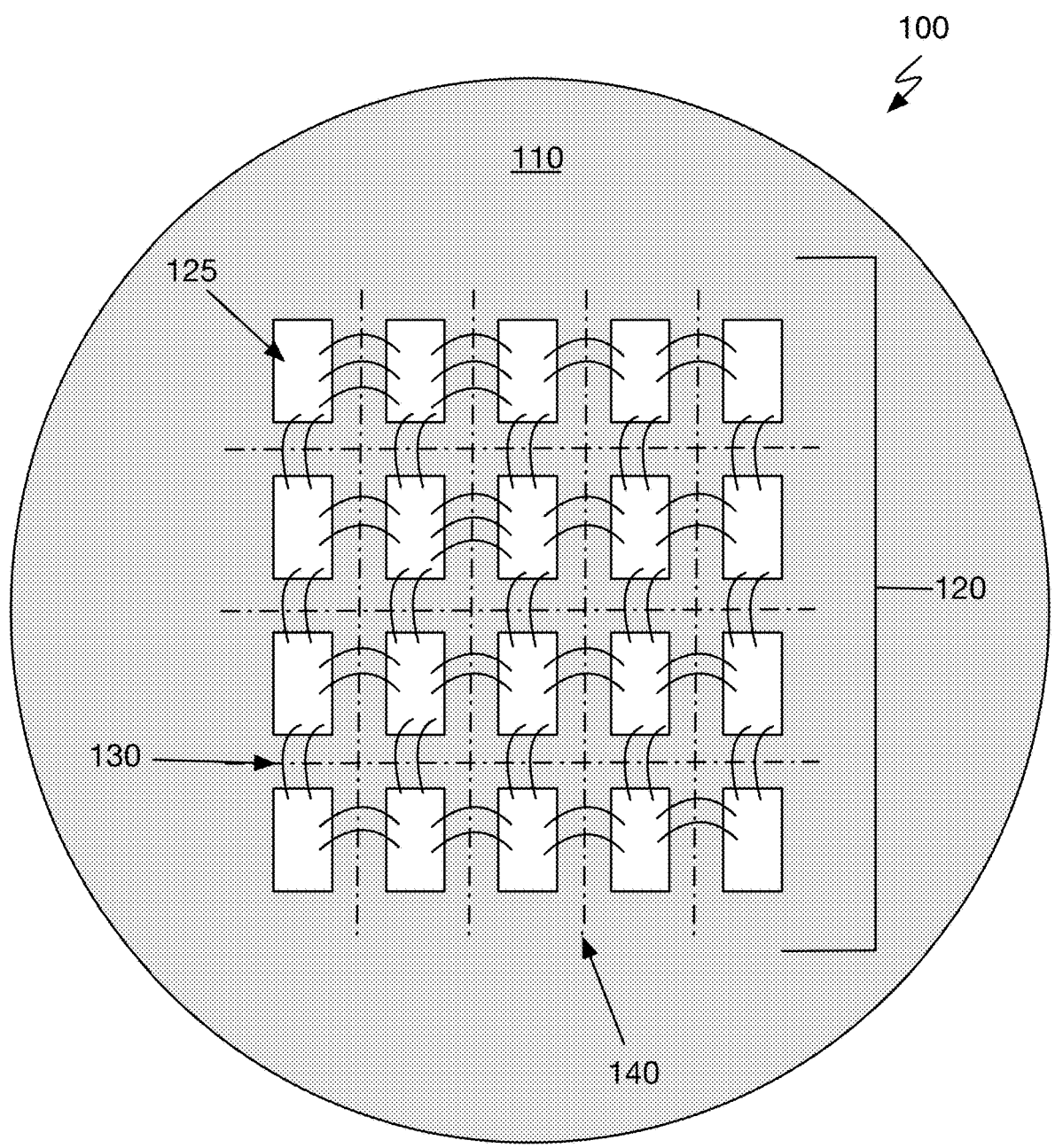
FIGS. 1A-C illustrate a first, second, and third schematic of a first, second, and third variant of the integrated circuit 100, respectively, in accordance with one or more embodiments of the present application.
Figure 1B:
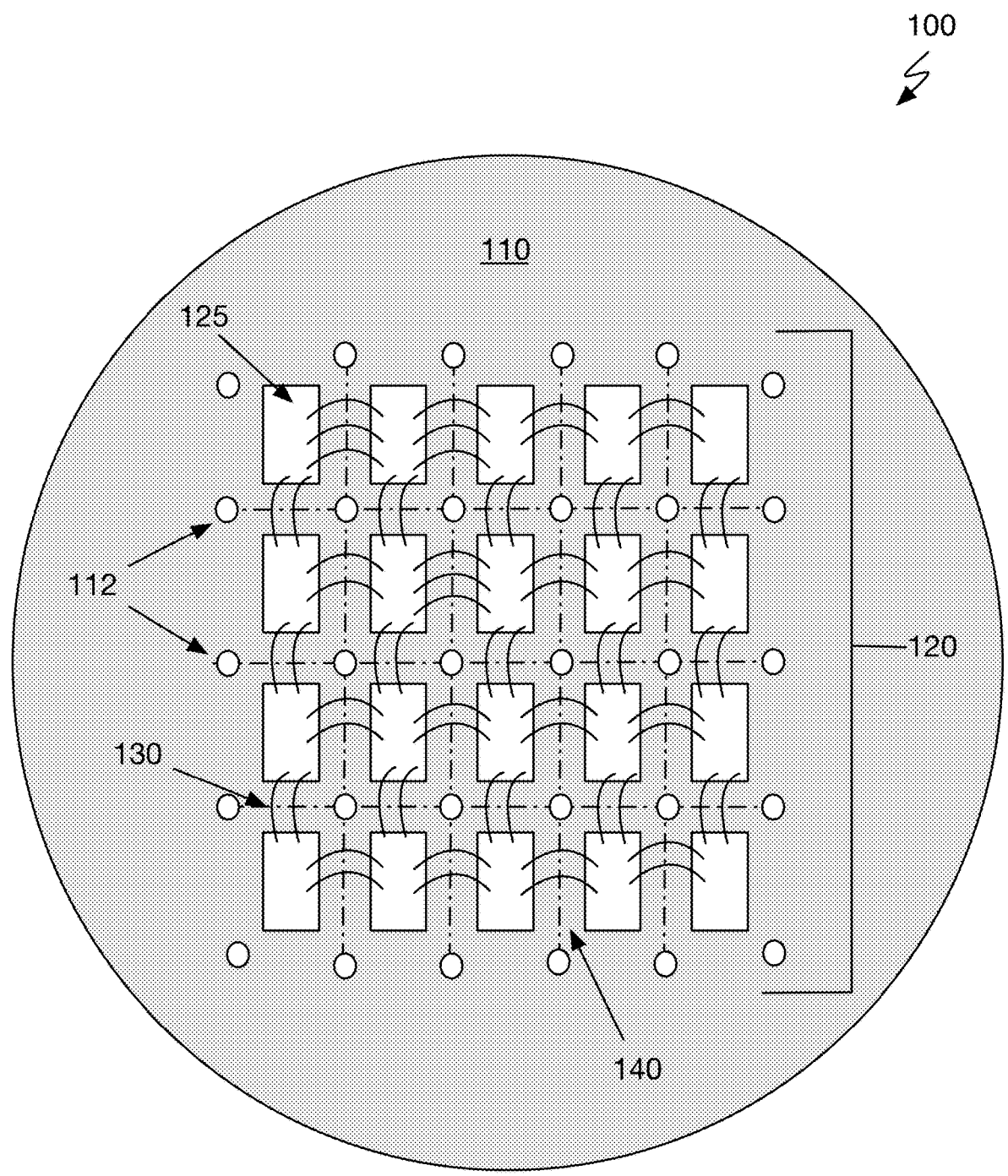
Figure 1C:
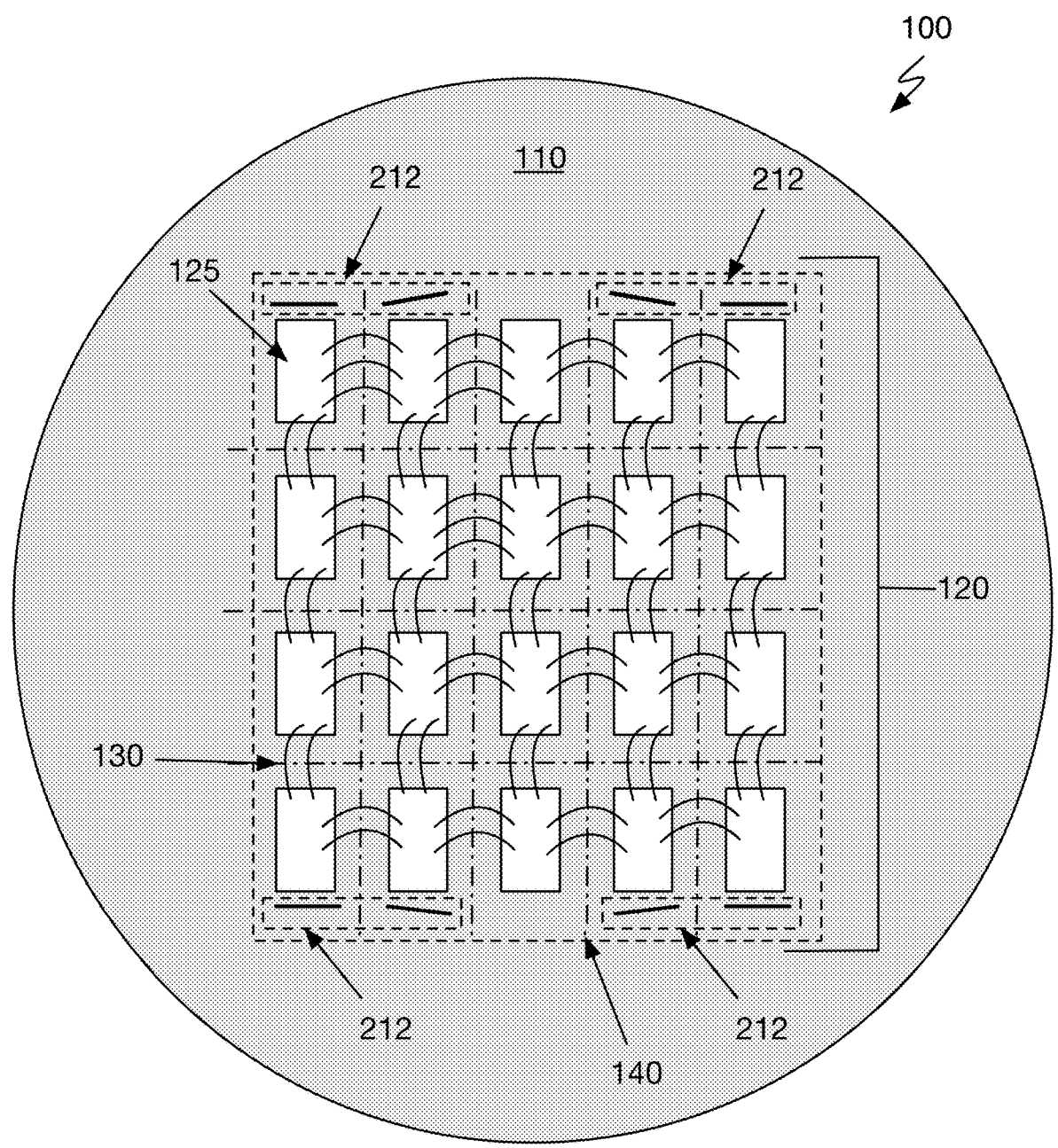

The integrated circuit 100 can include a substrate 110, a plurality of die 120 formed with the substrate 110, a circuit layer 125, a plurality of inter-die connections 130, and scribe lines 140. The integrated circuit 100 can be manufactured using any suitable lithography system that is configured to implement the one or more steps of the methods described herein. The integrated circuit 100 functions to enable inter-die communications between the plurality of die 120 formed with the single substrate 110. However, the integrated circuit 100 can additionally or alternatively include any other suitable set of components. A first, second, and third example of the integrated circuit 100 is shown in FIGS. 1A, 1B, and 1C, respectively.

The term "substantially" as utilized herein can mean: exactly, approximately, within a predetermined threshold or tolerance, and/or have any other suitable meaning. In the context of the term 'transparent'—'substantially transparent' can mean: more than a threshold percentage of visible light passes through (such as 99%, 98%, 95% 90%, 75%, and/or 50% of light; for a given material thickness), semitransparent, translucent, and/or have any other suitable meaning.

2. Benefits

Variations of the technology can afford several benefits and/or advantages.

First, variations of this technology can enable precision alignment of integrated circuit (IC) assembly components and/or layers. Such variants can utilize precise hole fabrication techniques and rely on such holes as locating features during alignment of the IC. Such variants can fabricate holes through the front/die side of the wafer for greater inherent precision/accuracy of hole fabrication relative to die and/or conductive pads on the front side of the wafer. Such variants can similarly utilize a contrast material as an alignment feature on the substrate (e.g., PCB) which can be fabricated using the same material, manufacturing process, and/or setup as the conductive pads on the substrate. In a specific example, the ultimate objective of alignment using the contrast material is to ensure that a first set of conductive pads on the semiconductor is aligned with a second set of conductive pads on the substrate (e.g., PCB). In this example, the precision of alignment is collectively determined by at least: the relative fabrication precision of the first set of conductive pads to the an alignment feature (e.g., orifice) of the semiconductor; the relative fabrication precision of the second set of conductive pads to the contrast material; and the relative precision of alignment of the alignment feature to the contrast material. However, precision alignment of the IC assembly can be otherwise achieved.

Second, variations of this technology can enable alignment determination/validation during various stages of the IC assembly/packaging process. In such a variant, a cavity (e.g., counterbore) in the substrate can enable optical alignment using the same set of alignment features when viewing from the semiconductor side or the substrate side of the IC assembly. In variants, the IC assembly can include a coarse Vernier pattern which can enable visual inspection/validation (e.g., human validation/inspection) of the IC assembly (e.g., such as upon assembly completion or after transport of the assembly). In variants, the IC assembly can include an electrical Vernier pattern, which can allow dynamic determination of alignment (e.g., determining alignment during operation and/or testing of the IC assembly). In a specific example, an electrical Vernier pattern can allow dynamic monitoring of misalignment due to thermal affects during operation of the semiconductor. In particular, measuring the thermal strain in the semiconductor substrate (e.g., relative to the PCB substrate) can allow adaptive control of the IC assembly to improve thermal performance and ensure continuous alignment: the power consumption (e.g., total power consumption, distribution of power consumption), heat generation, and/or cooling can be accordingly controlled based on the thermal strain. This can be particularly advantageous for wafer-scale chips or packages, which can be sensitive to and/or experience greater thermal expansion during operation (e.g., due to large numbers of high-powered cores operating in close thermal proximity). However, the system and/or method can otherwise allow alignment determination and/or validation with any appropriate timing.

Third, variations of the technology can enable optical alignment determination (e.g., with visible light)—which uses lower cost and more accessible components than infrared (IR) based alignment techniques. In particular, optical alignment of IC commonly contends with complex surface/internal colorations on a die side of the semiconductor (e.g., when aligning relative to a die)—this is often resolved by leaving an unmodified/pure substrate section of the semiconductor at the expense of die (or transistor) density. However, variants of the system utilizing a through hole/orifice mitigate this problem, since the sides of the orifice and/or any material behind the orifice can be visibly observable (e.g., as it contrasts the semiconductor surface). However, variants of the system can additionally or alternately employ various IR techniques, and/or otherwise suitably enable optical alignment of IC assembly components.

However, variations of the technology can additionally or alternately provide any other suitable benefits and/or advantages.

3. System

3.1 Integrated Circuit with Interconnected Die

The integrated circuit 100 can include a substrate 110, a plurality of die 120 formed with the substrate 110, a circuit layer 125, a plurality of inter-die connections 130, and scribe lines 140. The integrated circuit can optionally include a plurality of orifices 112. However, the integrated circuit 100 can additionally or alternatively include any other suitable set of components and/or features. A first, second, and third example of the integrated circuit 100 is shown in FIGS. 1A, 1B, and 1C, respectively.

In a specific variant, the integrated circuit 100 can be the semiconductor described in U.S. application Ser. No. 16/029,207, filed 6 Jul. 2018, which is incorporated in its entirety by this reference. However, any other suitable integrated circuit can be used.

The integrated circuit 100 may be manufactured using any suitable lithography system that is configured to implement the one or more steps of the methods described herein. An example of integrated circuit 100 fabrication is shown in FIGS. 20A-I.

The integrated circuit 100 functions to enable inter-die communications between the plurality of die 120 formed with the single substrate 110. The inter-die connections 130 formed between adjacent die on the substrate 110 improves communication bandwidth and enables a reduction in communication latency between connected die on the substrate 110 because communication between each of the plurality of die 120 is maintained on a same large die (e.g., on-die communication). That is, the inter-die connections 130 formed between the plurality of die 120 effectively eliminate a need to for a first die of the plurality of die 120 to go off-die (which increases latency due to transmission of signals using an intermediate off-die circuit) to establish communication with a second die of the plurality of die 120 since the first and the second die may be directly connected with one or more inter-die connections or, at a minimum, indirectly connected via intermediate inter-die connections established between one or more die between the first and the second die. Such configuration(s), therefore, enabling increasingly faster communications and data processing between die when compared, at least, to communications between die not maintained on a same substrate (e.g., a same wafer). Each of the plurality of die 120 remain on the single substrate 110 and are not cut from the substrate 110 into individual dice for separate packaging into an individual computer chip. Rather, at formation, only excess die (e.g., die that are not provided with circuitry or inactive die) along a periphery of the substrate 110 are preferably removed from the substrate 110 and the remaining portions of the substrate 110 having the plurality of die 120 (e.g., active die) may form a predetermined shape (e.g., a rectangular shape) with the substrate 110. The resultant substrate 110 after being reduced to shed excess die and potentially following one or more additional refinement or IC production processes may then be packaged onto a board (e.g., a printed circuit board (PCB) or an organic substrate).

The substrate 110 is preferably a wafer or a panel into and/or onto which die having a circuitry layer 125 on which microelectronic devices may be built. The circuitry layer typically defines one or more surfaces on a die onto which circuits and various microelectronic devices may be fabricated using a lithography system. The substrate 110 is preferably formed of a silicon material (e.g., pure silicon), but may be additionally or alternatively formed of any suitable material including silicon dioxide, aluminum oxide, sapphire, germanium, gallium arsenide, an alloy of silicon and germanium, indium phosphide, and the like. The substrate 110 may be a virgin wafer. Alternatively, the substrate 110 may include one or more layers formed therein where the one or more layers may include, but not limited to, a photoresist, a dielectric material, and a conductive material. The photoresist being light-sensitive material may include any material that may be patterned by a lithography system. The photoresist may be positive photoresist or negative photoresist.

Accordingly, the substrate 110 may be formed of any thin slice of semiconductor material that may be used for fabrication of integrated circuits having varying diameters and shapes, but preferably the substrate 110 is formed in a circular shape and with a diameter of 300 mm. The thickness of the substrate 110 can be: 100 microns, 200 microns, 250 microns, 300 microns, 600 microns, greater than 600 microns, between 200-750 microns, any range bounded by the aforementioned values, and/or any other suitable thickness before or after fabrication.

The lithography system may refer to any lithography system that prints images of a reticle onto a substrate (e.g., a wafer) using light. The lithography system may be a scanning projection system or a step and scan system, which may be alternatively referred to as a scanner or a stepper. The lithography system may include any suitable exposure system including one or more of optical lithography, e-beam lithography, X-ray lithography, and the like.

The microelectronic devices, such as transistors, diodes, various circuits, and the like may be formed into and/or over the substrate 110 using lithographic processes (e.g., optical lithography, etc.).

Each of the plurality of die 120 may be a block of semiconducting material on which circuits may be fabricated. Each of the plurality of die 120 may be formed by an exposure process of silicon material of or on the substrate 110 and typically in a rectangular shape or square shape. However, it shall be noted that the die 120 may take on any suitable form including any geometric and non-geometric forms. Other than excess die that is removed from the substrate 110 during a substrate reduction process, the plurality of die 120 are not cut or diced from the substrate 110 into individual dice.

Additionally, each of the plurality of die 120 includes an alignment point preferably at a center of each die. The alignment point may be used by the stepper of the lithographic system to align the photomask and/or photoreticle with respect to each of the plurality of die 120 before an exposure process. Further, each of the plurality of die 120 may include a seal ring surrounding or covering a periphery (perimeter) of each of the die other than the circuitry layer (e.g., circuit fabrication surface) of each dice. Accordingly, the seal ring may be provided at the side surfaces of each dice which extend in a normal direction (i.e., perpendicular) with respect to the surface of the substrate 110 and further, located adjacent scribe lines 140. The seal ring functions to protect each dice from various contaminants or particulates that may potentially impregnate or enter a dice.

The plurality of inter-die connections 130 function to connect, at least, any two circuits (e.g., the inter-die connections may connect a transmitting circuit and receiving circuit of two die, respectively) between two die of the plurality of die 120 on the substrate 110. That is, each inter-die connection 130 may be formed or provided to extend from a first dice to a second dice located on the substrate 110. Preferably, an inter-die connection 130 may be formed between two adjacent die. Each inter-die connection may be formed of a material having a length and an endpoint at each respective end of the length of material (e.g., two endpoints), where each respective endpoint terminates at a circuitry layer of a different dice on the substrate 110.

In the case that the die are formed in a rectangular or similar geometric or substantially geometric shape, the inter-die connections 130 may extend between two parallel or substantially parallel surfaces of the two-adjacent die. Accordingly, it is possible for a single dice of the plurality of die 120 to be connected to more than one dice depending on the positioning of the dice in the array of die on the substrate 110. When positioned in an interior of the substrate 110, the single dice of the plurality of die 120 may be adjacent to four other die having at least one surface that is parallel to one of the four side surfaces of the single dice where one or more inter-die connections 130 may be formed. It shall be understood that while in preferred embodiments it is described that the die may be formed as a rectangle (or other polygon), the die may be formed in any shape or manner suitable for preparing an integrated circuit including non-traditional, non-geometric or non-polygonal shapes.

The plurality of inter-die connections 130 (global wires) are preferably wires or traces that function to conduct signals across two die. The plurality of inter-die connections 130 are preferably formed of a same conductive material used to form intra-dice connections (or local wires) between circuit elements of a single dice. Additionally, or alternatively, the plurality of inter-die connections 130 may be formed of any suitable conductive material that may be the same or different from materials forming other wires on a dice or that may be the same or different from materials forming the circuits on the dice.

In a preferred embodiment, the plurality of inter-die connections 130 are formed by offsetting the stepper of a lithographic system a predetermined distance from a center or alignment point of a single dice sufficiently to allow an exposure to be performed for and between two adjacent die rather than an exposure focusing on the circuitry layer 125 of an individual dice. Consequently, the exposure(s) that provide the inter-die connections 130 may be formed over the scribe lines 140. Additionally, the endpoints of an inter-die connection 130 may be positioned or formed at interior position relative to a location of the seal ring of a dice. Accordingly, while the inter-die connections 130 may be formed at any suitable location between two die, the inter-die connections may be typically formed such that the respective endpoints of an inter-die connection 130 are positioned inwardly of the seal ring of the dice on which it terminates such that each respective endpoint of an inter-die connection 130 is positioned at some location between the seal ring and a center of the respective dice.

In variants, the inter-die connections 130 and/or circuitry layer 125 of the integrated circuit 100 can be implemented in the system and/or method as described in U.S. application Ser. No. 16/019,882, filed 27 Jun. 2018, which is incorporated in its entirety by this reference.

The scribe lines 140 (or saw street) function to indicate a location between two disparate die on the substrate 110 where the substrate 110 would typically be cut for forming individual dice. The scribe lines 140 may typically be centered between two or adjacent die and in many cases, have a width similar to a width of a saw used for cutting wafers and the like. In a typical circumstance, no circuitry or other elements would be formed on or over the scribe lines 140, as these elements would most likely be severed or damaged during a cutting process of the substrate 110.

The orifices 112 can function to enable alignment of the integrated circuit during packaging and/or assembly. Additionally or alternately, orifices can function to receive a fastener (e.g., securing element) and/or align a fastener during insertion. Additionally or alternately, orifices can function to enable alignment validation (e.g., when arranged in a Vernier pattern) and/or inspection.

Figure 16A:
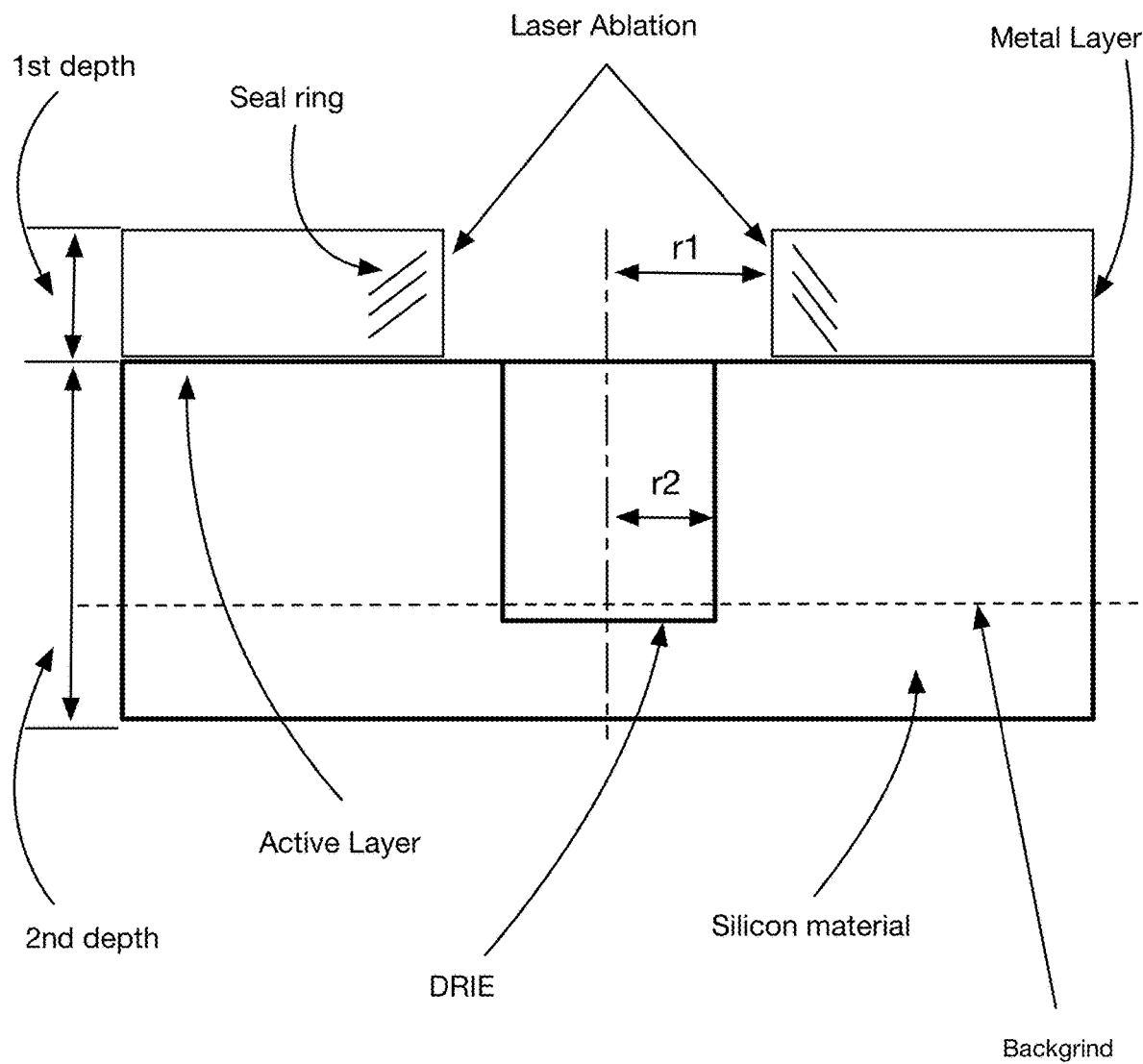
FIGS. 16A and 16B illustrate cross sectional views of a first and second example of an orifice, respectively, in accordance with one or more embodiments of the present application.
Figure 16B:
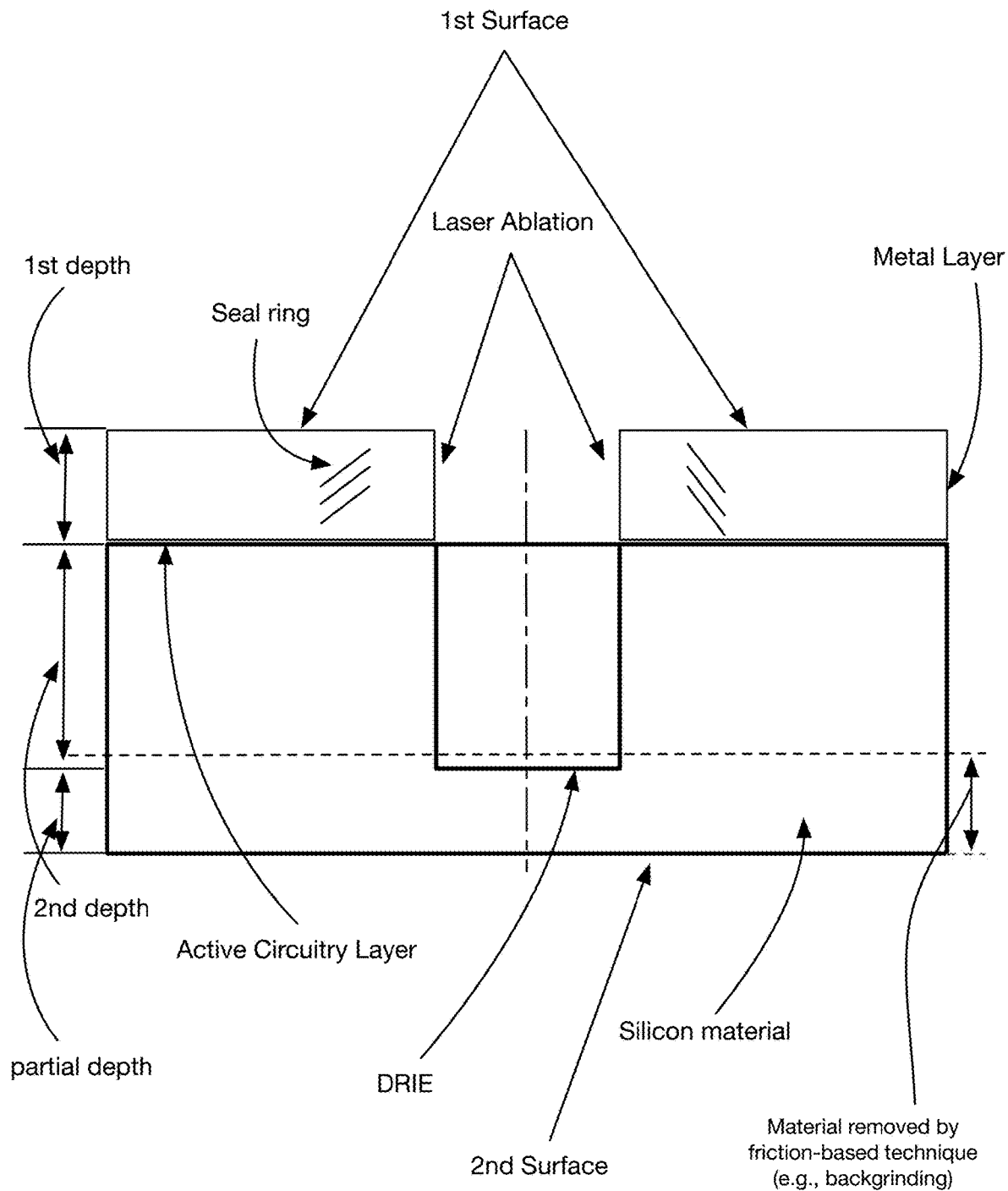
Figure 17A:
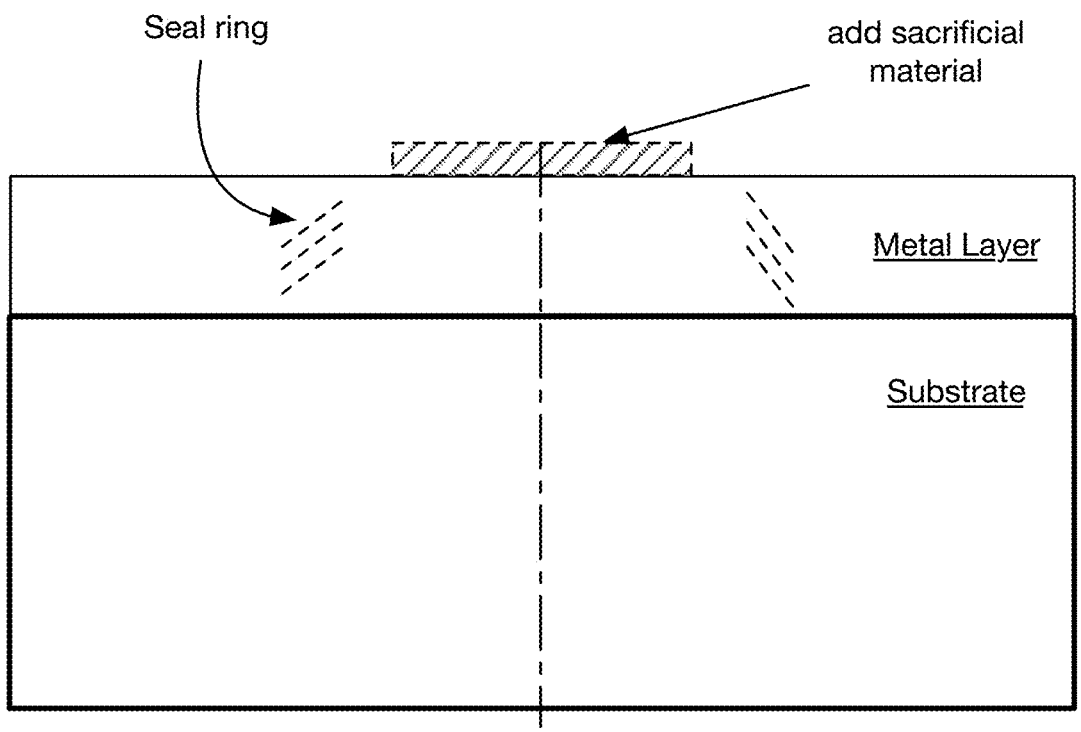
FIG. 17A-C illustrate cross sectional views of an example material removal through a metal layer in accordance with one or more embodiments of the present application.
Figure 17B:
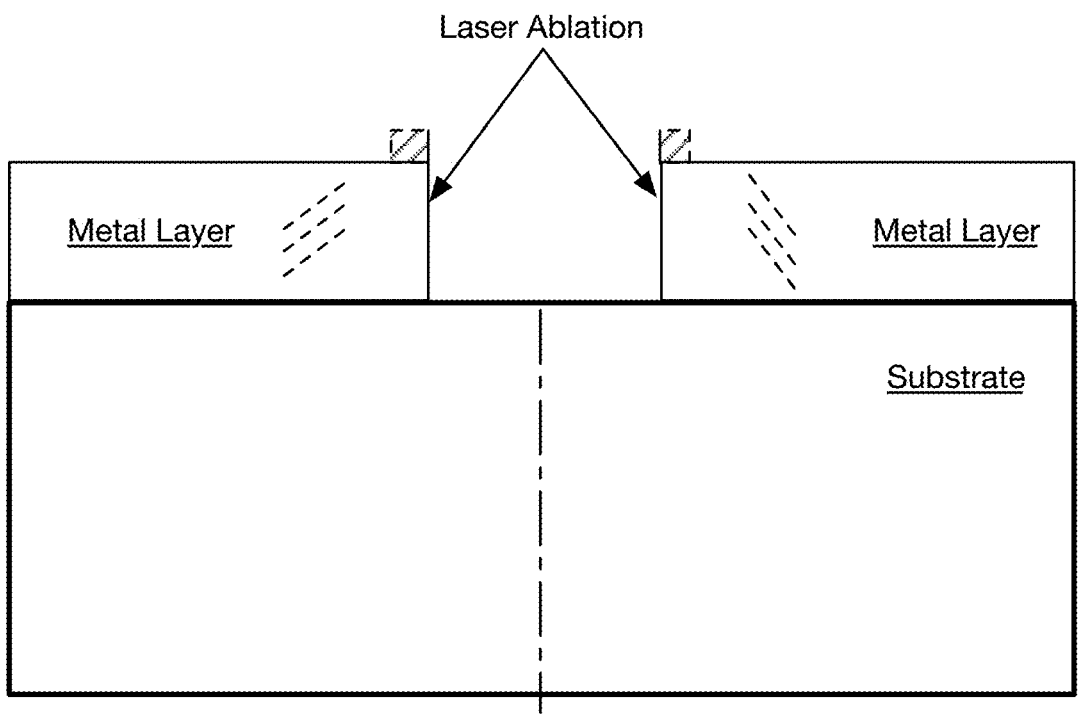
Figure 17C:
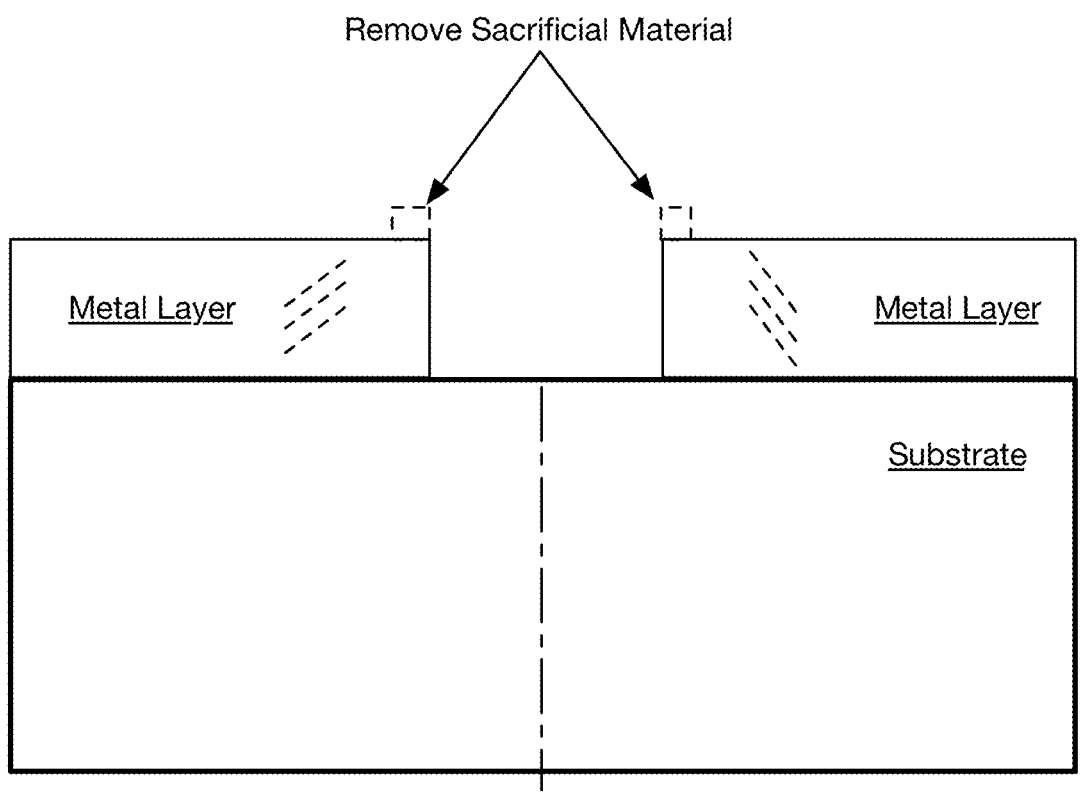
Figure 18A:
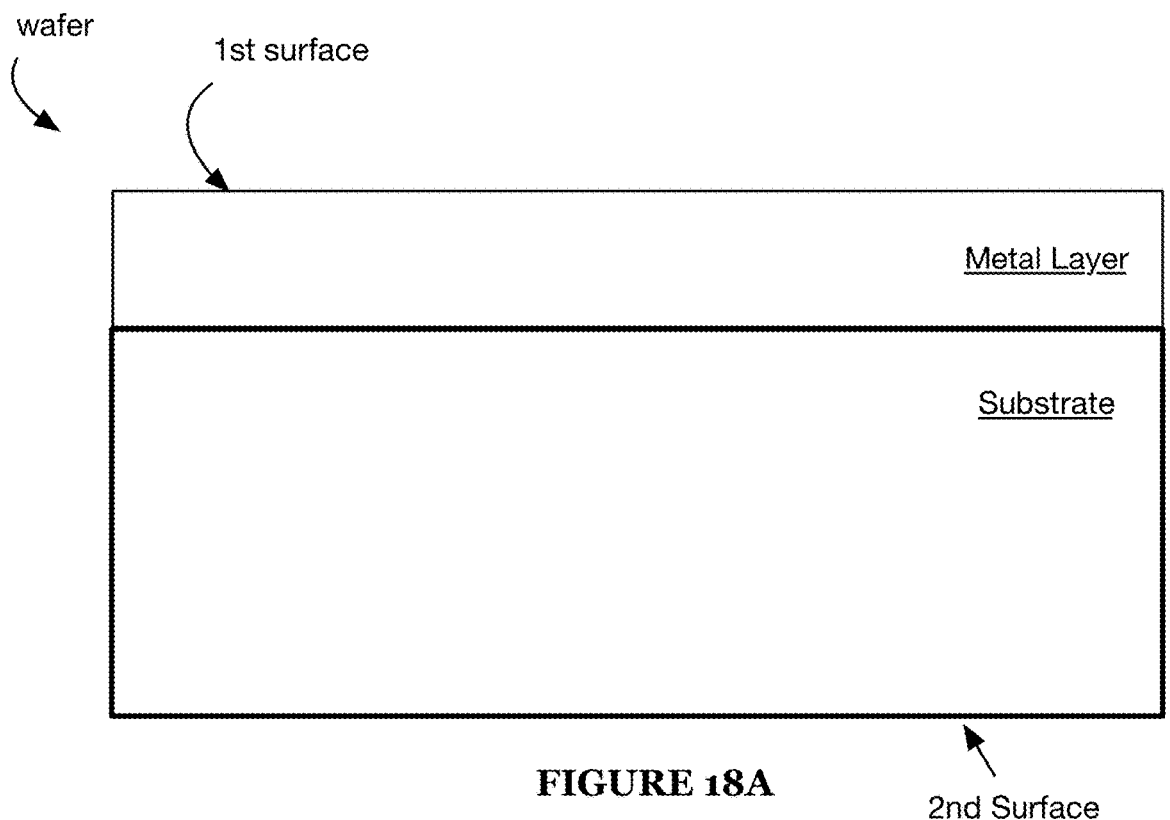
FIG. 18A-D illustrate cross sectional views of an example fabrication of an orifice in accordance with one or more embodiments of the present application.
Figure 18B:
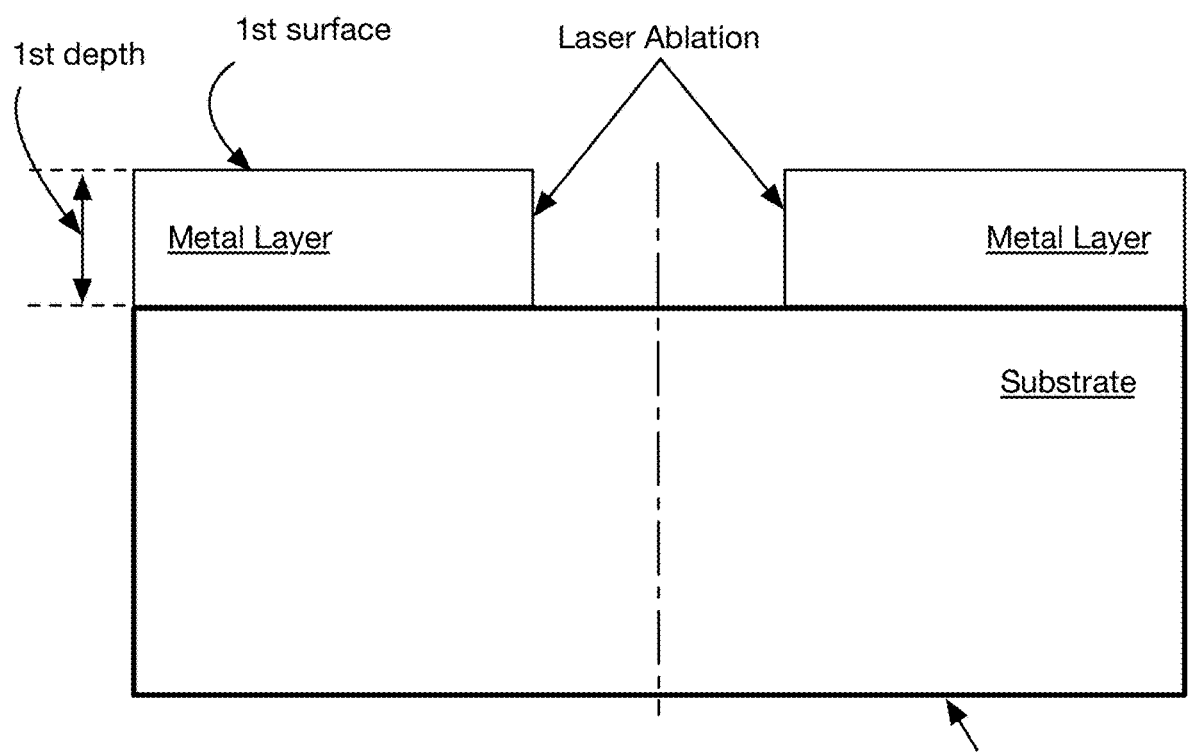
Figure 18C:
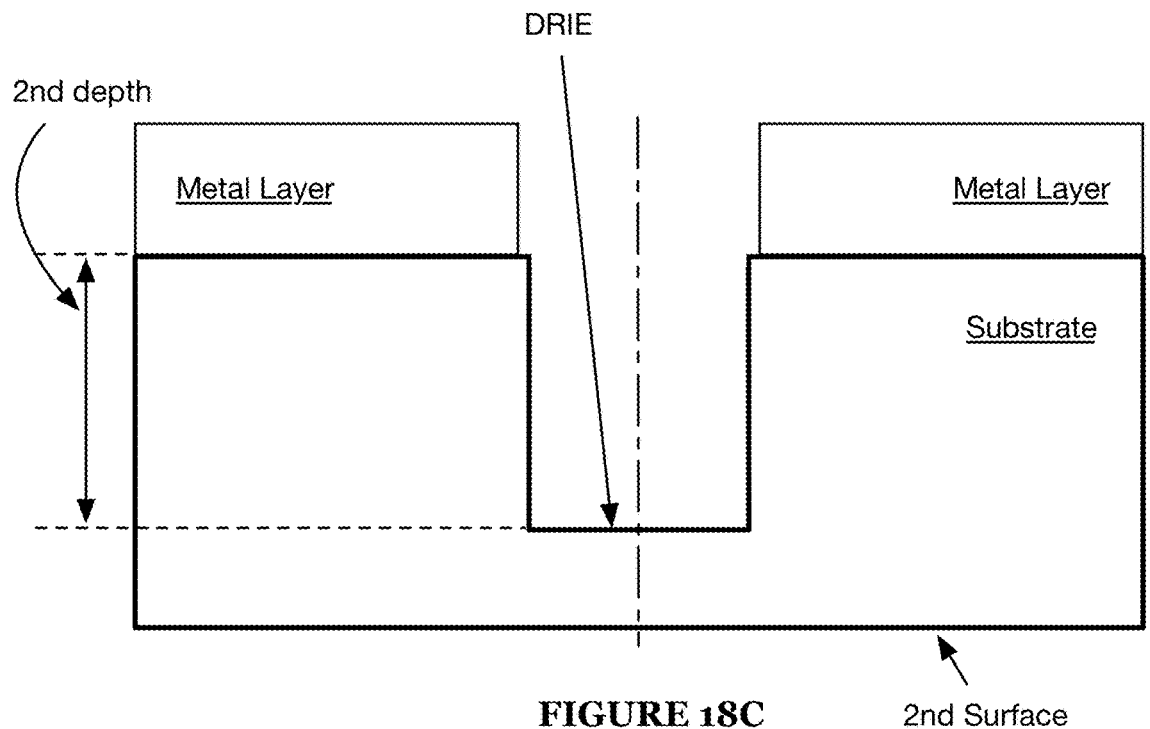
Figure 18D:
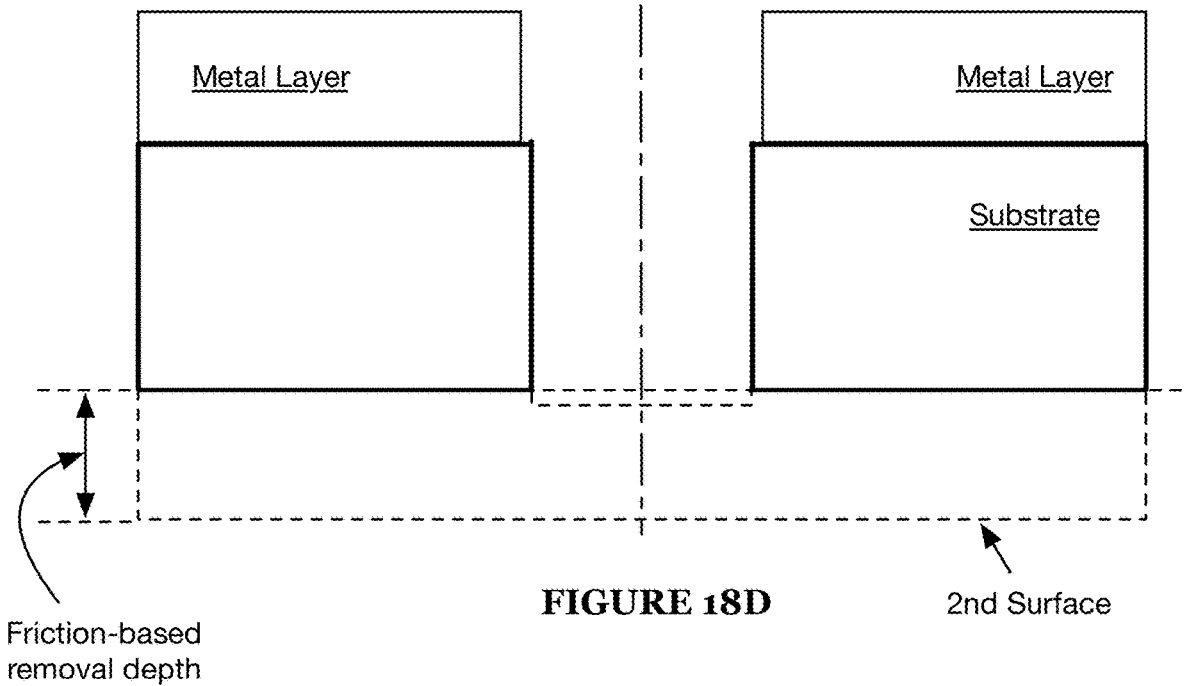
Figure 19:
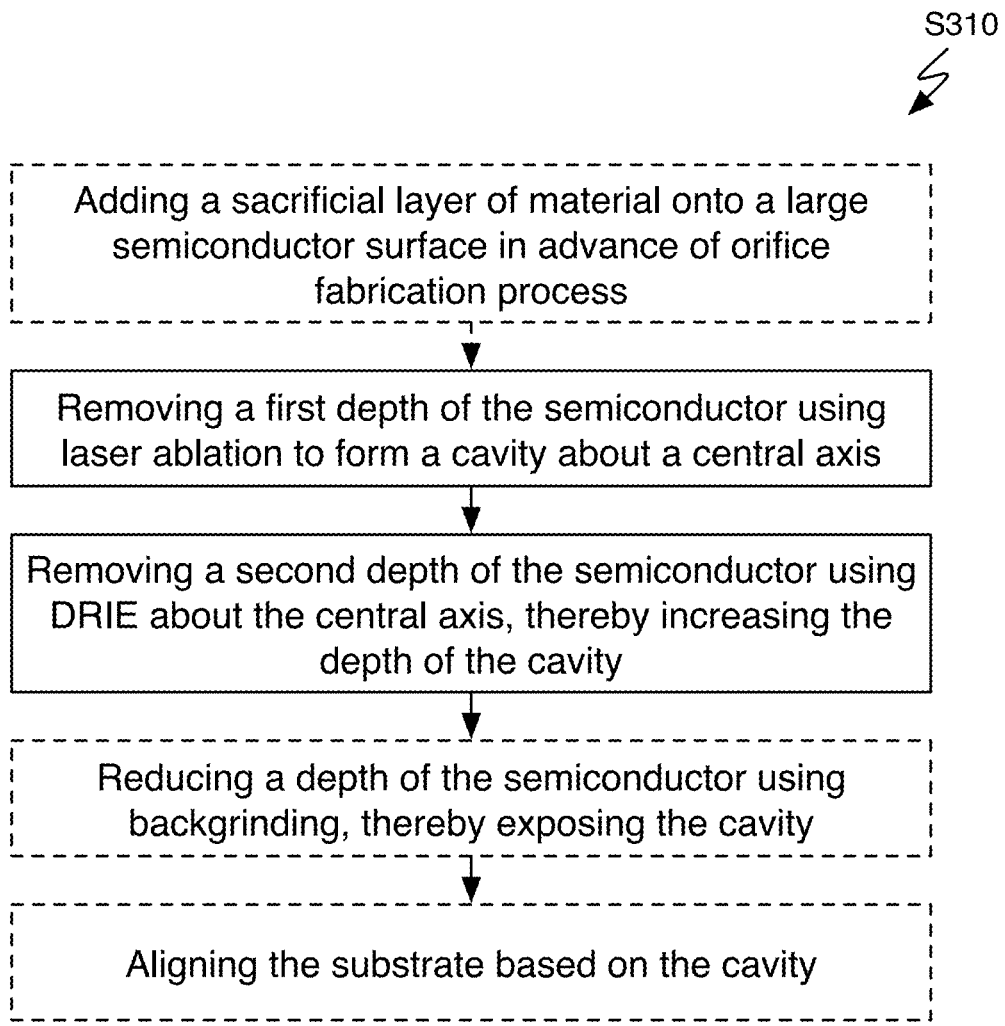
FIG. 19 illustrates a diagrammatic example of orifice fabrication in accordance with one or more embodiments of the present application.
Figure 20A:
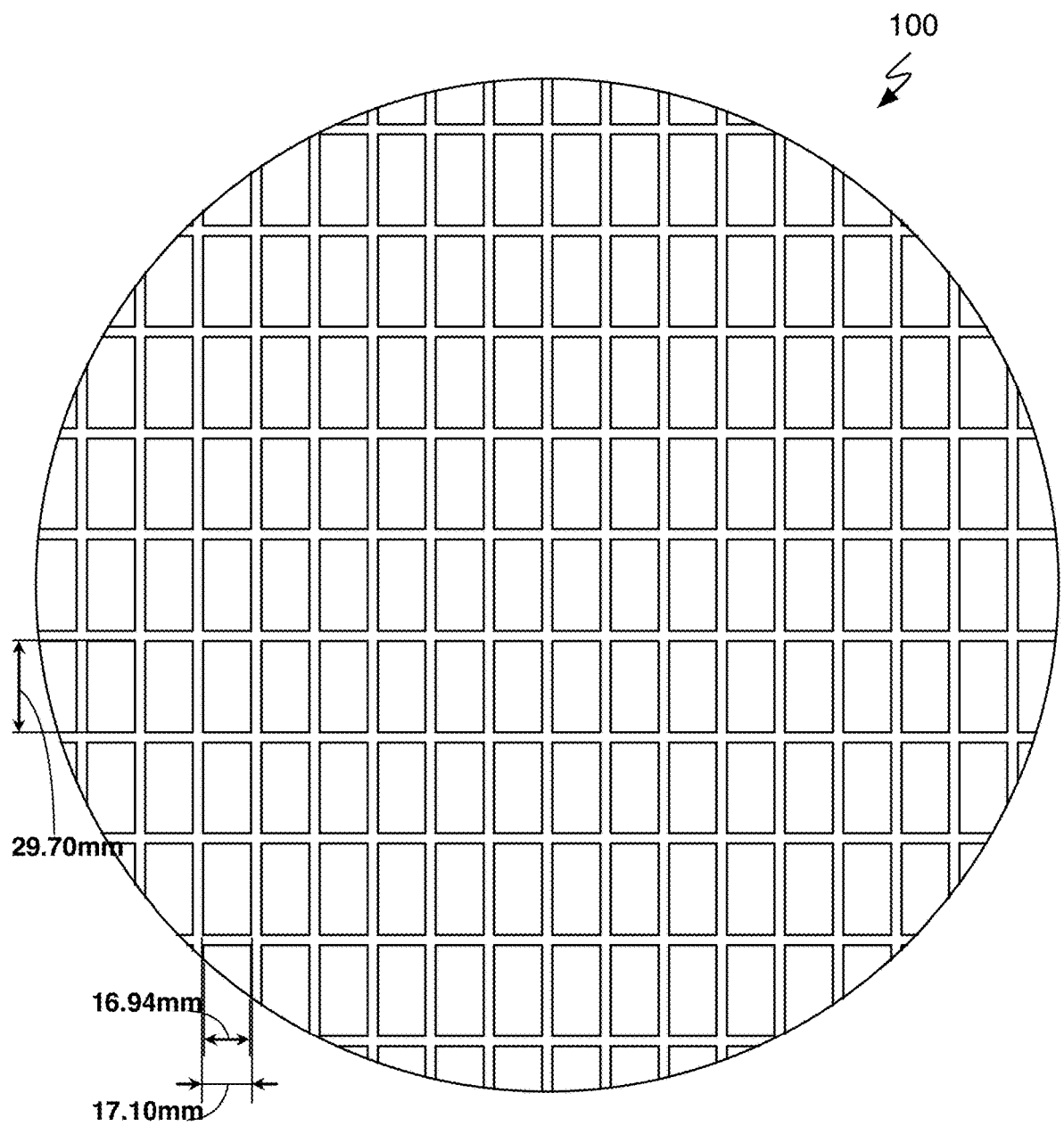
FIGS. 20A-I illustrate schematic examples of a variant of the integrated circuit 100 in accordance with one or more embodiments of the present application.
Figure 20B:
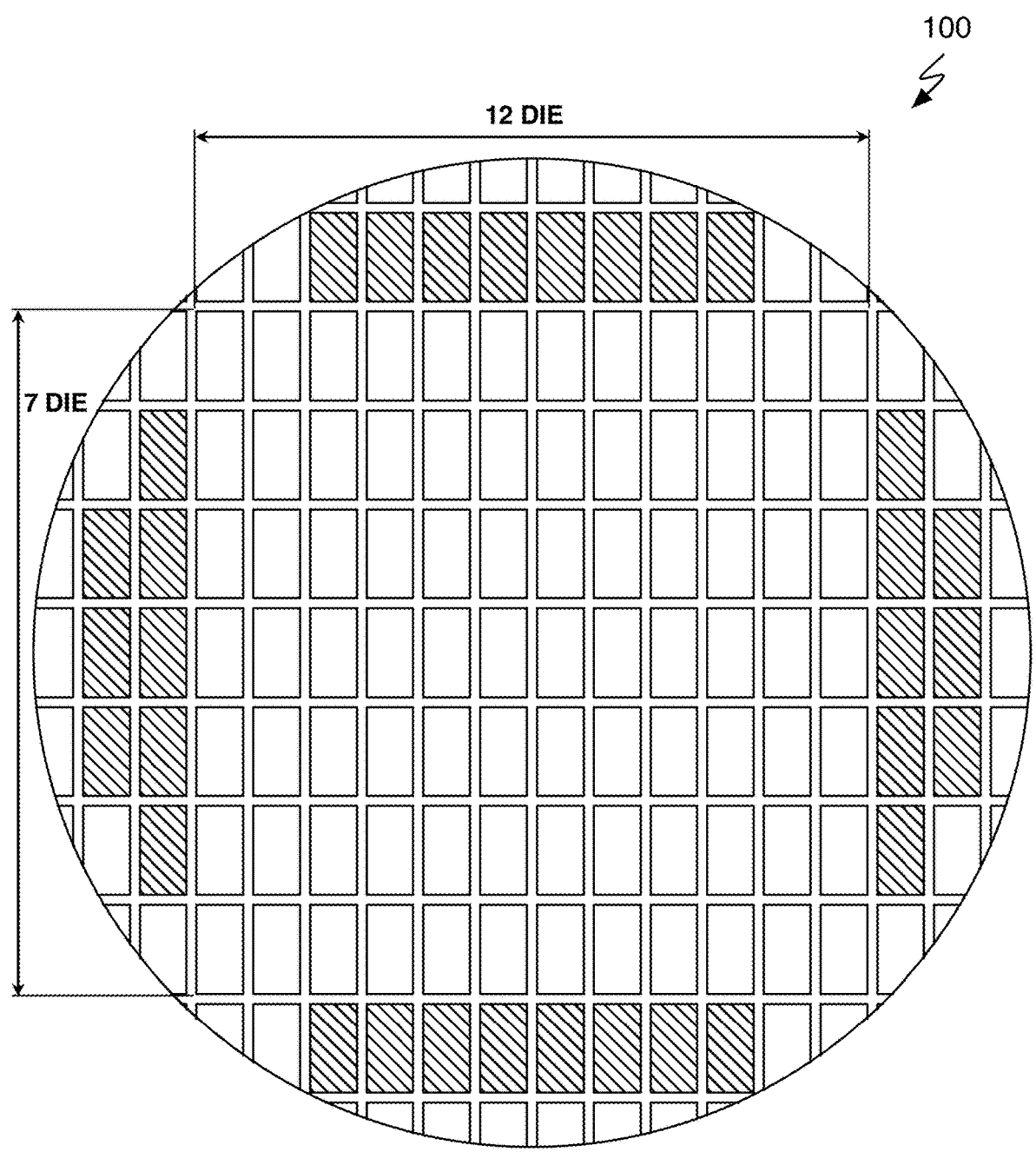
Figure 20C:
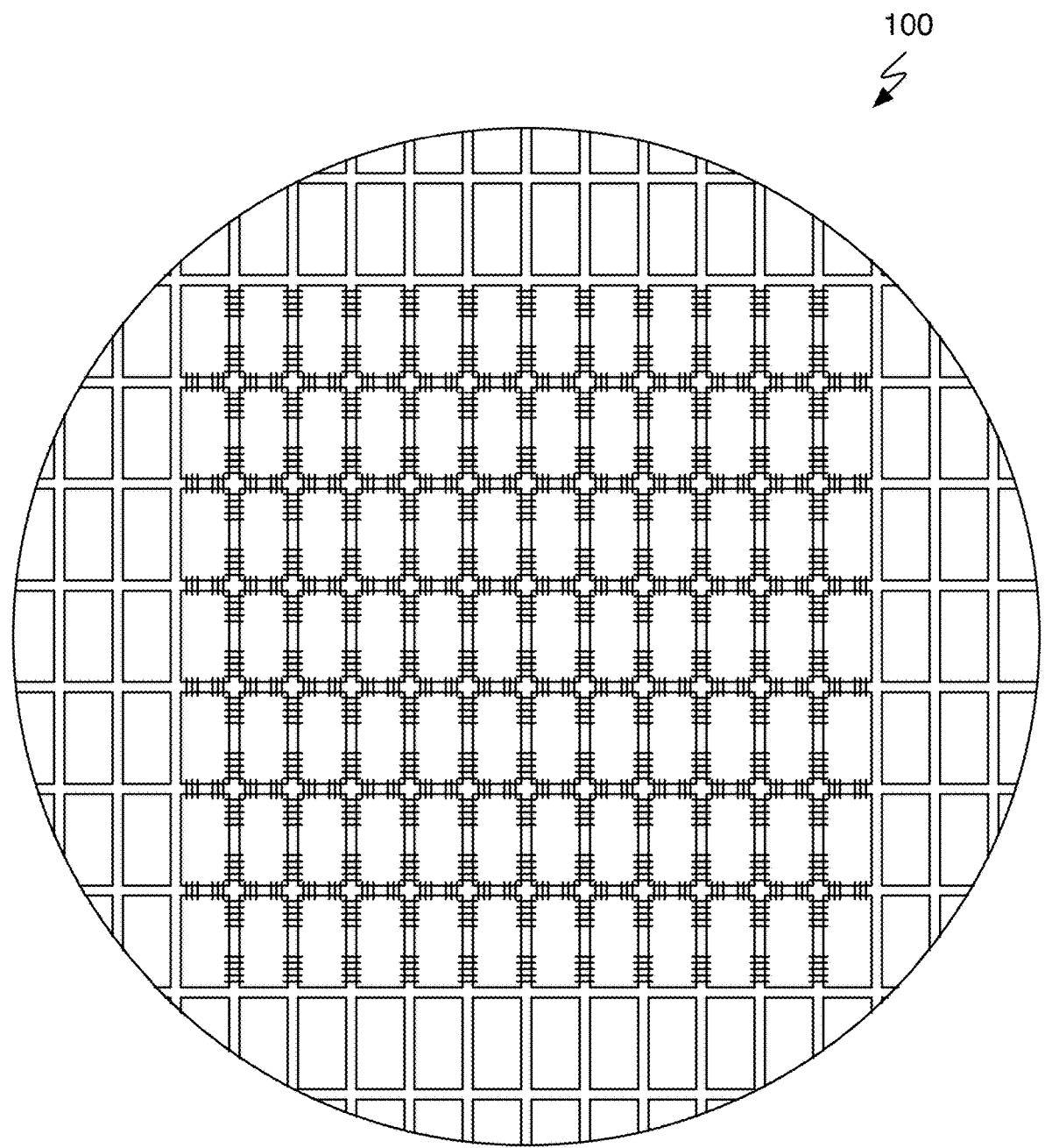
Figure 20D:
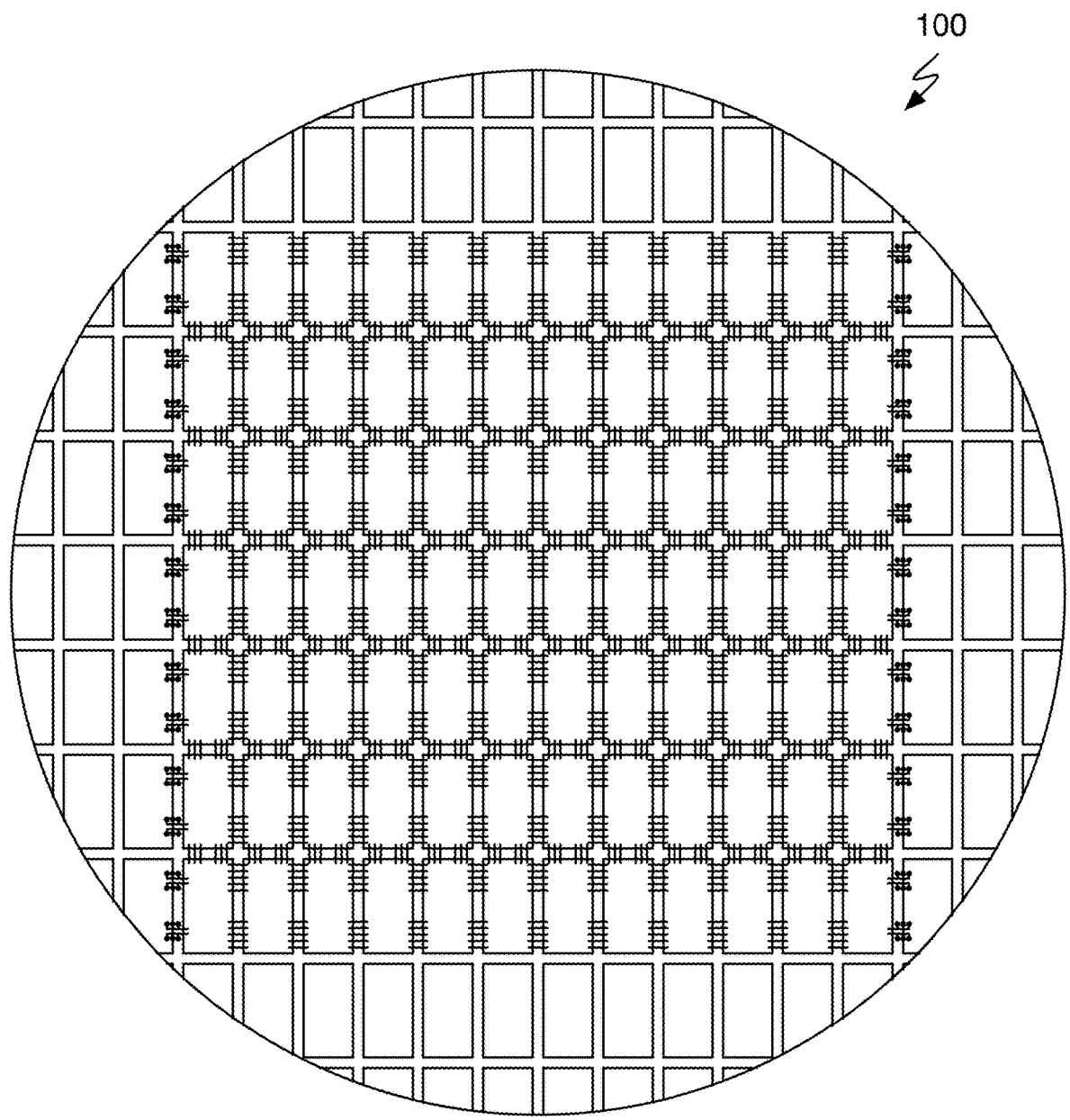
Figure 20E:
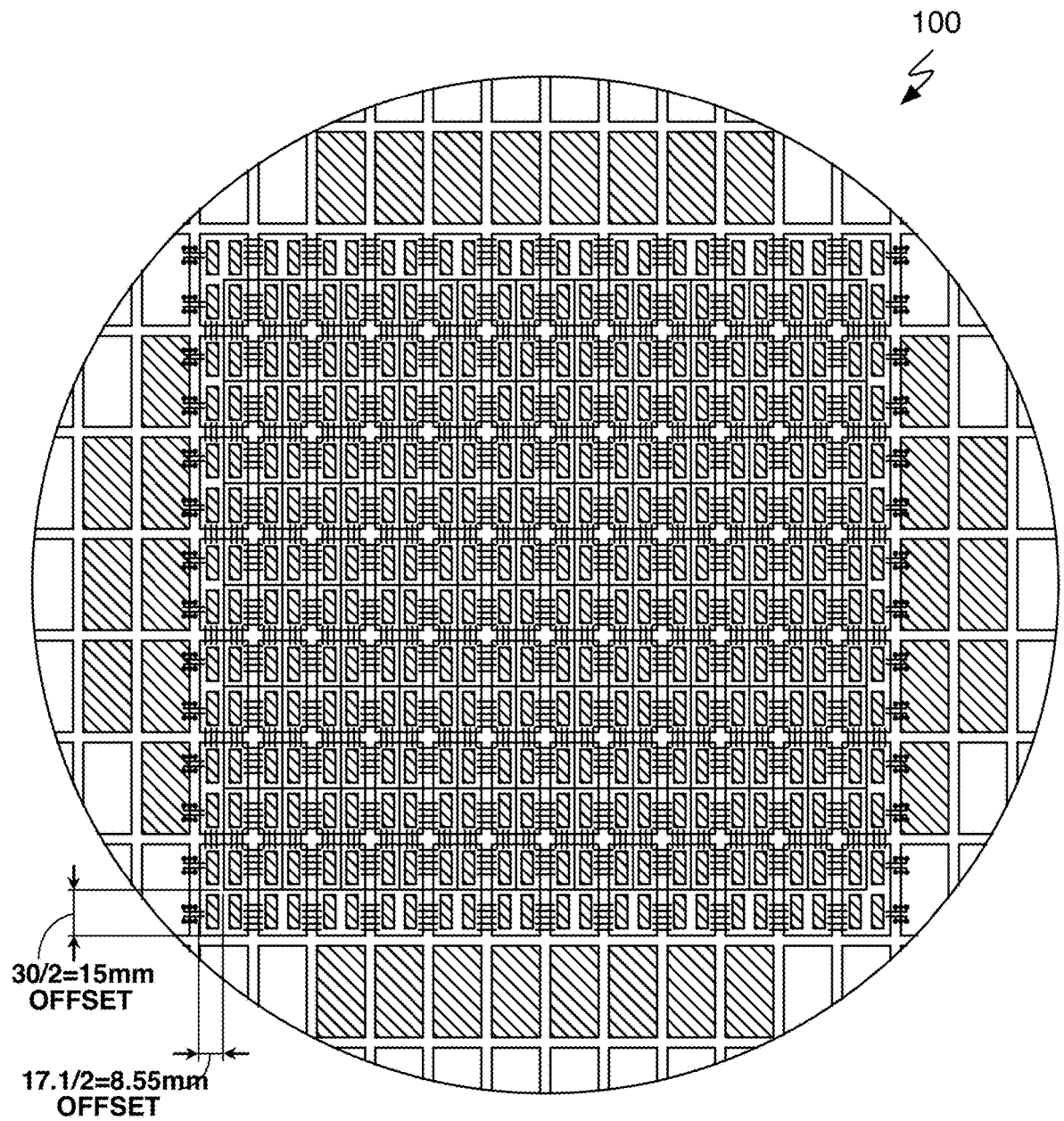
Figure 20F:
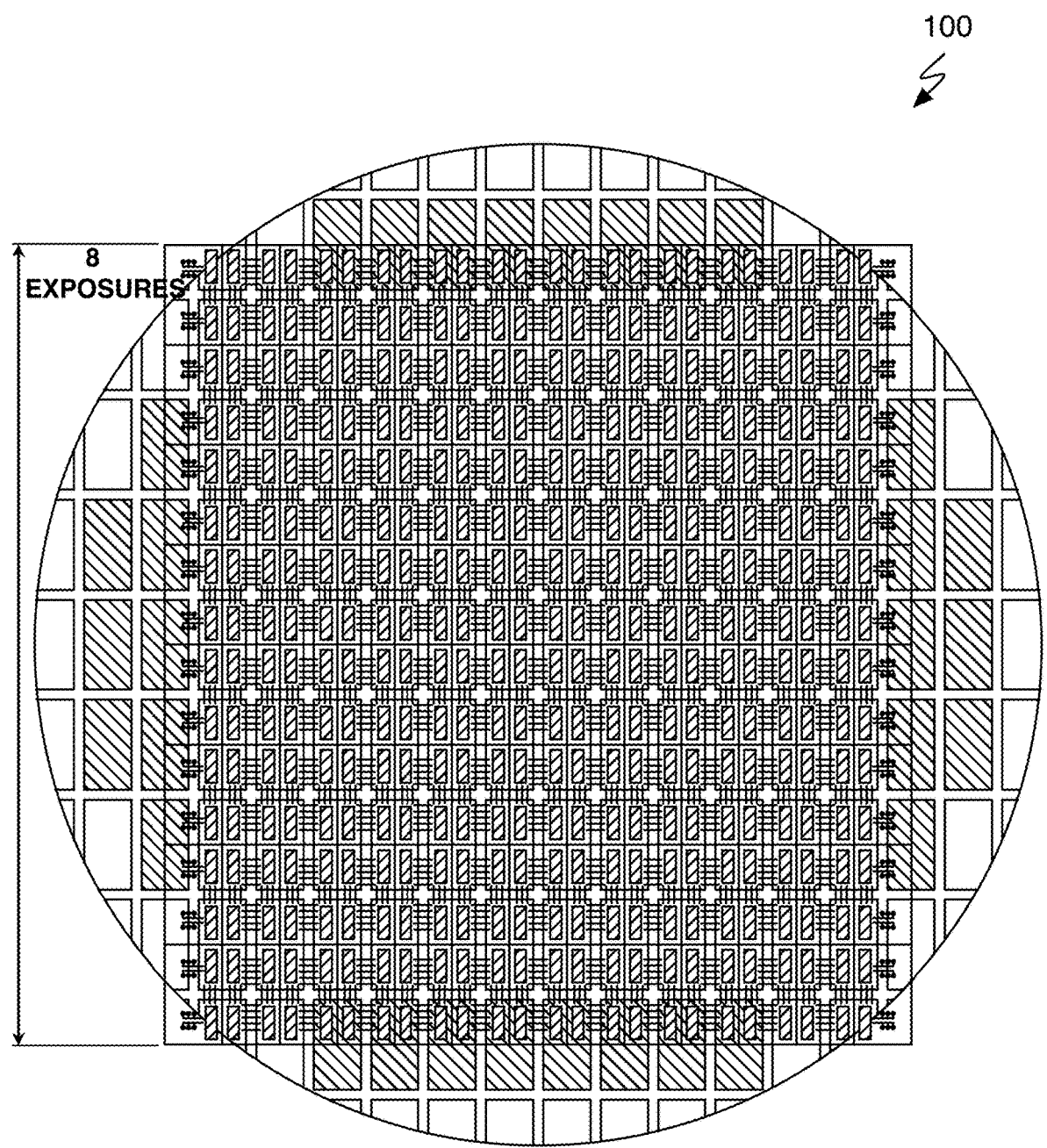
Figure 20G:
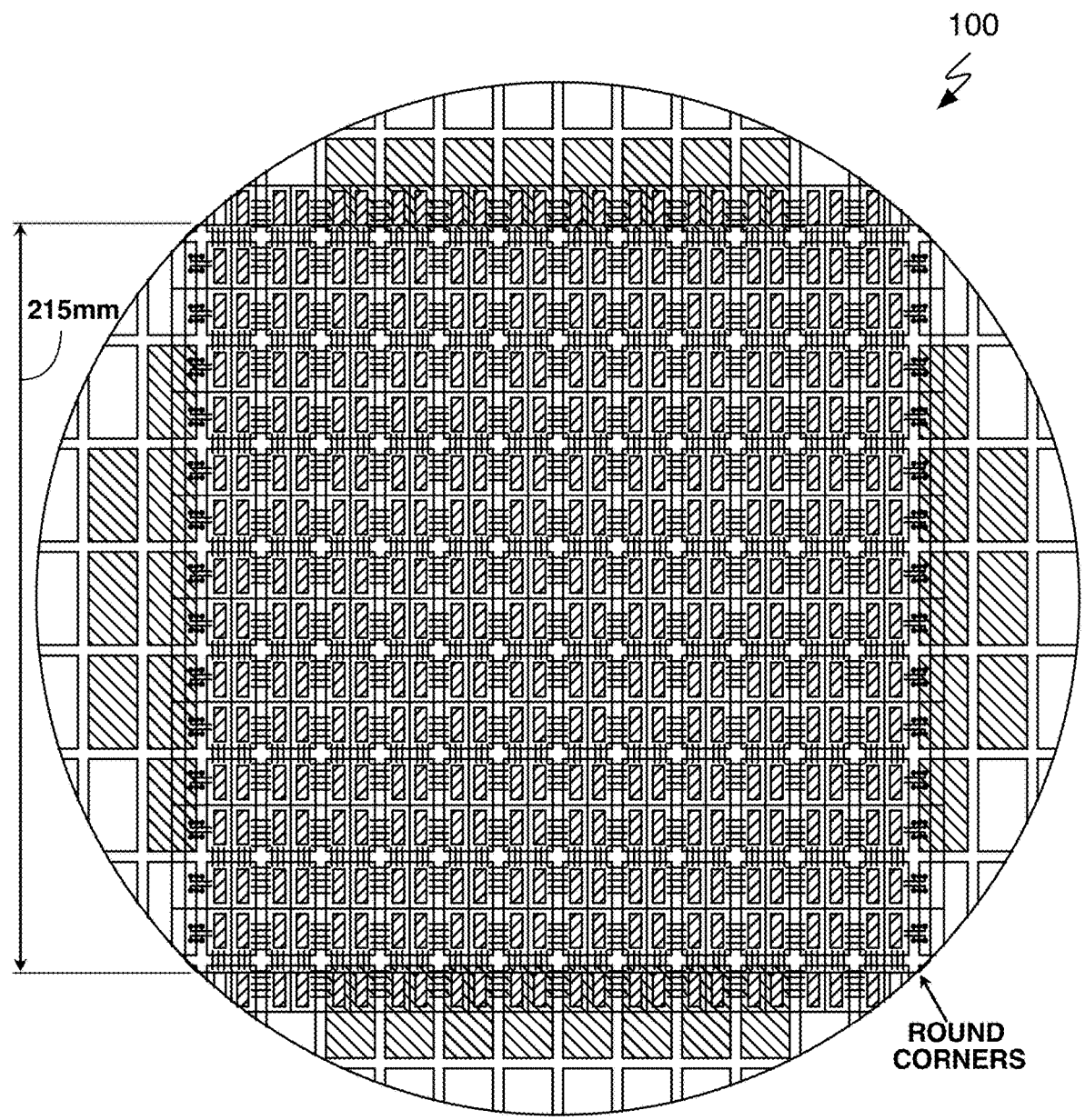
Figure 20H:
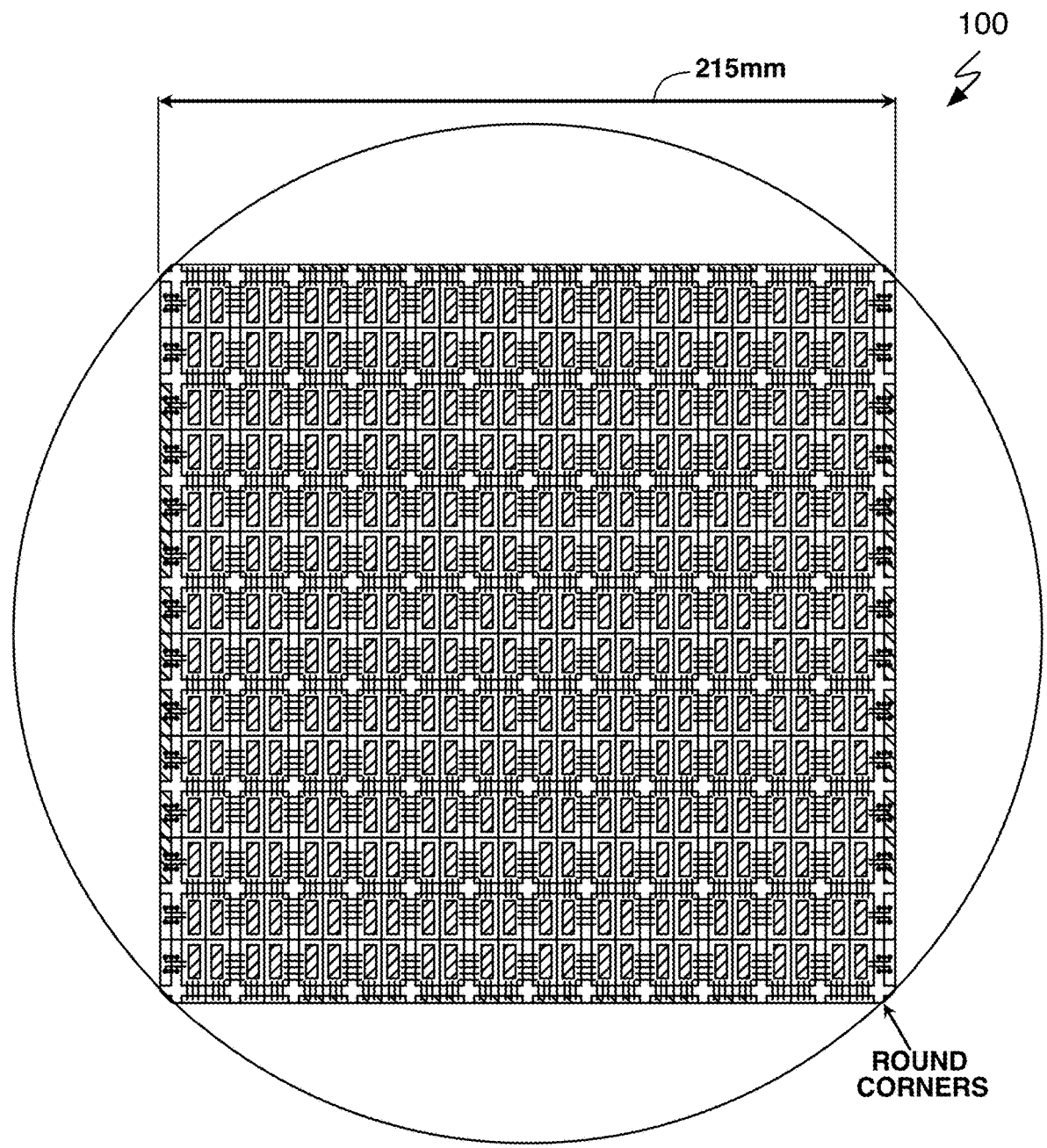
Figure 20I:
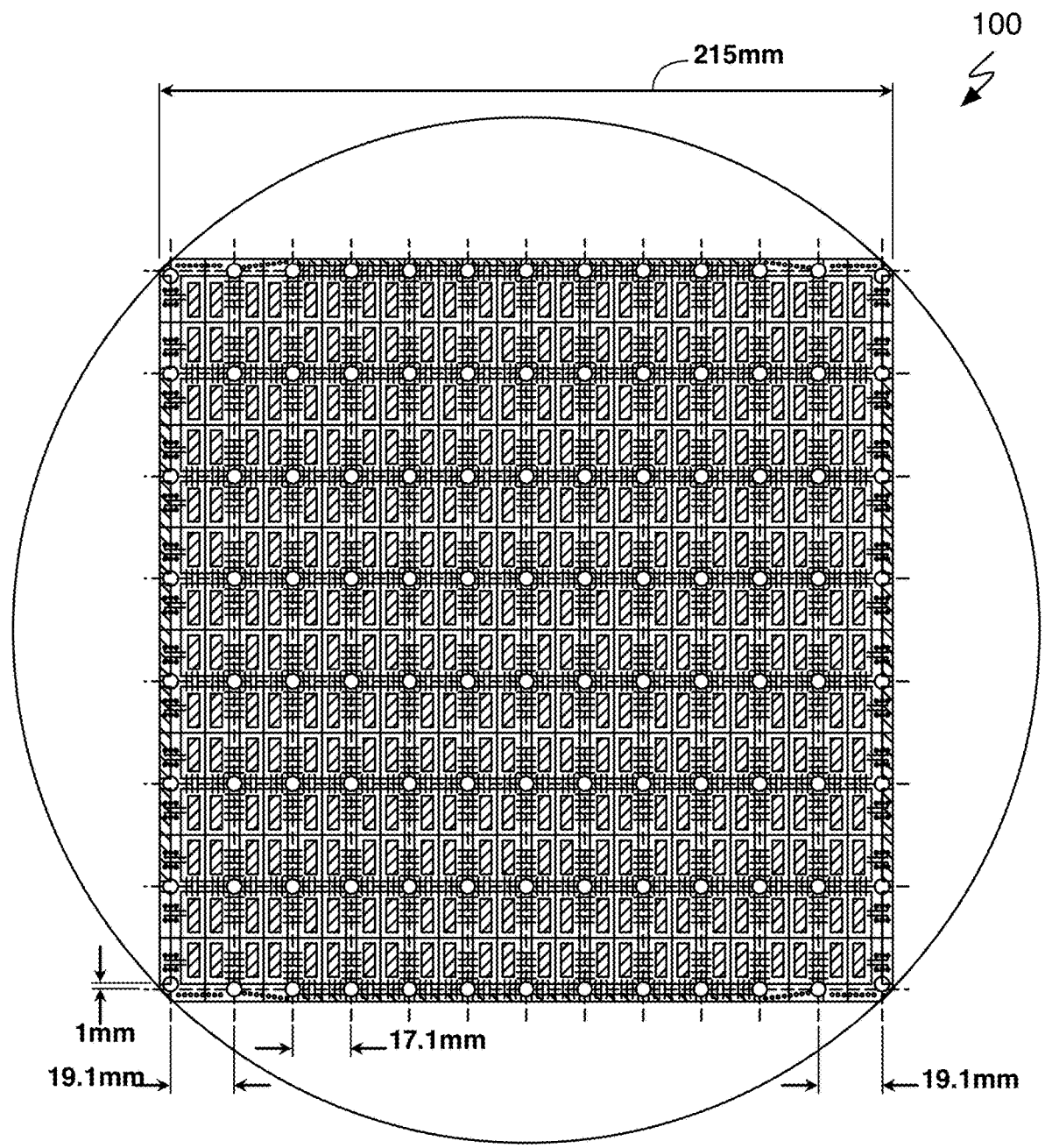

Orifices 112 can be fabricated according to the system and/or method described in U.S. application Ser. No. 16/593,831, filed 4 Oct. 2019, which is incorporated in its entirety by this reference, or be otherwise fabricated. In a first variant, orifice fabrication can include: along an orifice axis normal to the first surface: fabricating a pit (e.g., cavity; through a partial thickness of the integrated circuit) in the integrated circuit using a first material removal technique, the pit comprising a first radius about the pit axis (e.g., cavity axis) and a first depth along the pit axis; and subsequently fabricating an orifice in the integrated circuit using a second material removal technique, the orifice comprising a second radius about the orifice axis, the orifice extending from the first depth along the orifice axis. In a first example of the first variant, the second radius has a second radial distance that is smaller than a first radial distance of first radius (an example is shown in FIG. 16A), which can be advantageous when the second material removal technique is higher precision than first material removal technique (e.g., DRIE can achieve higher precision than laser ablation). In a second example of the first variant, the first and second material removal techniques remove material in the same direction along the orifice axis (e.g., from the front/die face towards rear face). In a third example of the first variant, orifice fabrication can include adding a sacrificial layer to a first surface of an integrated circuit prior to fabricating the pit (an example is shown in FIGS. 17A-C), wherein the sacrificial layer can be removed after first material removal (e.g., cavity formation). In a fourth example of the first variant, the first material removal technique is laser ablation, which can be advantageous in order to penetrate a metal layer (e.g., circuitry layer 125 and/or inter-die connections 130) and expose the substrate (an example is shown in FIGS. 18A and 18B). However, in some cases, laser ablation through a full thickness of the substrate can result in heat damage, deviations in excess of the alignment tolerance of the IC assembly, and/or low precision features. In related examples, high accuracy laser ablation can penetrate 10-25 microns with high accuracy and/or up to a total depth of 140 microns. While industrial laser cutting can penetrate deeper, this can often result in much lower tolerance (e.g., (+/−1 mm for a 2.5 mm feature) and large heat affected zones. In variants with a substrate thickness of 300 microns or more (e.g., 750 microns), laser ablation can be used to expose remove a partial thickness of the substrate. In a fifth example of the first variant, the second material removal technique is etching (e.g., DRIE, an example is shown in FIG. 18C). The second material removal step (e.g., orifice formation) can extend the resultant hole deeper than halfway through the material thickness (e.g., remove 300 microns; create a hole deeper than 300 microns; etc.), or create a resultant hole with any depth. In a sixth example, orifice fabrication can include removing a partial depth of material (e.g., 500 microns of material; more than 50% of the material; etc.) from the back side of the integrated circuit by a friction-based technique (e.g., backgrinding) to expose the bore (an example is shown in FIG. 16B; an example is shown in FIG. 18D). In a seventh example, orifices fabrication can include (an example is shown in FIG. 19): adding a sacrificial layer of material onto a large semiconductor surface in advance of orifice fabrication process; removing a first depth of the semiconductor using laser ablation to form a bore (e.g., cavity) about a central axis; removing a second depth of the semiconductor using DRIE about the central axis, thereby increasing the depth of the bore (e.g., cavity); and reducing a depth of the semiconductor using backgrinding, thereby exposing the bore. In the above examples, the initial wafer thickness can be more than twice the thickness of the finished wafer thickness (e.g., 500 microns to 200 microns; 750 microns to 250 microns; etc.), but can be otherwise related to the finished wafer thickness, be thicker than a laser ablation depth limit, thicker than 140 microns, thicker than 300 microns, thicker than the thickness DRIE can etch in a predetermined amount of time, such as 3 hours or 2.5 hours, etc.), or have any thickness. In the examples above, the first and/or second material removal steps and/or masks used therein can be shared with the steps and/or masks used for fabrication of other integrated circuit features (e.g., metal traces, etc.), such that the orifices are inherently aligned with said other features. However, the material removal steps and/or masks can be different. However, orifices can be otherwise fabricated in the integrated circuit 100.

Orifices 112 can be arranged in: a grid pattern/array corresponding to the locations of securing elements and/or fasteners (e.g., and/or with one-to-one correspondence to a hole pattern on the substrate 220), a Vernier scale (e.g., uniform orifice spacing/pitch, variable spacing/pitch, uniform size/shape, variable size/shape, etc.), with one-to-one correspondence to an alignment feature 222 (e.g., contrast material) of a substrate 220, proximal a corner of the integrated circuit 100, proximal an edge of the integrated circuit 100 (e.g., top/bottom). In a specific example, orifices 112 can be arranged about the integrated circuit as described U.S. application Ser. No. 16/056,792, filed 7 Aug. 2018, which is incorporated in its entirety by this reference. However, orifices can be otherwise suitably arranged and/or distributed about the integrated circuit 100.

Figure 3A:
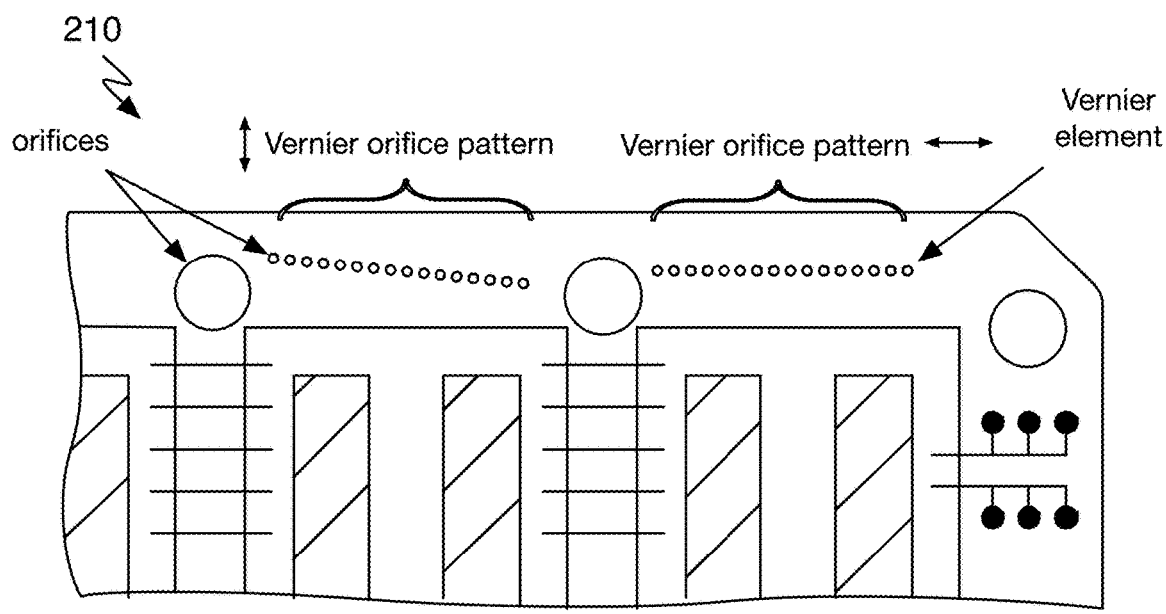
FIGS. 3A, 3B, 3C, and 3D illustrate a first, second, third, and fourth example, respectively, of a variant of the integrated circuit 100 in accordance with one or more embodiments of the present application.
Figure 3B:
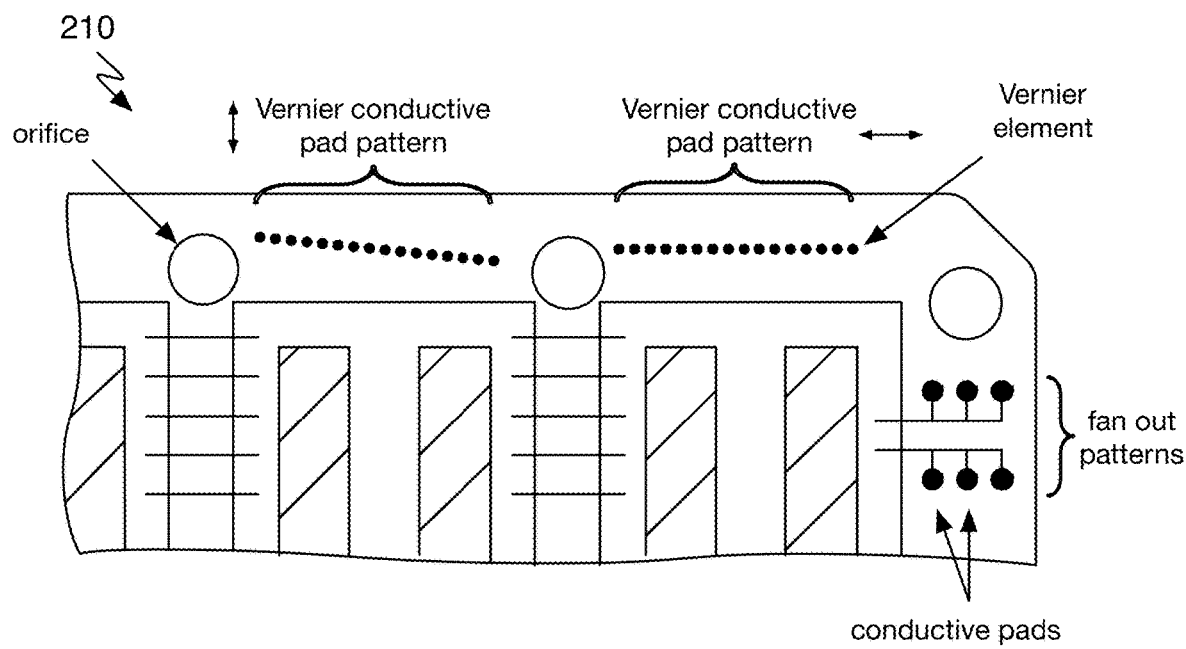
Figure 3C:
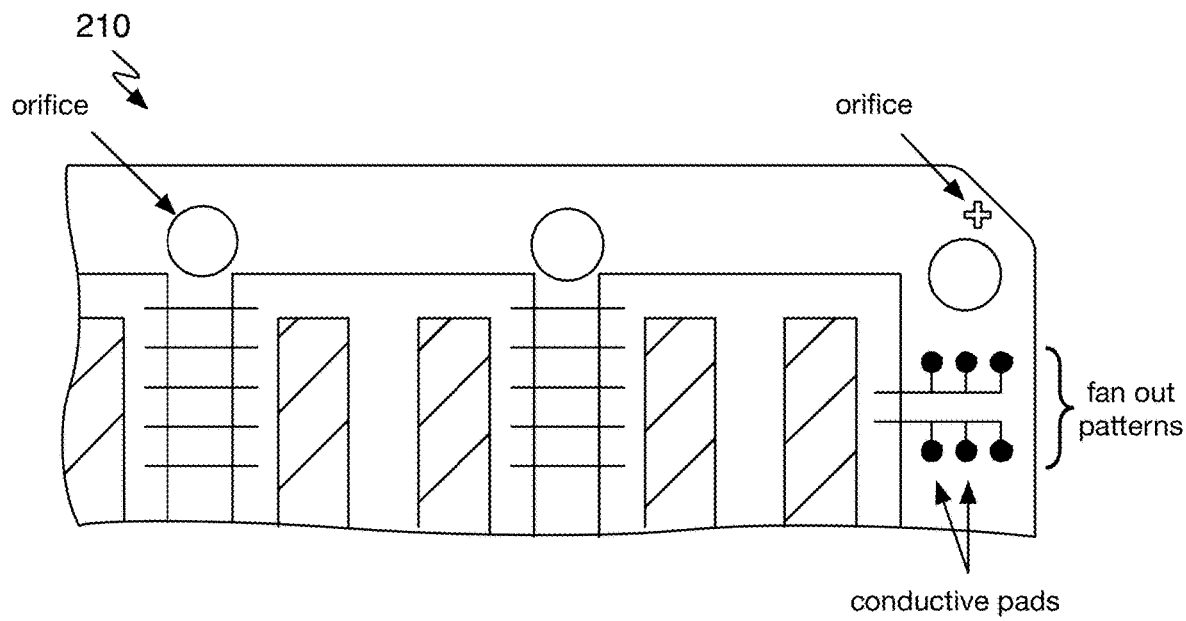
Figure 5:
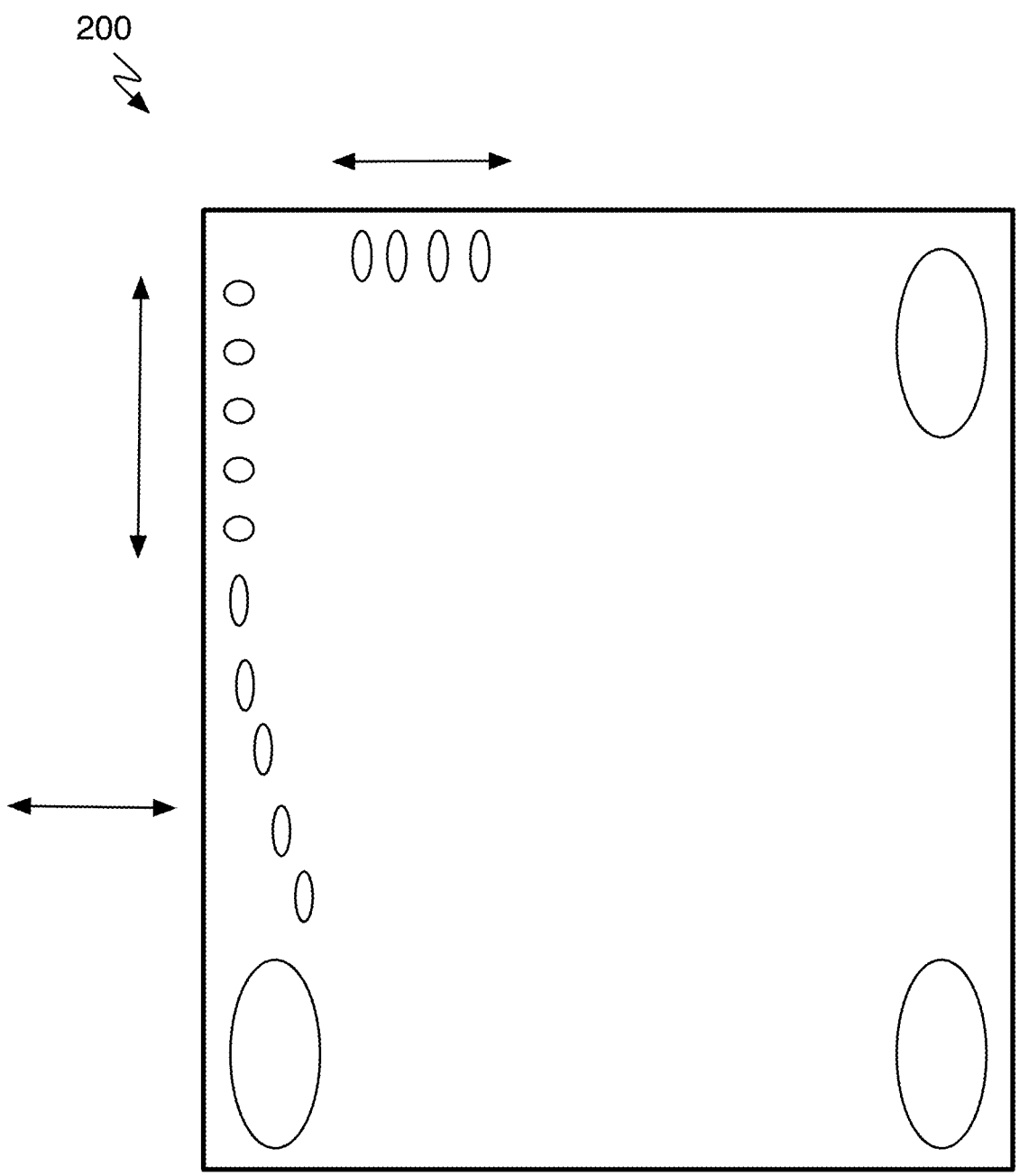
FIG. 5 illustrates an example schematic of a substrate or a silicon component having a multi-dimensional split Vernier scale in accordance with one or more embodiments of the present application.

Orifices can be round, rectangular, oval (an example is shown in FIG. 5), cross-shaped (e.g., '+', an example is shown in FIG. 3C), shaped based on a fastener (e.g., fastener diameter plus an offset/clearance), and/or have any other suitable geometry. However, orifices can have any other suitable geometry.

However, the integrated circuit 100 can include any other suitable orifices 112.

The integrated circuit can include a set of conductive pads (e.g., as part of an circuitry layer) which functions to establish off-die communicative connectivity (e.g., between semiconductor 210 and a substrate 220, such as a PCB). In variants, conductive pads can be arranged as described U.S. application Ser. No. 16/029,207, filed 6 Jul. 2018, which is incorporated in its entirety by this reference. Conductive pads can include Vernier elements, such as part of an electrical Vernier pattern (an example is shown in FIG. 3B). Conductive pads or subsets therein can be interconnected with fan-out connections (an example is shown in FIG. 3B), which can enable connectivity to multiple external endpoints to a common endpoint(s) on the integrated circuit. In an example: the integrated circuit can include a first and a second set of conductive pads, wherein the first set of conductive pads (e.g., Vernier pattern) is misaligned with a corresponding third set of conductive pads of a substrate (e.g., PCB), wherein the second set of conductive pads (e.g., fanout connections) is aligned with a fourth set of conductive pads of the substrate (e.g., aligned based on the misalignment of the first and third sets of conductive pads). However, the integrated circuit 100 can include any other suitable conductive pads.

In variants, (e.g., where the integrated circuit 100 is the semiconductor 210 packaged in an IC assembly 200) the integrated circuit 100 can include one or more alignment features 212, which functions to enable alignment of the integrated circuit 100 with a substrate (e.g., substrate 220). The alignment feature 212 is preferably an orifice of the integrated circuit 100, but can additionally or alternately be a conductive pad of the integrated circuit 100, a high-contrast material deposited on the integrated circuit 100, a translucent portion of the integrated circuit 100 (e.g., thinned-out section), and/or any other suitable alignment feature 212. The alignment feature 212 is preferably visible from the front of the substrate, and can be arranged along, defined by, embedded within, intersect, and/or be otherwise visually apparent on the integrated circuit 100's front face; however, the alignment feature 212 can be arranged on the integrated circuit 100's back face or otherwise arranged. The alignment feature 212 can be symmetric, asymmetric, have keyed features, or other geometry.

The alignment feature 212 can be arranged: anywhere on the integrated circuit 100 (e.g., within the active area, outside of the active area, etc.), asymmetrically on the integrated circuit 100 (e.g., offset from the center), arranged in high-thermal-expansion areas, arranged offset from or within obfuscated regions (e.g., regions covered by heat sinks, regions adjacent fasteners, etc.), or otherwise arranged.

When the integrated circuit 100 includes multiple alignment features 212, different alignment features 212 can be symmetrically arranged (e.g., about a semiconductor axis), asymmetrically arranged, or otherwise arranged on the integrated circuit 100. In a specific example, the semiconductor can include an alignment feature 212 along a first edge and an alignment feature 212 along a second edge opposite the first edge. In a second example, the integrated circuit can include a plurality of alignment features 212, each associated with a respective corner of the integrated circuit 100 (an example is shown in FIG. 1C). However, the semiconductor can include any other suitable alignment features.

Each alignment feature of the integrated circuit is preferably paired with an opposing alignment feature on the substrate (e.g., the PCB), but can alternatively be unpaired or paired with another target (e.g., on another component). During assembly, the alignment and/or connection (e.g., optically, electrically) of paired alignment features preferably indicate proper IC-PCB alignment; when the paired alignment features are misaligned, the misalignment can be used to detect IC-PCB misalignment and/or determine the amount of adjustment needed to properly align the IC and PCB.

However, the integrated circuit 100 can include any other suitable elements.

3.2 IC Assembly

The integrated circuit assembly 200 can include: a semiconductor 210 and a substrate (e.g., PCB) 220. The integrated circuit assembly 200 can optionally include: a compliant connector 230, a thermal management 240, and a securing element 250. The substrate 220 can include a second alignment feature 222 (e.g., alignment target) and/or conductive pads 224. The substrate 220 can optionally include a cavity 226. However, the integrated circuit assembly can include any other suitable components. The integrated circuit assembly 200 functions to enable alignment and/or electrical connectivity between the semiconductor 210 and the substrate 220. An example of the integrated circuit assembly 200 is shown in FIG. 2.

The IC assembly can define a manufacturing and/or alignment tolerance between the semiconductor 210 and the substrate 220 (and/or any specific features thereon) and/or any other suitable components, which specifies the degree of precision of the assembly based on the size and/or pitch of conductive pads on each component. The alignment tolerance of the IC assembly can be 500 microns, 250 microns, 100 microns, 25 microns, 10 microns, 5 microns, any range bounded by the aforementioned values, and/or any other suitable alignment tolerance. However, the IC assembly can include any other suitable alignment tolerance and/or alignment precision.

The size and/or broad-face area of the IC assembly can depend on the scale of the semiconductor. Accordingly, for variants of the IC assembly packaging a semiconductor such as the integrated circuit 100, the IC assembly can be considered 'wafer-scale'—with a broad face dimension of greater than 215 mm, 215 mm, 200 mm, 150 mm, 100 mm, 85 mm, any range bounded by the aforementioned values, and/or any other suitable dimension. In a specific example, the IC assembly can package a semiconductor having a broad face with a dimension of about 215 mm and an area of about 46,000 mm$^2$.

The semiconductor 210 can be: the integrated circuit 100, a singulated die, a chip (e.g., singulated or not singulated) that is formed by the same process as integrated circuit 100, and/or be any other suitable semiconductor. However, semiconductor 210 of the IC assembly can be any other processor, chip, wafer, semiconductor substrate, and/or other suitable component.

The semiconductor 210 can include one or more alignment features 212, which functions to enable alignment of the semiconductor 210 with the substrate 220. The alignment feature 212 is preferably an orifice of the semiconductor, but can additionally or alternatively be a conductive pad 214 of the semiconductor, a high-contrast material deposited on the semiconductor, a translucent portion of the semiconductor (e.g., thinned-out section), and/or any other suitable alignment feature 212. The alignment feature 212 is preferably visible from the front of the substrate, and can be arranged along, defined by, embedded within, intersect, and/or be otherwise visually apparent on the semiconductor 210's front face; however, the alignment feature 212 can be arranged on the semiconductor 210's back face or otherwise arranged. The alignment feature 212 can be symmetric, asymmetric, have keyed features, or other geometry.

The alignment feature 212 can be arranged: anywhere on the semiconductor 210 (e.g., within the active area, outside of the active area, etc.), asymmetrically on the semiconductor 210 (e.g., offset from the center), arranged in high-thermal-expansion areas, arranged offset from or within obfuscated regions (e.g., regions covered by heat sinks, regions adjacent fasteners, etc.), or otherwise arranged.

When the semiconductor 210 includes multiple alignment features 212, different alignment features 212 can be symmetrically arranged (e.g., about a semiconductor axis), asymmetrically arranged, or otherwise arranged on the semiconductor 210. In a specific example, the semiconductor 210 can include an alignment feature 212 along a first edge and an alignment feature 212 along a second edge opposite the first edge. In a second example, the semiconductor 210 can include a plurality of alignment features 212, each associated with a respective corner of the semiconductor 210 (an example is shown in FIG. 1C). However, the semiconductor can include any other suitable alignment features.

The substrate 220 functions to mount the semiconductor 210 and/or functions to establish communicative and/or power connections between the semiconductor and external devices. The substrate is preferably a circuit board, such as a printed circuit board (PCB), but can be a second semiconductor (e.g., stacked multi-chip configuration), and/or any other suitable substrate. In a first variant, the substrate 220 can be the substrate described in U.S. application Ser. No. 16/029,207, filed 6 Jul. 2018, which is incorporated in its entirety by this reference. In a second variant, the substrate 220 can be the substrate (or 'main board') described in U.S. application Ser. No. 16/056,792, filed 7 Aug. 2018, which is incorporated in its entirety by this reference. However, any other suitable substrate can be used.

The substrate 220 can include conductive pads 224, which function to communicate electrical signals to paired conductive pads 214 of the semiconductor 210 (e.g., after assembly), but can additionally or alternatively function as alignment features 222 (e.g., visual alignment features, electrical alignment validation features, etc.). Each conductive pad 224 is preferably aligned with a predetermined conductive pad of the conductive pads 214 of the semiconductor and aligned via method S200 (e.g., in S230) and/or method S300 (e.g., after S330 and/or in response to S330; in an operational configuration of the IC package). Additionally or alternately, conductive pads 214 of the semiconductor can be not aligned (e.g., electrical Vernier components) and/or misaligned (e.g., based on coefficient of thermal expansion (CTE) mismatch and/or thermal strain of the IC assembly; during assembly) with the conductive pads 224. Conductive pads can be arranged on the front face of the substrate 220 (and/or define the front face of the substrate), but can additionally or alternatively have any suitable arrangement on the substrate 220. Conductive pads 224, can be round, oval, cross-shaped, and/or rectangular. However, conductive pads can have any other suitable geometric shape. In a specific example, the conductive pads 224 are be copper (Cu, Cu alloy). However, the conductive pads can be any other suitable material.

The substrate 220 can be constructed from an epoxy (e.g., FR4), polymide, Teflon, and/or any other suitable materials, which can be laminated with any suitable conductive materials (e.g., copper, gold, etc.). The substrate is preferably rigid (e.g., higher stiffness than semiconductor and/or compliant connector), but can alternately be semi-rigid and/or flexible. The substrate can have a coefficient of thermal expansion (CTE) which is different from the semiconductor 210 and/or within a predetermined threshold difference of the semiconductor CTE. The substrate is preferably opaque, but can additionally or alternatively be substantially opaque, translucent, semi-transparent, and/or translucent. In a specific example, a nominal thickness of the substrate material (e.g., distance between broad faces) is substantially opaque. In variants, a partial thickness of the substrate (such as a thickness between the base of a cavity and an alignment) can be substantially transparent and/or translucent (e.g., more than a threshold percentage of visible light passes through, such as 95% of light, 90%, 75%, 50%). In a specific example, a cavity can define a translucent region on the front face of the substrate based on the geometry of the cavity—such as a circular region (e.g., circle about axis of a cylindrical cavity), annulus (e.g., where a circular region for a cylindrical cavity is concentric about contrast material; an example is shown in FIG. 8B), and/or other suitable translucent region. However, the substrate can include any other suitable materials and/or have any other suitable material properties.

The substrate 220 can include an alignment feature 222 which functions to provide an alignment target for alignment of the semiconductor 210 relative to the substrate 220. The alignment feature 222 preferably has a known arrangement relative to the conductive pads 224 (e.g., be manufactured from the same mask, be manufactured during the same process, be manufactured using the conductive pad 224 as a mask, etc.), but can be otherwise arranged relative to the conductive pads 224.

The alignment feature 222 can include a contrast feature which functions to provide a visual alignment target on the substrate 220. The contrast feature can be constructed of a conductive material, such as the same material as the conductive pads (e.g., Cu, Cu alloy) and/or formed in the same process/setup, simultaneously, and/or concurrently with the conductive pads on the substrate 220. Preferably, the material of the contrast feature (e.g., contrast material) is offset from a color of the substrate 220 by greater than a threshold color distance. In an example (for a color of the substrate $R_1G_1B_1$ and a color of the contrast material $R_2G_2B_2$), the color distance=$\sqrt{(R_2-R_1)^2+(G_2-G_1)^2+(B_2-B_1)^2}$. The threshold color distance can be: 1000, 2500, 5000, 10000, 20000, 40000 and/or any other suitable threshold color distance. However, the contrast feature can include any other suitable material and/or formed by any other suitable process.

Contrast features are preferably arranged with one-to-one correspondence with the first alignment feature 212 (e.g., aligned with the orifice axis when semiconductor 210 is aligned with substrate 220). In an example, a center of the second alignment feature 222 is within a threshold distance of the center of the first alignment feature 212 (e.g., after S330). However, contrast features can be otherwise suitably arranged.

The contrast feature can be round, rectangular, cross-shaped (e.g., '+'), shaped based on the boundary (and/or second material removal/radius) of an orifice in the semiconductor 210, and/or have any other suitable geometry. The contrast feature can be the same size, larger, and/or smaller than a corresponding orifice dimension (e.g., smaller than a radius of the orifice, such as formed by a second material removal technique) of the semiconductor 210. In a specific example, the contrast feature can be formed using the same mask used in a DRIE etching process forming an orifice through the semiconductor 210. The contrast feature can be the same size, larger, and/or smaller than a corresponding cavity dimension (e.g., smaller than a radius of the cavity/counterbore) of the substrate 220. In a first example, the diameter of a contrast feature is smaller than the diameter of the (corresponding/aligned) orifice of the substrate 210, and the diameter of the orifice is smaller than the diameter a (corresponding/aligned) cavity of the substrate 220. In a second example, the diameter of a contrast feature is substantially equivalent to the diameter of the (corresponding/aligned) orifice of the substrate 210, and the diameter of the orifice is smaller than the diameter a (corresponding/aligned) cavity of the substrate 220.

The alignment features 222 can include a cavity 226 (e.g., 'counterbore') which functions to optically connect the broad faces of the substrate 220. In a specific example, a full thickness of the substrate 220 is substantially opaque and the cavity defines a partial thickness (e.g., at base of the cavity through remainder of substrate 220) which is substantially transparent (and/or semitransparent/translucent). The cavity is preferably centered about an axis aligned with the center of the contrast feature, but can alternately be aligned with an orifice of the semiconductor 210, define a radial dimension exceeding a radial dimension (e.g., diameter) of the contrast feature, and/or define a projected area on the front face of the substrate 220 which surrounds/encloses a periphery of the contrast feature. However, the cavity can have any other suitable geometry and/or arrangement.

The substrate 220 can be assembled with the semiconductor 210 to form the IC assembly 200 in accordance with the system and/or methods described in U.S. application Ser. No. 16/056,792, filed 7 Aug. 2018, and U.S. application Ser. No. 16/029,207, filed 6 Jul. 2018, each of which is incorporated in its entirety by this reference. However, the substrate 220 can be otherwise suitably assembled with the semiconductor 210 to form the IC assembly 200.

The IC assembly 200 can include Vernier elements, which function to detect misalignment and/or measure the degree of misalignment (or degree of alignment) between the semiconductor 210 and the substrate 220. Vernier elements preferably include alignment features 212 and alignment features 222. However, Vernier elements can include any other suitable elements and/or be otherwise formed. In variants, Vernier elements can be distributed between the semiconductor 210 and the substrate 220, forming a first pattern on the semiconductor and a second pattern on the substrate such that the first and second pattern cooperatively define a Vernier scale along one or more directions of the wafer (e.g., in the plane of the front faces; longitudinal and/or lateral). In a first example, the IC assembly 200 includes a first Vernier scale with a uniform lateral pitch and a varying longitudinal pitch between Vernier elements (e.g., of the semiconductor 210 and/or substrate 220) and a second Vernier scale with a variable lateral pitch and a uniform longitudinal pitch between Vernier elements (e.g., of the semiconductor 210 and/or substrate 220). In a second example, the IC assembly 200 includes a first Vernier scale on a first side of the IC assembly and a second Vernier scale on a second side of the IC assembly. In a third example, the IC assembly 200 includes a Vernier scale proximal to each corner (e.g., in broad face plane). Examples of Vernier elements (and patterns thereof) are shown in FIGS. 3A and 3B.

The IC assembly 200 can optionally include a compliant connector 230 (e.g., elastomeric connector) which functions to electrically connect the semiconductor 210 to the substrate 220. The compliant connector can additionally or alternately function to deform to account for CTE mismatch and/or absorb differing thermal strain of the semiconductor 210 and the substrate 220. The compliant connector can be: entirely or partially transparent, translucent, or opaque (e.g., to visible light, IR light, UV light, etc.). In a specific example, the compliant connector can be the elastomeric connector described in U.S. application Ser. No. 16/029,207, filed 6 Jul. 2018, which is incorporated in its entirety by this reference. However, the substrate 220 can be otherwise electrically connected to the semiconductor 210. In a first variant, the compliant connector electrically connects each of a first plurality of conductive pads on substrate 220 to a respective conductive pad of a second plurality of conductive pads on the semiconductor 210. In a second variant, the compliant connector electrically connects a subset of a first set of Vernier conductive pads (e.g., on the semiconductor 210) to a subset of a second set of Vernier conductive pads (e.g., on the substrate 220) based on the alignment of the semiconductor 210 and the substrate 220.

However, the IC assembly 200 can include any other suitable connector and/or exclude a compliant connector (e.g., utilize a rigid connector/connection, etc.).

The IC assembly 200 can optionally include a thermal management component 240 (e.g., heat sink) which functions to reject thermal energy from the semiconductor 210 during operation. Additionally or alternatively, the thermal management component can function to increase the stiffness of the IC assembly. Additionally or alternatively, the thermal management component can function to provide color contrast relative to the contrast material, semiconductor 210, and/or substrate 220 for alignment and/or alignment verification (e.g., when viewed through the orifice of the semiconductor 210). In a specific example, the thermal management component can be a layer component as described in U.S. application Ser. No. 16/056,792, filed 7 Aug. 2018, which is incorporated in its entirety by this reference. The thermal management component is preferably thermally connected to and/or mechanically mated to a back face (e.g., opposing the front face and/or die face) of the semiconductor 210. The thermal management component can be: a fluid manifold, a heat exchanger (e.g., liquid-air, liquid-liquid, plate and fin, etc.), a heat sink (e.g., passive, active), and/or any other suitable thermal management component. The thermal management component is preferably metal and/or optically opaque (e.g., in visible light spectrum), however can be constructed of any suitable materials and/or have any other suitable materials/properties.

In a first variant, after S330, the thermal management component is arranged on the back face of the semiconductor 210 and is subsequently connected (e.g., mechanically and/or thermally) to the semiconductor 210. In a first example of the first variant, the substrate 220 defines a first plurality of orifices and the thermal management component defines a second plurality of orifices, each orifice of the second plurality aligned with a respective orifice of the first plurality along an axis. In a second example of the first variant, the thermal management component covers an orifice (e.g., alignment feature 212) of the semiconductor 210. In the second example of the first variant, a lumen defined by the orifice, thermal management component, and compliant connector can define a lumen which encloses a volume of air (e.g., which is fluidly isolated from an ambient environment and/or fluid exterior of the IC assembly 200). In some instances, it can be advantageous to enclose air within the lumen to provide precision alignment, despite the high thermal resistance (e.g., thermal resistance from semiconductor through air gap to the thermal management component is greater than the thermal resistance of direct conduction between semiconductor and the thermal management component) of an enclosed air volume. In such cases, reducing the cooling capacity of the thermal management component can be beneficial to enable precise alignment.

However, the IC assembly 200 can include any other suitable thermal management component and/or exclude a thermal management component.

Figure 15:
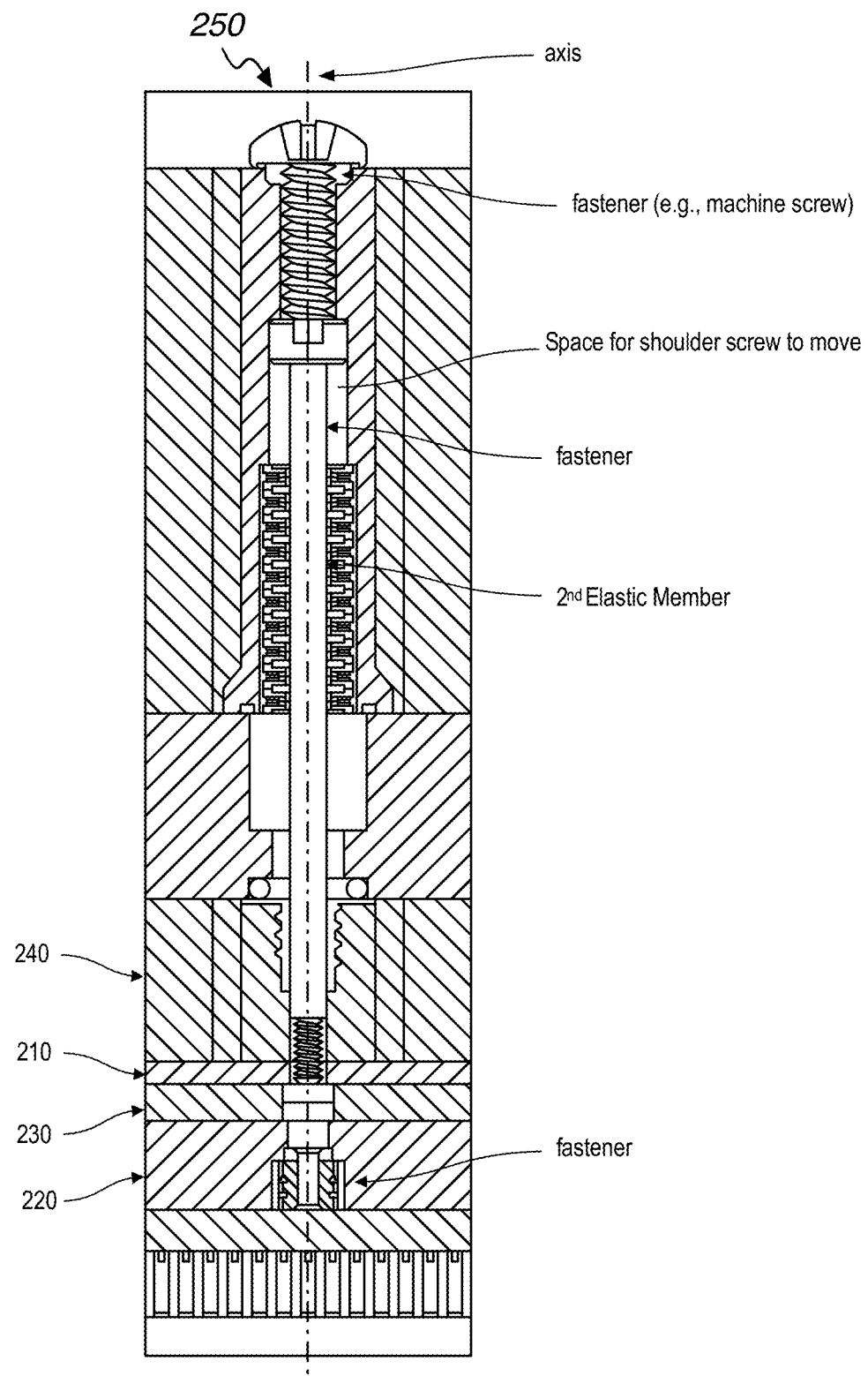
FIG. 15 illustrates a cross sectional view of an example securing element and within an example integrated circuit assembly in accordance with one or more embodiments of the present application.

The IC assembly 200 can optionally include securing elements 250 (e.g., fasteners) which function to mechanically connect the semiconductor 210 to the substrate 220. Additionally or alternately, the securing elements can function to compress the compliant connector 230 and/or retain the compliant connector between the semiconductor 210 and the substrate 220. Securing elements can include fasteners, screws, nuts, washers, elastic elements, spacers, springs (e.g., Belleville washers), machine screws, shoulder screws, pins, retaining rings, latches, and/or any other suitable components. In an example, the securing elements can be the securing elements described U.S. application Ser. No. 16/056,792, filed 7 Aug. 2018, which is incorporated in its entirety by this reference. In variants a securing element (e.g., fastener) extends through a thickness of the semiconductor 210 (e.g., through an orifice of the semiconductor 210). In a specific example, an axis of the fastener is coaxially aligned with the orifice of the semiconductor 210. In a second variant, the substrate 220 defines a first plurality of orifices and the thermal management component defines a second plurality of orifices, each orifice of the second plurality aligned with a respective orifice of the first plurality along an axis, and a securing element aligned with the axis (e.g., the securing element extending through a thickness of the substrate 220 and the thermal management component 240). An example of a securing element is shown in FIG. 15.

Figure 13A:
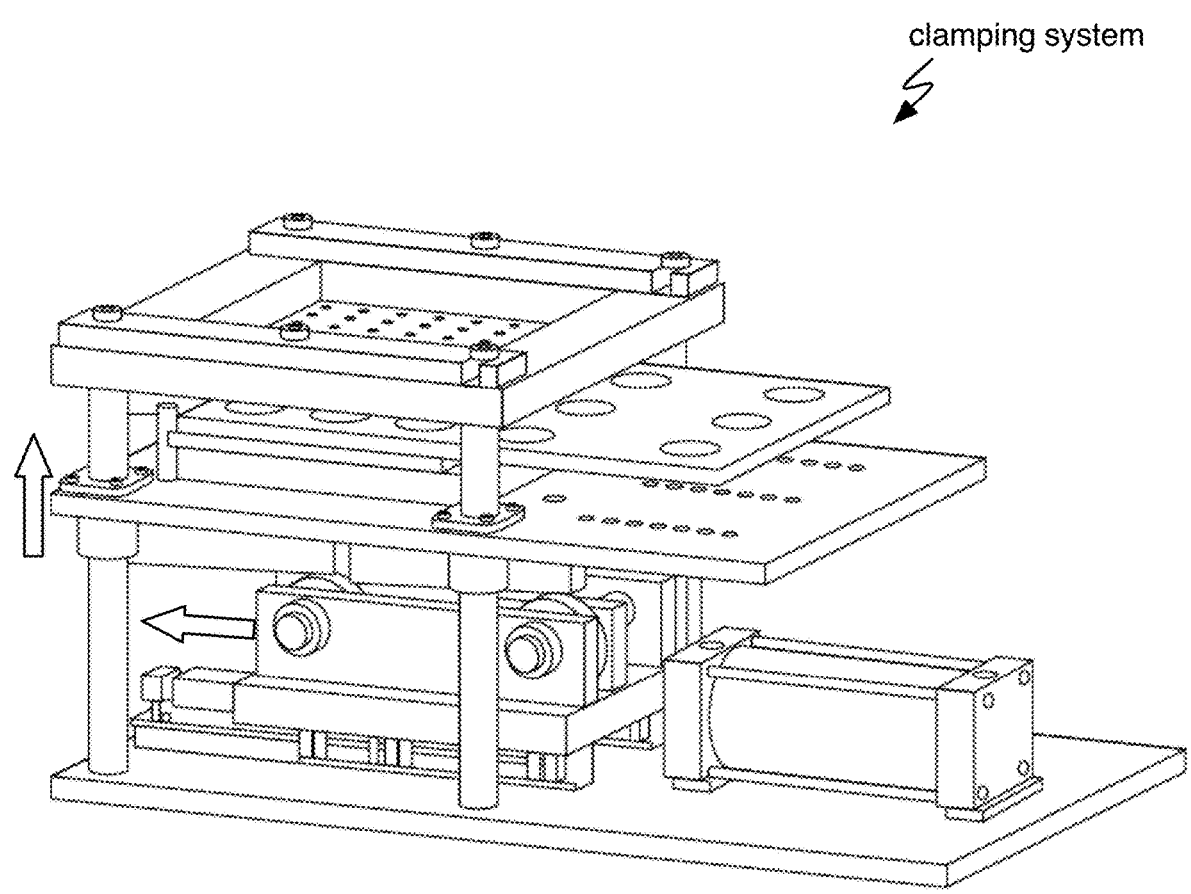
FIGS. 13A and 13B illustrate a first and second example, respectively, of an isometric view of a clamping system in accordance with one or more embodiments of the present application.
Figure 13B:
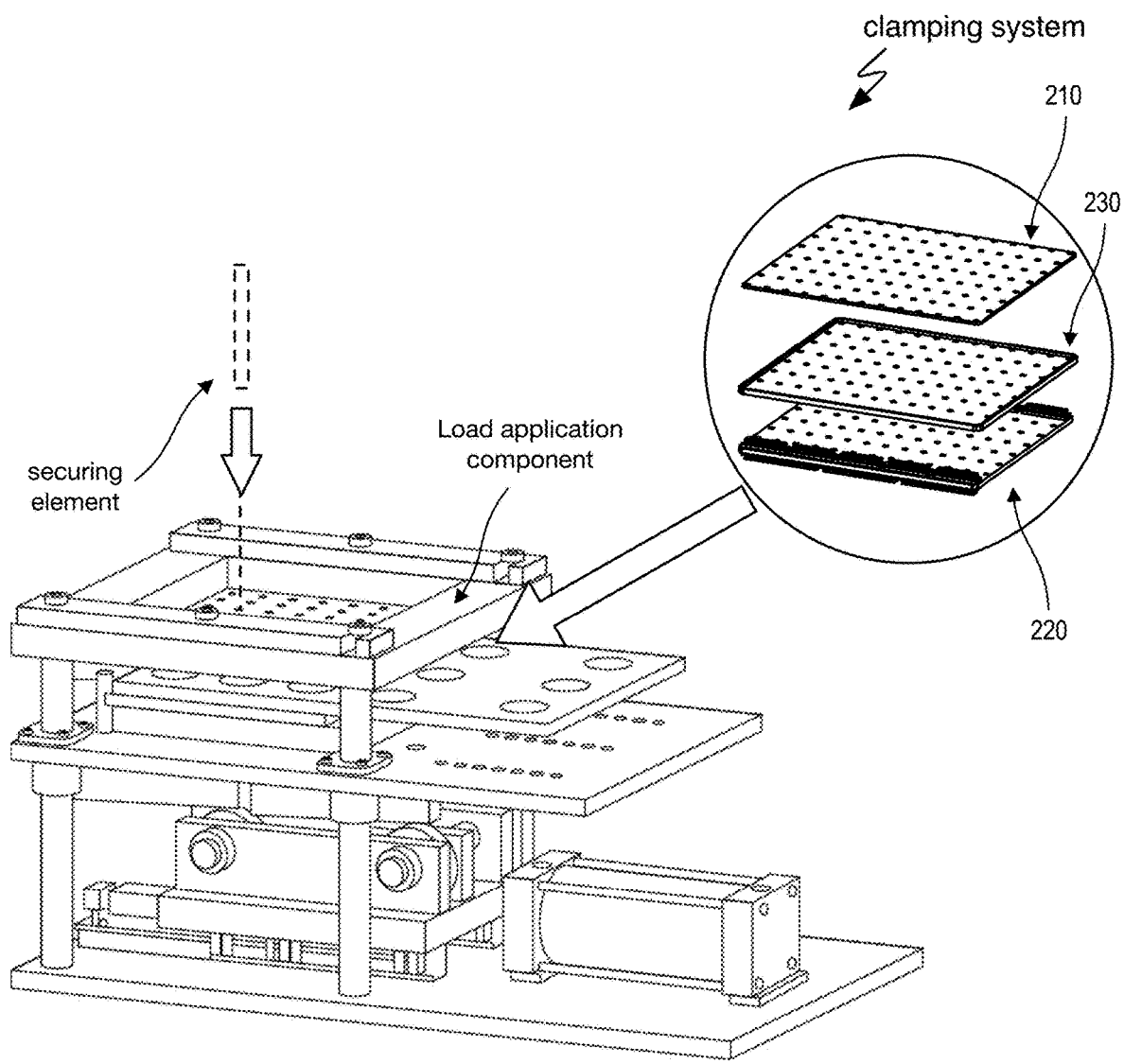
Figure 14A:
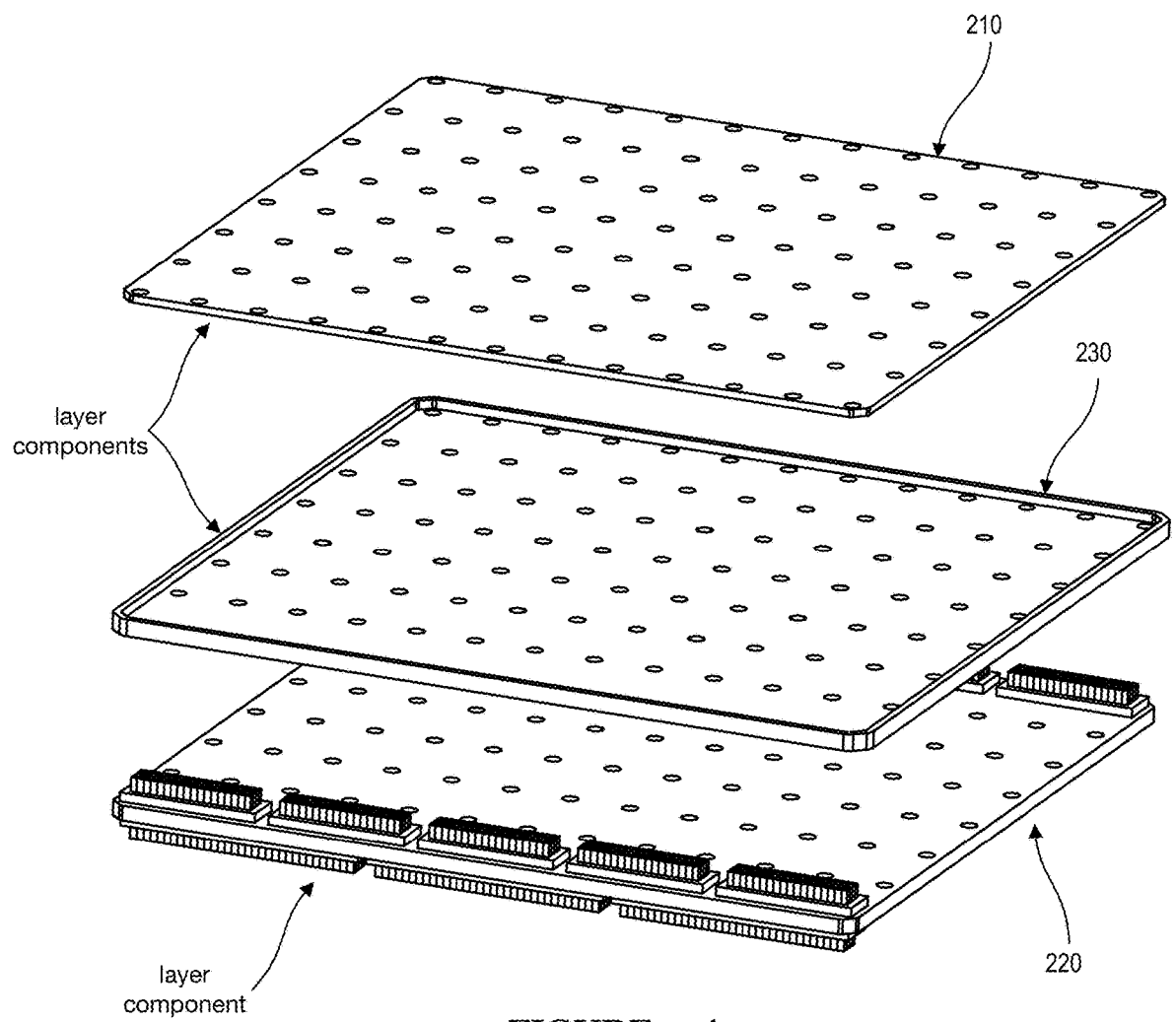
FIG. 14A illustrates an exploded view of an example integrated circuit assembly in accordance with one or more embodiments of the present application.
Figure 14B:
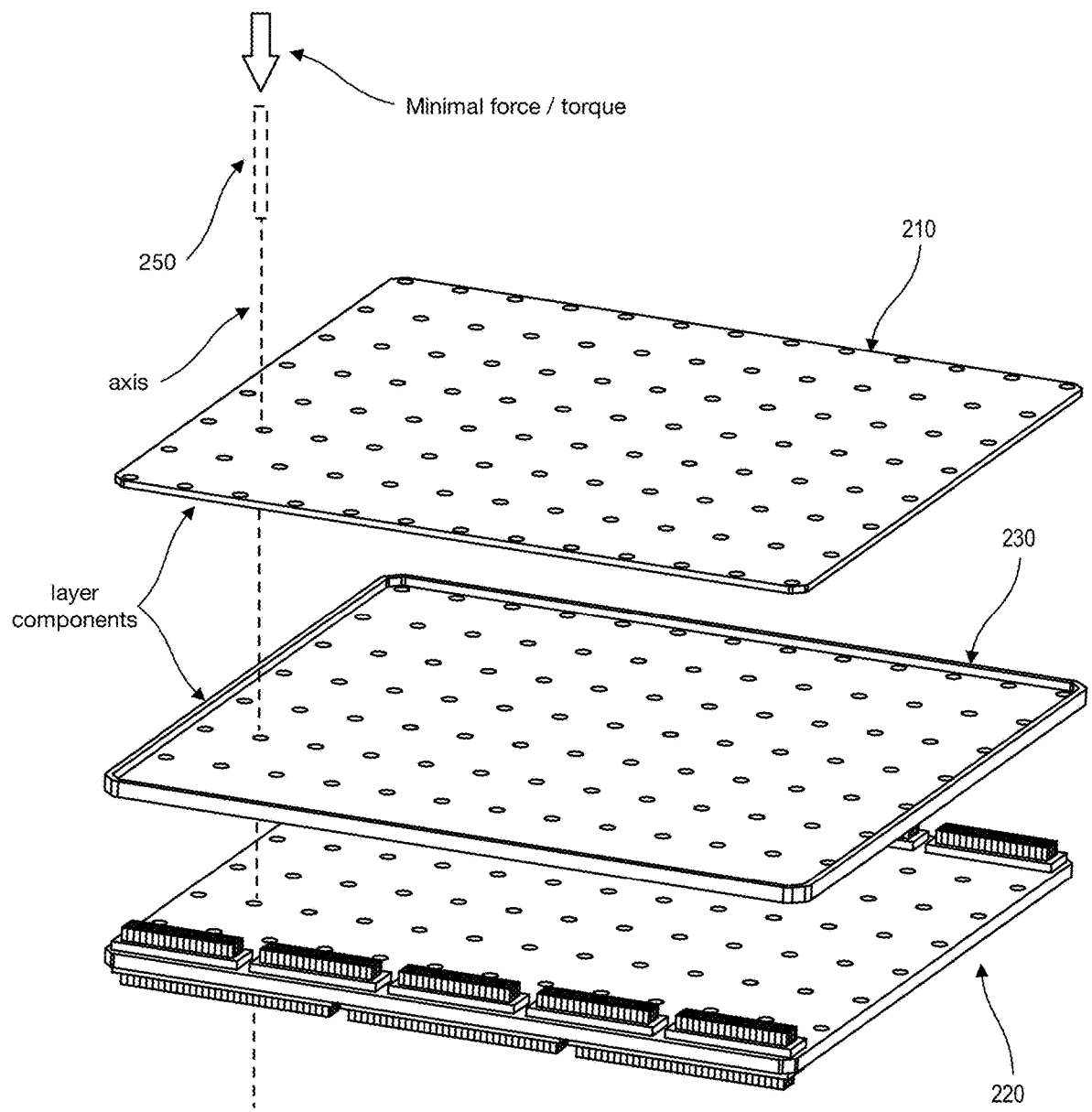
FIG. 14B illustrates an example insertion of a securing element relative to an example integrated circuit assembly in accordance with one or more embodiments of the present application.
Figure 14C:
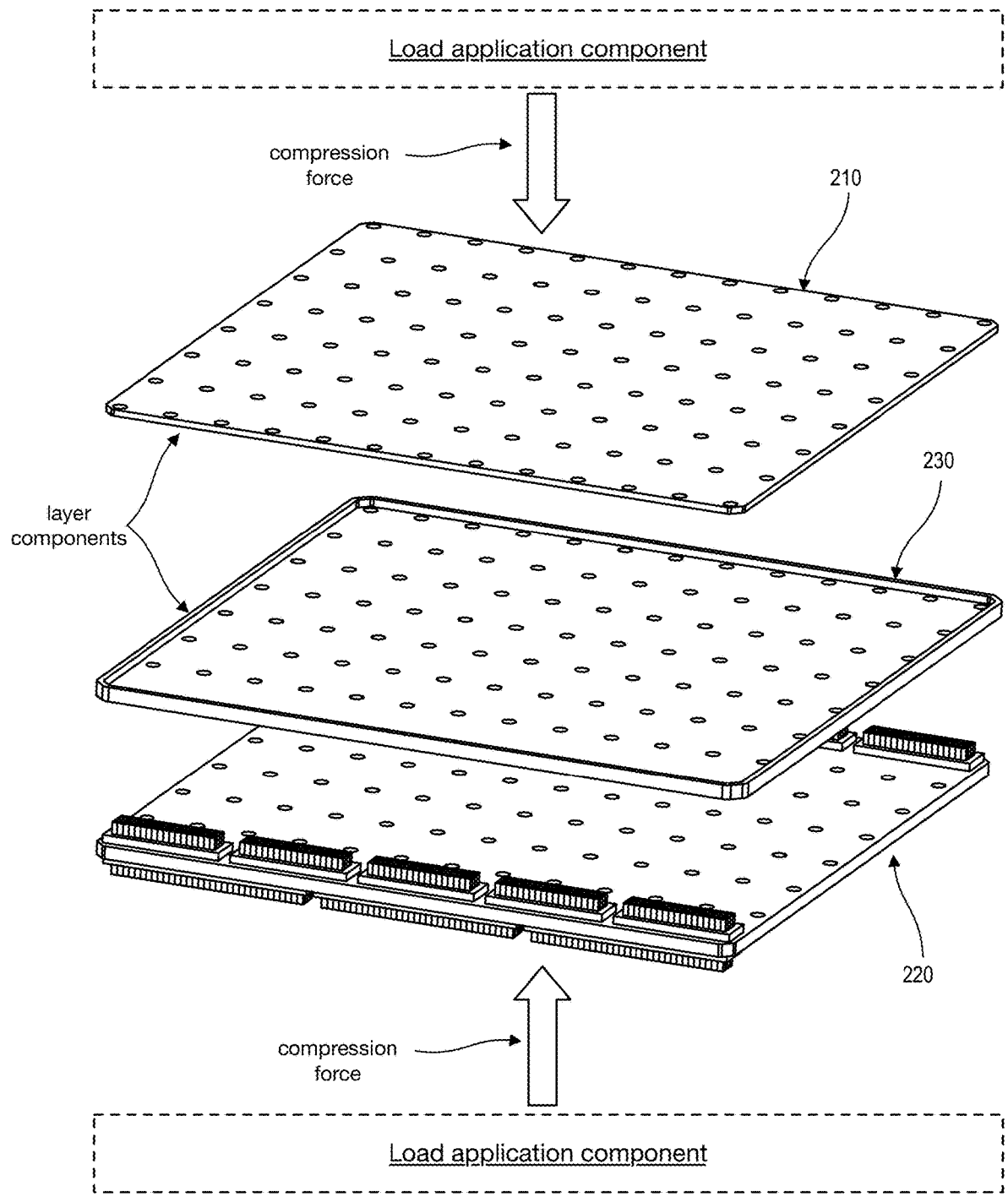
FIG. 14C illustrates an example application of a pressing force on an example integrated circuit assembly in accordance with one or more embodiments of the present application.

In variants, securing elements are configured to uniformly compress the semiconductor, substrate, and compliant connector. In a specific example, a clamping system (an example is shown in FIGS. 13A and 13B) is configured to apply a compression force (e.g., via a load application component) to the semiconductor and the substrate during insertion of the securing elements (an example is shown in FIGS. 14A-C), which enables the securing elements to be secured with minimal force and/or torque. After the clamp is released, the securing elements are loaded proportional to the in tension (e.g., uniformly, with each loaded with substantially the same tension). This approach can be beneficial for assembly using grids and/or arrays of fasteners, since serial insertion and/or loading of fasteners can result in non-uniformities, deformation, and residual stress within compressed layers. Accordingly, utilizing a clamping system can enable simultaneous loading of the plurality of fasteners to ensure uniform, compressive loading of the semiconductor, substrate, and compliant connector. However, securing elements can be otherwise suitably inserted.

However, the IC assembly can include any other suitable securing elements and/or otherwise exclude securing elements.

However, the IC assembly 200 can include any other suitable components and/or can otherwise suitably enable alignment and/or electrical connectivity between the semiconductor 210 and the substrate 220.

4. Methods of Precise Alignment of an Integrated Circuit Overview

In traditional integrated circuit assembly silicon semiconductor may be connected or otherwise, affixed to a substrate, such as a PCB. In such traditional integrated circuit assembly, the silicon semiconductor may be soldered via C4 balls or bumps. Prior an affixation of the silicon to the substrate, an alignment between the components may typically be required to ensure a proper operation of the integrated circuit once completed and shipped. In typical circumstances, the silicon component may be translucent to infrared light or the like and therefore, an alignment inspection may be performed using infrared light. In particular, a target feature may be arranged on the substrate and another on the silicon and an alignment may be achieved by using the infrared light to see through the silicon to determine an alignment between the target features.

However, in one or more embodiments of the present application, a large silicon substrate (a.k.a. wafer-scale substrate) may be assembled with one or more other integrated circuit components, such as a copper cold plate or the like, that may not enable a traditional infrared light-based technique for a precise alignment of the silicon substrate and panel substrate. Additionally, typical location features cannot be seen because a non-light transparent material being pressed against the large silicon substrate may obstruct visible light or non-visible light to the alignment features 212 of the semiconductor 210 and the substrate 220 which may support the semiconductor 210.

Moreover, during a clamping and/or assembly process of the components of an integrated circuit assembly, the silicon component may shift from a precise alignment with a panel substrate. In one or more embodiments of the integrated circuit assembly, an alignment between the silicon and the substrate cannot be properly inspected from a copper plate side (e.g., a copper plate placed on top of the silicon substrate). Similarly, it may be difficult to inspect of a side of a panel substrate or the like because the panel substrate typically includes a multi-layered printed circuit board or panel having fiberglass and other elements that may mask a location of targets on a top surface of the PCB.

The one or more embodiments described herein, however, provide multiple alignment techniques that may be performed individually and/or in combination to enable alignment inspections and alignment adjustments between two or more components of an integrated circuit assembly.

5. Split Electrical Vernier Scale Alignment

Figure 9:
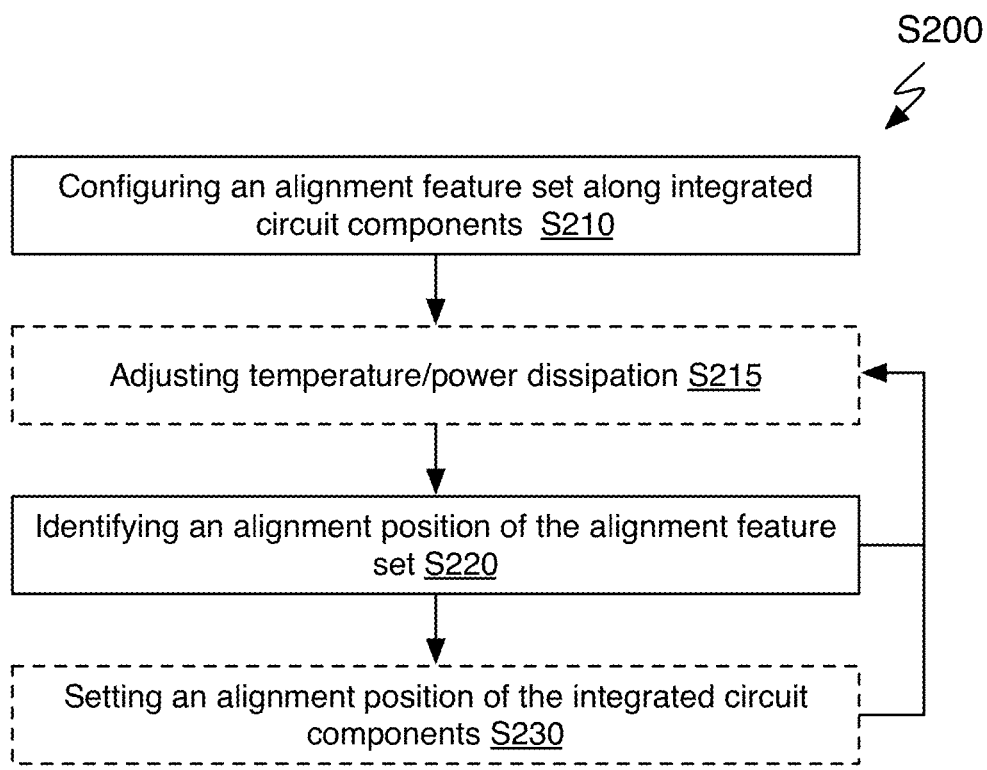
FIG. 9 illustrates a first method S200 for aligning components of an integrated circuit assembly in accordance with one or more embodiments of the present application.

As shown in FIG. 9, a method S200 for performing a precise alignment of two or more components of an integrated circuit assembly includes configuring an alignment feature set along integrated circuit components S210 and identifying an alignment position of the alignment feature set S220. The method S200 optionally includes adjusting a temperature and/or a power dissipation of an integrated circuit assembly based on an alignment measurement S215 and setting an alignment position of the integrated circuit components S230. The method S200 functions to precisely align two or more components of the integrated circuit assembly 200.

S210, which includes configuring an alignment feature set along integrated circuit components, may function to arrange each alignment feature of the alignment feature set on at least one of two distinct integrated circuit components that enables a precise alignment between the at least two distinct integrated circuit components based on an electrical alignment between two distinct alignment subsets of the alignment feature set.

In a preferred embodiment, S210 may function to implement the alignment feature set with a technique akin to a Vernier scale technique. Thus, in some embodiments, the alignment feature set may be referred to herein as a split Vernier technique or a bifurcated Vernier technique. In such embodiments, a first subset of the alignment feature set may include a first scale having multiple divisions (e.g., Vernier elements) formed by a plurality of graduation markings and/or alignment features that are spaced apart from each other. The multiple divisions of the first subset may be spaced apart with a predetermined pitch or distance (e.g., in a first pattern). Further, in such embodiments, a second subset of the alignment feature set may include a second scale having multiple divisions formed by a plurality of graduation markings. The multiple divisions of the second subset may be spaced apart with a distinct predetermined pitch or spacing that is different from the pitch of the divisions of the first subset (e.g., in a second pattern different from the first pattern).

It shall be known that while in a preferred embodiment, the spacing of the divisions of either the first subset or the second subset of the split Vernier scale may be equal, any suitable spacing along the divisions may be contemplated herein including, but not limited to, unequal spacings along an entirety of the divisions or scale, partly equal spacing and partly unequal spacing along the divisions or scale, equal spacing on one subset of the alignment feature set and unequal spacing of the other subset of the alignment feature set, and the like.

Figure 4:
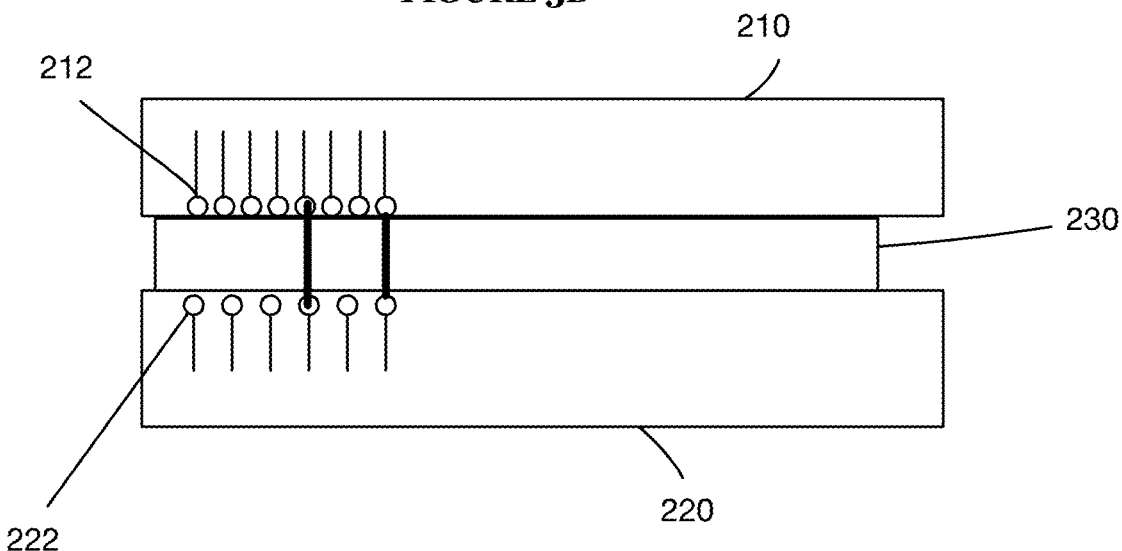
FIG. 4 illustrates an example schematic of a split Vernier scale alignment between distinct components of an assembly in accordance with one or more embodiments of the present application.

A first subset of the alignment feature set may be arranged on a silicon component of an integrated circuit assembly and a second subset of the alignment feature set may be arranged on a surface of a substrate opposing the first subset or a first surface of the silicon component (an example is shown in FIG. 4). It shall be known that the first subset and the second subset may be arranged in any suitable manner and may be positioned on either the silicon component or the substrate of the integrated circuit; preferably, however, the first subset and the second subset of the alignment feature set may be positioned near or along a peripheral edge of the silicon component and/or the substrate. For instance, an alignment feature of the alignment feature set may be arranged along a peripheral edge or peripheral surface of the silicon component (e.g., semiconductor component) away from a circuitry layer or circuitry components of the silicon component. Likewise, an alignment feature of the alignment feature set may be arranged along a peripheral edge or a peripheral surface of the substrate away from signal conducting components (e.g., microbumps, typical surface components of a PCB, etc.)

In a preferred embodiment, S210 may function to configure the divisions of the first subset of the alignment feature set with a granular spacing relative to a coarse spacing of the divisions of the second subset. That is, the granular spacing between divisions has a smaller pitch that the coarse spacing between divisions. In such preferred embodiment, the first subset of the alignment feature set having the granular division pitch may be placed on a silicon component and a corresponding second subset having the coarse division pitch may be placed on the substrate of an integrated circuit. Additionally, or alternatively, the arrangement and/or configuration of the subsets of the alignment feature set may be achieved in any suitable manner including arranging the first subset having the granular pitch on the substrate and the corresponding second subset with the coarse pitch onto the silicon component of the assembly.

In one embodiment, the alignment feature set may be arranged to enable a linear alignment and/or a single-dimension alignment of two or more components of an integrated circuit assembly. In such embodiment, the graduation markings of each of a first subset and a second subset of the alignment feature set may be set into a linear alignment along either a length or a width direction of at least two components of an integrated circuit assembly. For instance, alignment may be achieved in an X or a Y linear direction (e.g., lateral or longitudinal direction) of a two-dimensional coordinate system.

Additionally, or alternatively, the alignment feature set may be configured and/or arranged to enable a multi-dimensional alignment of two or more components of an assembly. In such embodiment, the graduation markings of each of a first subset and a second subset of the alignment feature set may be set in a non-linear fashion or an alignment such that alignment may be achieved in at least two dimensions (e.g., length and width dimensions) of two or more components of an integrated circuit assembly.

A first alignment feature may be configured and/or arranged on a component such that a first set of graduation markings of the alignment feature allows for alignment along a first measurement direction (e.g., a first axis) and a second set of graduation markings of the same alignment feature veers off into a second measurement direction (e.g., a second axis) to enable readings and/or measurements along the second measurement direction (an example is shown in FIG. 5). A corresponding second alignment feature having a similar or a same (non-linear) configuration as the first alignment feature may be arranged on an opposing surface (e.g., another assembly component) to enable the multi-dimensional alignment between the two subsets of the alignment feature set. Thus, by offsetting the graduation markings of the alignment features rather than maintaining strict adjacency and linear alignment between the graduation markings, shifts in alignment in multiple axes may be detected and/or an alignment in multiple dimensions may be achieved.

In a further implementation, the alignment feature set (e.g., rotational-split Vernier) may be configured and/or arranged to enable a rotational alignment between two components. In one embodiment, a plurality of alignment features may be arranged along a first component and a second plurality of alignment features may be arranged at an opposing surface to the first component. In such embodiment, the graduation markings and/or Vernier scale along each of the first component and the second component may have a (substantially) constant radius. Additionally, or alternatively, the graduation markings and/or Vernier scale along each of the first component and the second component may be either continuous and/or discontinuous. That is, in one embodiment, the alignment feature and/or the Vernier scale may be configured such that the divisions between the graduation markings is constant throughout a circumference Vernier scale formed by the graduation markings of the alignment feature thereby defining a continuous alignment feature. Alternatively, the alignment feature and/or the Vernier scale may be configured discontinuously such that the divisions between the graduation markings is non-constant throughout a circumference defined by the alignment feature.

Additionally, or alternatively, the alignment feature set may be configured and/or arranged to enable a detection of expansion and/or deformation of one or more components. For instance, within an integrated circuit assembly, deformation of a component may occur due to thermal expansion or contraction. In such embodiment, multiple distinct alignment features defining a first subset of the alignment feature set may be arranged along multiple locations of a first surface of a component and similarly, multiple distinct alignment features defining a second subset of the alignment feature set may be arranged along multiple positions of a second, opposing surface of a second component. Preferably, the alignment features of the first subset may be placed along the corners (if it has corners) of a first component and similarly, the alignment features of the second subset may be placed along corners or surface regions of a second component. If one or more components of an integrated circuit assembly does not have corners or the like, the alignment features of the alignment feature set may be arranged in any suitable manner along distinct positions of the surfaces of the two or more components of an integrated circuit assembly to measure deformations based on readings at the distinct positions.

In some embodiments, if an expansion or deformation (e.g., thermal strain) of one or more of the silicon component and/or the substrate is detected, in accordance with the above described configuration, optional step S215 can function adjust one or more of a temperature of the integrated circuit assembly (e.g., cooling, etc.) and/or control a power dissipation of the integrated circuit assembly (e.g., reduce power consumption to reduce heat generation, etc.). That is, S215 can function to detect a misalignment of the alignment feature sets and generate a signal based on a measured misalignment that causes a control of one or both of a cooling system and/or a power control system of the integrated circuit assembly for reducing the detected misalignment and/or deformation of the assembly.

In variants, S215 can include controlling a distribution of power dissipation across a plurality of die of the integrated circuit 100. In a specific example S215 can include: in response to detecting a first thermal strain at a first alignment feature set and a second thermal strain at a second alignment feature set, wherein the first thermal strain is larger than the second thermal strain, modifying a power distribution of the IC. Modifying a power distribution of the IC can include: increasing the power dissipation (e.g., cooling) of a first die proximal the first alignment feature set and decreasing the power dissipation of a second die proximal the second alignment feature set; decreasing the computational load assigned to the first die and/or increasing the computational load assigned to the second die; and/or otherwise managing die heating.

Figure 21:
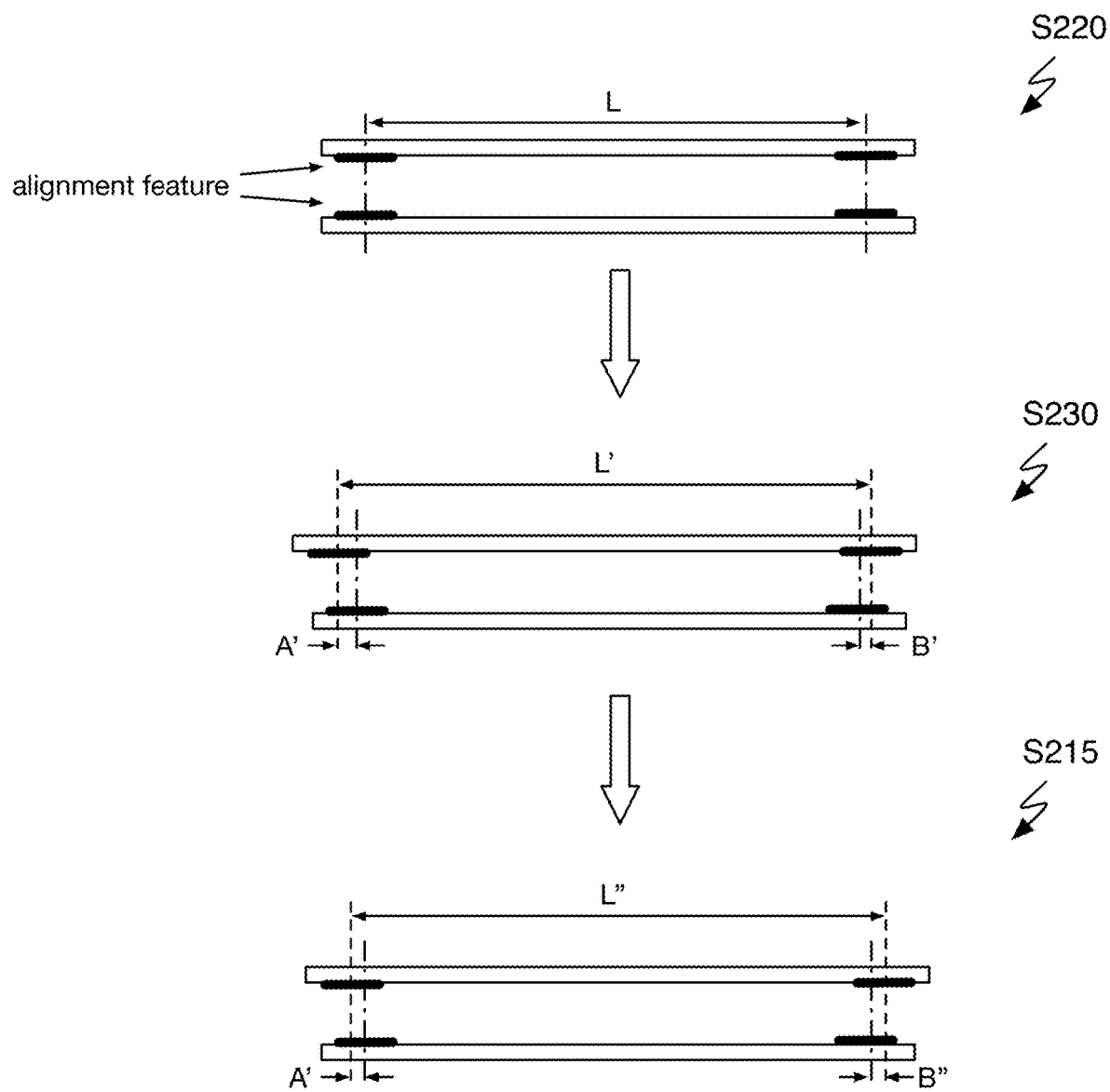
FIG. 21 illustrates diagrammatic representation of an example variant of the method S2000 in accordance with one or more embodiments of the present application.

Thermal strain within the semiconductor 210 can be determined based on an initial offset (e.g., L) between a first Vernier scale and a second Vernier scale which are arranged on opposite sides of the semiconductor (e.g., front face). The first and second Vernier scales can detect a change in alignment (A' and B' respectively) relative to the substrate 220. An expanded distance (L') between the first and second Vernier scales and the thermal strain ($\delta$) can be determined based on the change in alignment (e.g., $\delta=A'+B'$; $L'=L+A'+B'$; neglecting deformation of the substrate). In variants, S215 can adjust and/or modify control of the semiconductor such that the thermal strain is substantially uniform throughout the semiconductor (e.g., A"=B"; an example is shown in FIG. 21). However, thermal strain can be otherwise suitably determined.

Additionally, or alternatively, the graduation markings of the alignment features may be configured in any suitable shape. For instance, in some embodiments, graduation markings of an alignment feature of an alignment feature set may be configured in an oblong shape thereby enabling location sensitivity in primarily a single axis and/or single measurement direction. Thus, variant and/or different configurations and/or shapes of the alignment features may be used to enhance or degrade alignment and/or location sensitivity along one or more measurement directions (or one or more measurement axes). Preferably, alignment features having a relative (to a corresponding alignment feature) smaller shape and/or configuration may be attributed to silicon components of an integrated circuit assembly and relatively larger alignment features may be arranged on a substrate because a silicon component may have less available space due to active circuitry being arranged along a surface thereof.

S220, which includes identifying an alignment position of the alignment feature set, can function to determine an alignment of a first component relative to a second component based on measurements between the multiple distinct features of an alignment feature set. That is, S220 can function to detect arrangement positions of two aligning components based on readings from the alignment feature set.

Figure 3D:
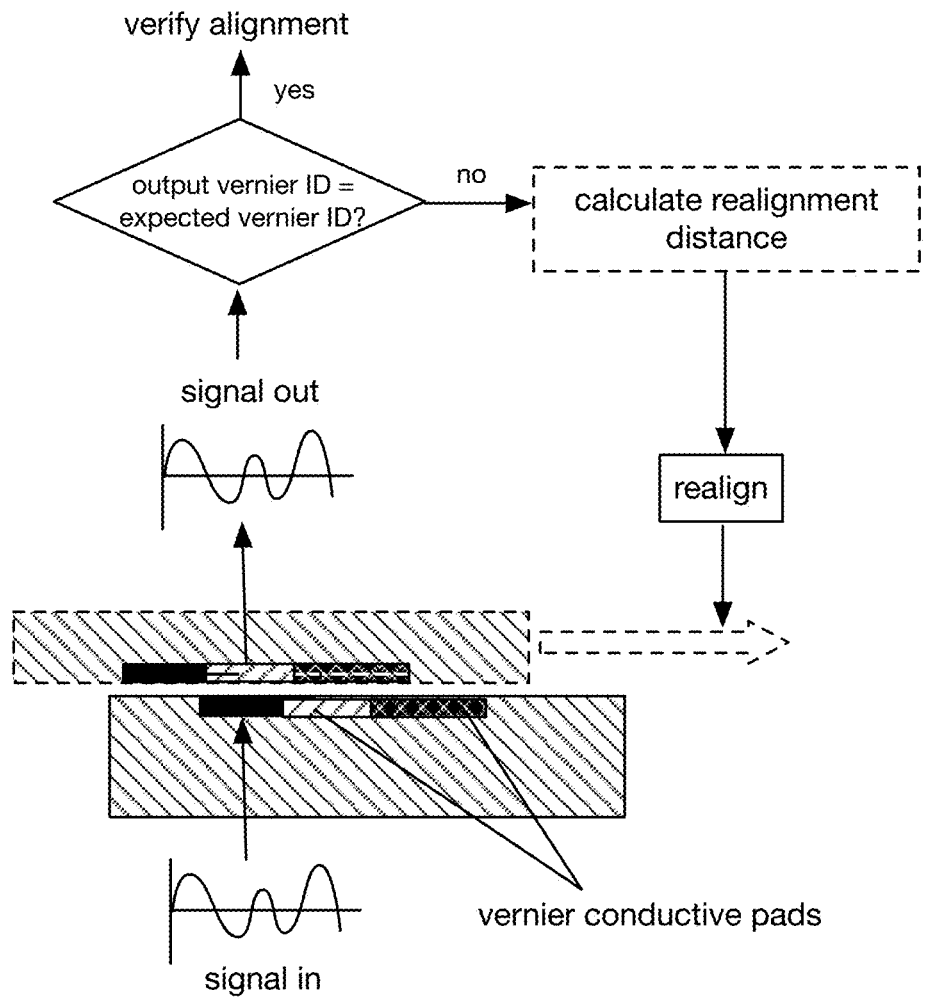

In an embodiment, the alignment feature set (AFS) includes alignment features capable of conducting electrical signals (example shown in FIG. 3D). In one or more embodiments, signal conduction may be found between any two opposing graduation marks of a first subset and a second subset of the alignment feature set. Typically, S220 may function to achieve a desired alignment by identifying where any two marks (one mark from a first subset and a second mark from a second subset of the AFS) of the AFS align and identifying a (misalignment) distance between two marks for which a desired alignment may be achieved.

For instance, in an embodiment, S220 may function to identify an alignment position between two or more components by providing a signal at one subset (e.g., positioned on a silicon component; on PCB; etc.) of the alignment feature set that may be received and/or detected at a second corresponding subset (e.g., arranged on a substrate or PCB; on semiconductor) of the alignment feature set. In such preferred embodiment, each of the first subset and the second subset of the alignment feature set may include at least one designated alignment mark selected from each of the plurality of graduation marks of the first subset and the second subset. Preferably, if the first designated alignment mark at a first subset becomes aligned with a second corresponding designated alignment mark at the second subset of the alignment feature set, S220 may function to indicate or determine that a precise alignment exists between the first subset and the second subset.

However, in the circumstance that the first designated alignment mark aligns with a graduation mark other than the second designated alignment mark at the second subset, S220 can function to determine a misalignment distance based on determining a position of the first designated alignment mark relative to the second designated alignment mark and the distance that the first designated alignment mark may be from the second designated alignment mark (e.g., wherein the alignment marks' absolute and/or relative positions are known). In one embodiment, S220 may function to determine a current position of the first designated alignment mark that is arranged on a first subset of the alignment feature set based on identifying a position of the graduation mark on the scale of the second subset of the alignment feature set that received an electrical signal from the first designated alignment mark. In such embodiment, S220 can function to identify a position of the graduation mark on the scale of the second subset and compute a distance from the graduation position to the second designated alignment position on the second subset of the alignment feature set. That is, S220 can function to perform an interim alignment between a designated or target alignment mark of a first subset and a non-designated or non-target alignment mark of the second subset. Using this information, S220 can function to determine a location of the non-designated alignment mark along the second subset and because the distance between each graduation mark on the second subset (scale) from the second designated alignment mark of the second subset may be known, S220 can compute the distance between the non-designated alignment mark of the second subset and the designated alignment mark of the second subset as the misalignment distance between the first designated alignment mark and the second designated alignment subset.

In variants, S220 can additionally or alternately be performed optically (e.g., for optical Vernier scale and/or elements). In such variants, the degree of alignment and/or relative position of IC assembly components can be determined based on the observability of one or more graduation marks. In a specific example, observability of a particular graduation mark (e.g., alignment target, Vernier element, etc.) corresponds to a predetermined range of misalignment in a particular dimension (e.g., 100-200 microns in the lateral direction). In such variants, optical alignment can be performed automatically (e.g., using an optical sensor such as a camera) and/or manually (e.g., by a human during an inspection, for a coarse Vernier scale).

S220 can additionally, or alternatively function to determine an expansion distances or alignment and/or rotational misalignment distance using any suitable or derivations of the one or more techniques described herein.

Additionally, or alternatively, a compliant connector or the like may be interposed between the alignment feature set. That is, in some embodiments, an compliant connector (e.g., elastomeric connector) that includes conductive elements may be arranged between a first subset and a second subset of the alignment feature set to enable a conduction of an alignment signal from the first subset through to the second subset of the alignment feature set. In a preferred embodiment, the conductive elements within a membrane of the elastomeric connector may be arranged with a finer or smaller pitch than a pitch of an alignment scale of the first subset and an alignment scale of the second subset. In this way, the finer pitch of the conductive elements of the elastomeric connector may ensure conductive contacts between each graduation mark of the first subset and the second subset of the multi-subset alignment and at least one conductive element of the compliant connector thereby allowing electrical signals to successfully pass from the first subset to the second subset.

Optional S230, which includes adjusting an alignment position of the integrated circuit components, can function to automatically set an alignment position of two or more assembly components based on a detected misalignment position of the alignment feature set. That is, based on an identified first or initial state of alignment between at least two components, S230 can function to automatically reposition the two or more components into a second state of alignment and/or desired state of alignment.

In a preferred embodiment, S230 can function to detect a misalignment of first alignment position based on an assessment of the electrical signal provided through the alignment feature set, from the first subset to the second subset. As discussed previously, S220/S230 can function to compute a misalignment distance based on identifying which of the graduation markings on a receiving subset of the alignment feature set by which the electrical signal was received and/or detected. In this way, S230 can function to compute a required distance between the graduation mark receiving the electrical signal and a desired alignment mark on the scale of the receiving subset.

It shall be noted that while, in some embodiments, a single distance in one dimension may be computed, any number of distances in any dimension and/or in any direction may be calculated for purposes of determining a current state of alignment and further calculating movements for achieving a desired state of alignment.

Additionally, or alternatively, S230 can function to implement a servo-controller to perform an alignment and/or any alignment adjustment based on a measured alignment between the distinct subsets of the alignment feature sets. Accordingly, S230 preferably functions to implement a servo-controller or the like that operates to move at least one of the two or more integrated circuit assembly components to achieve an alignment according to the alignment measures of the alignment feature set.

For instance, S230 can function to use the servo-controller to perform an initial and/or gross alignment between a first alignment subset and a second alignment subset of the alignment feature set. In such instance, S230 can function to achieve signal conduction between the first and the second subset. Thereafter, based on continuing signal conduction measurements between the first subset and the second subset, S230 can function to perform a fine alignment by implementing the servo controller (e.g., an Advanced Accuracy Placement Machine, etc.) to continuously, gradually, and/or periodically adjust an arrangement and/or an alignment of the integrated circuit assembly components until a desired alignment between designated alignment marks of the first subset and the second subset of the alignment feature set is achieved.

S230 can translate and/or rotate the first subset relative to the second subset. Translation adjustments in S230 preferably occur in plane with the broad face of the IC assembly, such as in a lateral and/or longitudinal direction (e.g., X, Y). Rotation adjustments in S230 preferably change a relative angular position of the first and second subset about an axis normal to the broad face (e.g., aligned with axis of fasteners, parallel with orifice axes in semiconductor, etc.). In variants, all rotational and/or translational adjustments can pertain to either the first subset (e.g., with the second subset static) or the second subset (e.g., with the first subset static). Alternately, adjustments can be distributed between the first and second subsets (e.g., X/Y axes associated with first subset, rotation associated with the second subset). Alternately, variants can exclude rotational adjustment and/or rely on coarse mechanical alignment of component boundaries (e.g., flat edges) to achieve rotational alignment within tolerance. Preferably, adjustments in each rotational and/or translational direction have higher precision and/or finer granularity than the Vernier scale and/or tolerance of alignment features. Accordingly, rotational and/or translational adjustments can define a minimum step size which is smaller (e.g., by an order of magnitude) than the precision of the alignment measurement (e.g., smallest observable misalignment of the first and second subsets) and/or enable continuously variable adjustment (e.g., with negligible mechanical backlash in adjustment mechanisms such as: harmonic, cycloidal, epicyclic, and/or traction drives).

In a specific example, the first subset can be supported by a platform with a first (lateral) stage and a second (longitudinal) stage. In response to determining an offset and/or misalignment in the lateral direction (e.g., of a dimension exceeding a threshold offset) between the first subset and the second subset, S230 controls the lateral stage of the platform to translate the first subset in a first direction opposing the lateral offset (e.g., shift first alignment feature towards alignment feature or vice versa). In response to determining an offset and/or misalignment in a longitudinal direction 230 controls the longitudinal stage of the platform in a second direction opposing the longitudinal offset.

However, adjustments can be otherwise suitably performed.

It shall be noted that while the one or more techniques described in the method S200 are preferably applied for enabling a precise alignment between integrated circuit components, the method S200 and/or the method S300 (described in more detail below) may be applied to create a precise alignment between any two or more components, systems, devices, and/or the like.

6. Alignment Using High Visual Contrasting Material

In one or more embodiments of the present application, an alignment between distinct subsets of an integrated circuit assembly may be achieved using the disclosed split Vernier technique. However, in some instances, the split Vernier technique using electrical conduction may result in a precise, but sometimes gross or coarse alignment between the two or more components of the integrated circuit assembly. In some embodiments, a further alignment inspection and/or requirements for an even higher precision alignment may be required. In such instance, the split Vernier technique, which may use electrical signals to achieve an alignment, may be augmented with one or more mechanical alignment techniques for achieving an even higher precision alignment between two or more components of an integrated circuit assembly, as described in more detail in the method S300.

Accordingly, the methods S200/S300 described herein preferably enable an inspection during an assembly and/or after an assembly of an integrated circuit and an ability to adjust an alignment of integrated circuit components preferably before powering the integrated circuit.

Figure 10:
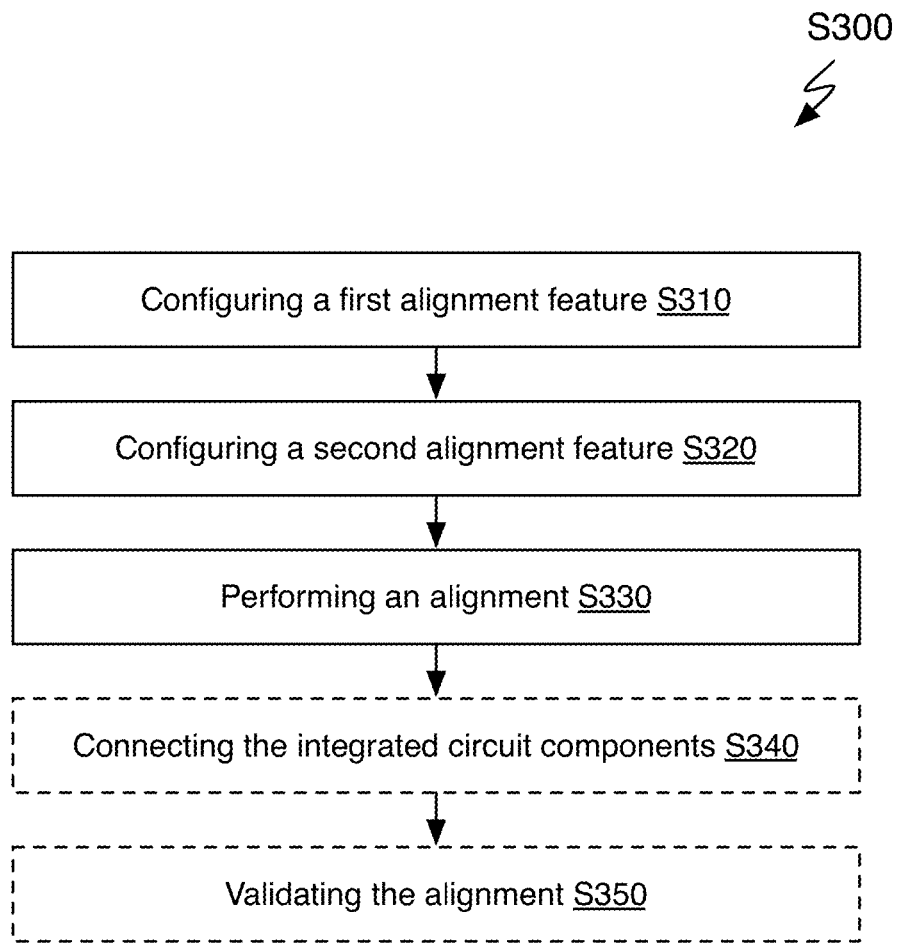
FIG. 10 illustrates a second method S300 for aligning components of an integrated circuit assembly in accordance with one or more embodiments of the present application.
Figure 11:
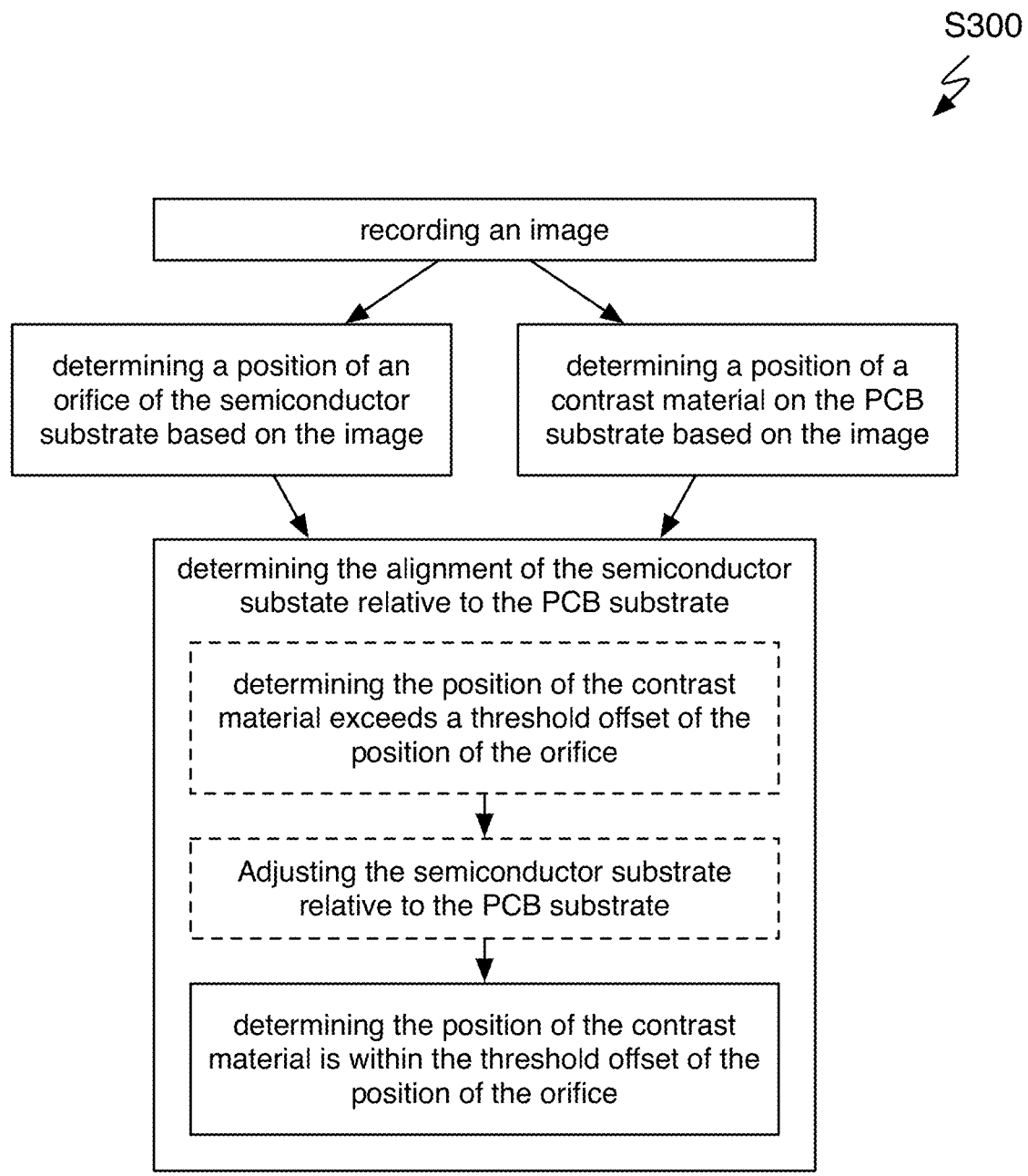
FIG. 11 illustrates a diagrammatic example of the method for aligning components of an integrated circuit assembly in accordance with one or more embodiments of the present application.
Figure 12:
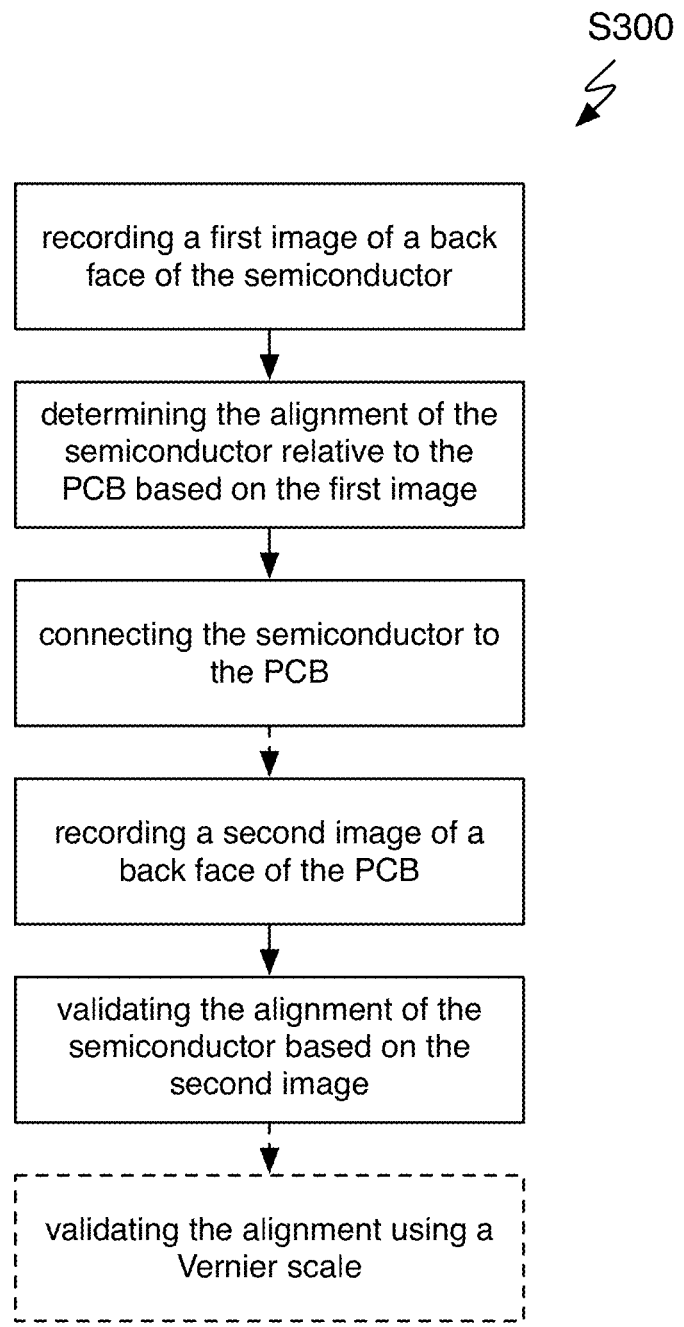
FIG. 12 illustrates a diagrammatic example of the method for aligning components of an integrated circuit assembly in accordance with one or more embodiments of the present application.

As shown in FIG. 10, a method S300 that enables a high precision alignment of two or more components of an integrated circuit assembly includes configuring a first alignment feature on a silicon component of an integrated circuit assembly S310, configuring a second alignment feature on a substrate component of an integrated circuit assembly S320, and performing an alignment of two or more integrated circuit components S330. S300 can optionally include connecting the integrated circuit components S340 and validating the alignment S350. However, S300 can include any other suitable elements. First and second examples of S300 are shown in FIGURES ii and FIG. 12, respectively.

S310, which includes configuring a first alignment feature on a silicon component of an integrated circuit assembly, can function to fabricate a first alignment feature on a silicon component of an integrated circuit assembly and install or augment a visibly perceivable second alignment feature on a substrate of the integrated circuit assembly.

Figure 6:
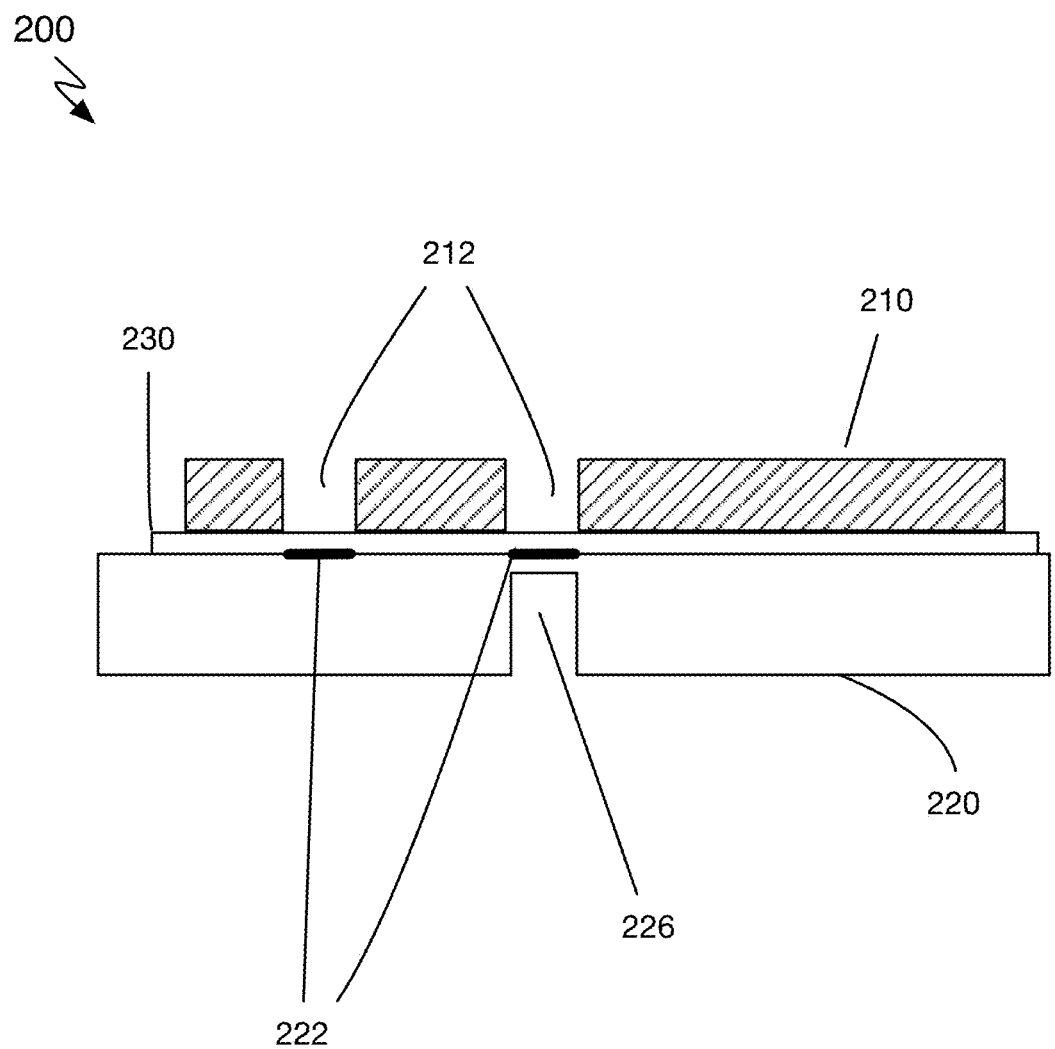
FIG. 6 illustrates a schematic example of an integrated circuit assembly implementing multiple alignment measurement techniques in accordance with one or more embodiments of the present application.

In a preferred embodiment, the first alignment feature can include a via or a through hole through which a visible inspection through a silicon component can be achieved (an example is shown in FIG. 6). That is, by creating an orifice (e.g., through hole) in the silicon component, it is possible to see through from a first side of the silicon component where the through hole begins through to and beyond a second side of the silicon component where the through hole ends.

In some embodiments, S310 may function to configure a two-dimensional shape and/or size of the first alignment feature along a first component to match or substantially match a shape and/or size of the second alignment feature along a second component. That is, in a preferred embodiment, the first alignment feature shares a same, slightly smaller, or slightly larger geometry as the second alignment feature. For instance, if a second alignment feature on a substrate of an IC assembly includes a pad having a predetermined polygonal shape (e.g., a square or the like) with set dimensions, S310 may function to configure the first alignment feature to having a matching polygonal shape and/or size. In this way, in alignment in shape and/or size may be achieved when viewing through the first alignment feature to the second alignment feature. Additionally, or alternatively, the size of the second alignment feature, in some embodiments, may be set smaller than a size of the first alignment feature. In this way, the second alignment feature may fit squarely within a view area through the first alignment feature.

In some embodiments, the via or through hole may be fabricated in any suitable manner including, but not limited to, using a chemical etching technique (e.g., deep reactive-ion etching (DRIE)), mechanical drilling, laser drilling or laser ablation, any combination thereof, and/or the like.

S320, which includes configuring a second alignment feature, may function to configure the second alignment feature, as a target alignment feature, which includes installing or adding an alignment target onto a substrate of an integrated circuit assembly that can be seen through the first alignment feature of the integrated circuit assembly. In one preferred embodiment, the second alignment feature includes a feature having high visual contrast relative to the substrate onto which the second alignment feature may be found. In some embodiments, a high visual contrast relates to a measured color contrast between the second alignment feature and the substrate that exceeds a high contrast threshold.

In some embodiments, the second alignment feature includes a metallic alignment feature. Any suitable metallic alignment feature with a contrasting appearance from a substrate may be implemented as the second alignment feature; preferably, the metallic alignment feature includes a copper material. Thus, in such preferred embodiment, a copper element may be installed or otherwise, integrated with one a side of a substrate of an integrated circuit assembly that can be viewed through a through hole alignment feature of an opposing silicon component.

Additionally, or alternatively, S320 may function configure the second alignment feature with the substrate in any suitable manner including, but not limited to, installing the second alignment feature onto the substrate as a pad (e.g., a copper pad), embedding and/or integrating the second alignment feature into depth of a material of the substrate, modifying a surface or subset of the substrate (e.g., coloring the substrate and/or adding metallic particles), and/or the like.

Figure 7:
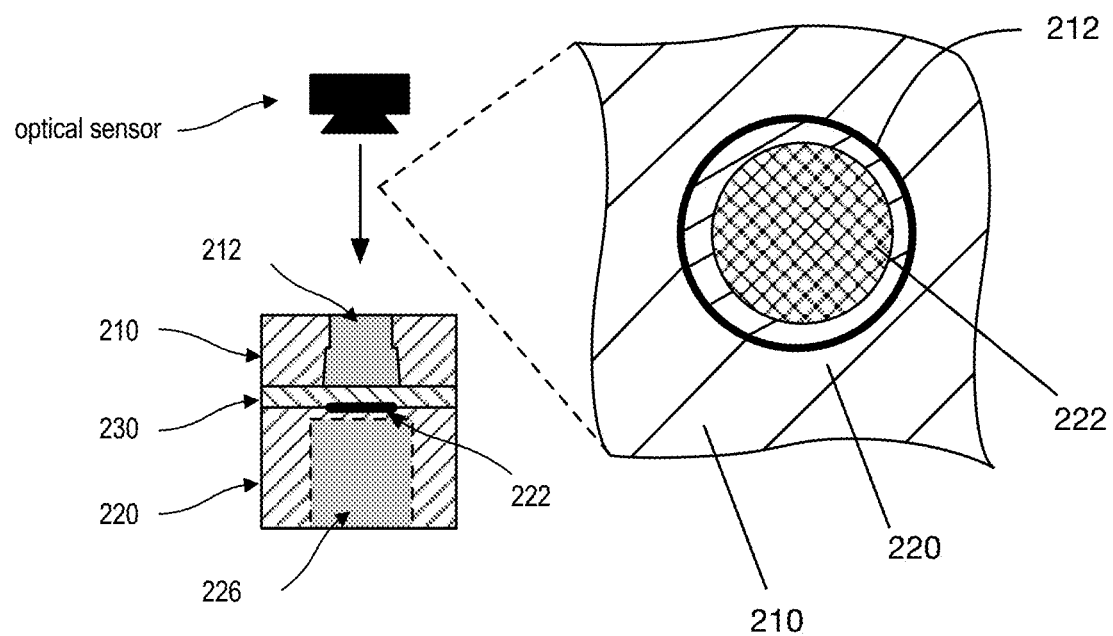
FIG. 7 illustrates a schematic representation of an alignment of an alignment feature set and a view from a perspective through a first alignment feature in accordance with one or more embodiments of the present application.

S330, which includes performing an alignment of two or more integrated circuit components, may function to perform an alignment between the first alignment feature and the second alignment feature based on an optical inspection. In a preferred embodiment, an optical inspection for detecting an alignment between the first alignment feature and the second alignment feature can be performed using natural light and/or visible light. For instance, S330 may function to implement an imaging device (e.g., a still image camera, a video camera, etc.) to capture images of the alignment features using visible light. In such instances, S330 can function to detect an alignment between the alignment features by optically inspection through the hole of the first alignment feature at the silicon component to a high-contrast material of the second alignment feature at the substrate component of the integrated circuit assembly (an example is shown in FIG. 7).

While it can be preferred to perform an alignment using optical analysis, alignment between the first alignment feature and the second alignment feature can be achieved using infrared analysis (e.g., non-visible light) and/or any known alignment technique.

In one or more embodiments, S330 can function to detect an alignment between the first alignment feature and the second alignment feature when or if the second alignment feature completely covers or fills a viewing area of the through hole defining the first alignment feature of the silicon component. That is, during a visual inspection through the through hole of the first alignment feature, only images or features of the second alignment feature can be optically detected.

Additionally, or alternatively, S330 can function to detect an alignment between the first alignment feature and the second alignment feature when or if the second alignment feature is completely within the viewing area of the through hole defining the first alignment feature. That is, in such embodiments, the second alignment feature (e.g., a high-contrast metallic material) may be made smaller than a size of a viewing area of the through hole of the first alignment feature, such that when viewing through the through hole, the entirety of the second alignment feature including its peripheral edges or boundaries can be optically detected. Incidentally, in such embodiments, a small amount of area (e.g., areas of the substrate material) beyond the second alignment feature may also appear within the view area of the through hole.

Additionally, or alternatively, S330 can function to adjust an alignment position of two or more components of an integrated circuit assembly based on an optical analysis of an alignment between the first alignment feature and the second alignment feature. For instance, an optical analysis may indicate that the second alignment feature cannot be viewed via the first alignment feature of a silicon component and may additionally indicate an image-based position of the second alignment feature of the substrate. In such example, S330 may function to servo adjust, using a servo controller or the like (e.g., an Advanced Accuracy Placement Machine, etc.), an arrangement of the silicon component and/or the substrate based on image-based position of the second alignment feature of the substrate until an optical analysis indicates that the second alignment feature can be viewed and/or may be optically detected through the first alignment feature of the silicon component.

It shall be known that, while it may be preferred that S330 performs an alignment of the first and the second alignment features by physically adjusting the substrate, S330 may function to adjust an alignment and/or an arrangement of the silicon component as well.

In a specific example, when a contrast material of the substrate 220 exceeds a threshold offset from an alignment feature of the semiconductor 210, S330 includes adjusting the semiconductor 210 relative to the substrate 220 based on a difference between a position of the contrast material and a position of the alignment feature.

S300 can optionally include connecting the integrated circuit components S340, which functions to mechanically mount the semiconductor 210 to the substrate S220. S340 can additionally or alternately function to establish a thermal interface between (and/or thermally connecting) the semiconductor 210 and the thermal management component 240. S240 can additionally or alternately function to electrically connect the semiconductor 210 to the substrate 220.

S340 can include: arranging a thermal management component in thermal contact with a back face of the semiconductor 210, which can provide a thermal interface for subsequent cooling the semiconductor (e.g., during operation). The thermal management component arranged in S340 can cover/obstruct one or more orifices of the semiconductor and/or form a lumen with the orifice(s) which, along with the body of the semiconductor and the compliant connector, encloses a volume of air. The thermal management component arranged in S340 can additionally or alternately not obstruct orifices of the semiconductor and/or include a set of orifices aligned with the orifices of the semiconductor (and/or PCB), such as orifices which receive securing elements. However, S340 can alternately exclude arrangement of a thermal management component.

S340 can include compressing the integrated circuit components, such as the substrate 220, the semiconductor 210, the thermal management component 240, and/or the compliant connector 230, with a compression force, which can electrically connect the substrate to the semiconductor by way of the compliant connector. The compression can be applied by load application components on opposing sides of the IC assembly, which clamp the IC assembly (e.g., an example is shown in FIG. 14C). While the IC assembly is clamped, securing elements 250 can be inserted (e.g., with minimal force/torque) through orifices of the assembly (an example is shown in FIG. 15).

In variants, S340 can be performed by the method in described U.S. application Ser. No. 16/056,792, filed 7 Aug. 2018, which is incorporated in its entirety by this reference.

However, integrated circuit components can be otherwise suitably connected.

S300 can optionally include validating the alignment S350 which functions to identify any misalignments (or lack thereof) occurring after connection of the integrated circuit components. In variants, S350 can include performing S200, such as confirming alignment using an electrical Vernier technique and/or human inspection of a coarse/optical Vernier scale (e.g., confirming that the components have not observably shifted during assembly and/or transit).

In variants, S350 can include performing a second optical analysis, which can be the same as the analysis in S330 or different. In a specific example, S330 includes: recording a first image comprising the front face of the substrate 220 viewed through an orifice in the semiconductor 210; and based on the first image, determining whether a contrast material, arranged on the front face of the substrate 220, is within a threshold offset from the orifice. In this example, S350 can include recording a second image from a back face of the PCB; and based on the second image, determining that the contrast material is within the threshold offset of the orifice. Accordingly, the second optical analysis can be performed from an opposing side of the IC assembly, which can be useful in cases where, during S340, a thermal management component (e.g., opaque layer) is arranged which partially or fully obstructs (covers) the orifice from the viewing perspective of the first image. In a second example, S350 can include a second optical analysis which relies upon the counterbore hole alignment technique.

In variants which utilize a clamping system to connect the integrated circuit components, S300 can additionally include: ceasing application of the compression force by the clamping system in response to validating the alignment in S350. In particular, for examples which include an electrical Vernier scale, it can be advantageous to validate electrical connectivity of the semiconductor and the substrate (e.g., as described in S200) before inserting securing elements and/or during application of the compression force by the clamping system.

However, S350 can otherwise suitably validate the alignment of the integrated circuit components.

6.1 Variant: Counterbore Hole Alignment

In one variant of the method S300, an arrangement of a first alignment feature and a second alignment feature can be exchanged such that the first alignment feature can be located on the substrate and the second alignment feature (i.e., the target alignment feature) may be integrated with the silicon component of an integrated circuit assembly.

In such variant, S310 can function to fabricate a counterbore hole and/or a hole that is not extended fully through (i.e., a non-through hole) a material of a substrate of the integrated circuit assembly. That is, S310 may function fabricate a hole or an orifice within the substrate that removes a first depth of material from the substrate while leaving a remnant depth of material of the substrate beyond the hole. Thus, in such embodiments, the first alignment feature comprises the remnant depth of material and the hole of the substrate together. Preferably, the remnant depth of material is thin or below a visibility depth threshold. In such preferred embodiment, the remnant depth of material may be sufficiently thin to enable transparency through the remnant depth of material of the substrate into the hole.

Further, in such variant, S320 can function to arrange and/or otherwise integrate the second alignment feature (e.g., a target alignment feature) along a silicon component of an integrated circuit assembly. In a preferred embodiment, the second alignment feature, such as a high-contrast material (e.g., a high-contrast metallic material), such as a copper pad, may be affixed to the silicon component of the assembly. In some embodiments, the second alignment feature may be affixed to the silicon component such that it hangs from the silicon component and during an alignment of the substrate with the silicon component, the second alignment feature may function to hang into the first alignment feature of the substrate.

Figure 8A:
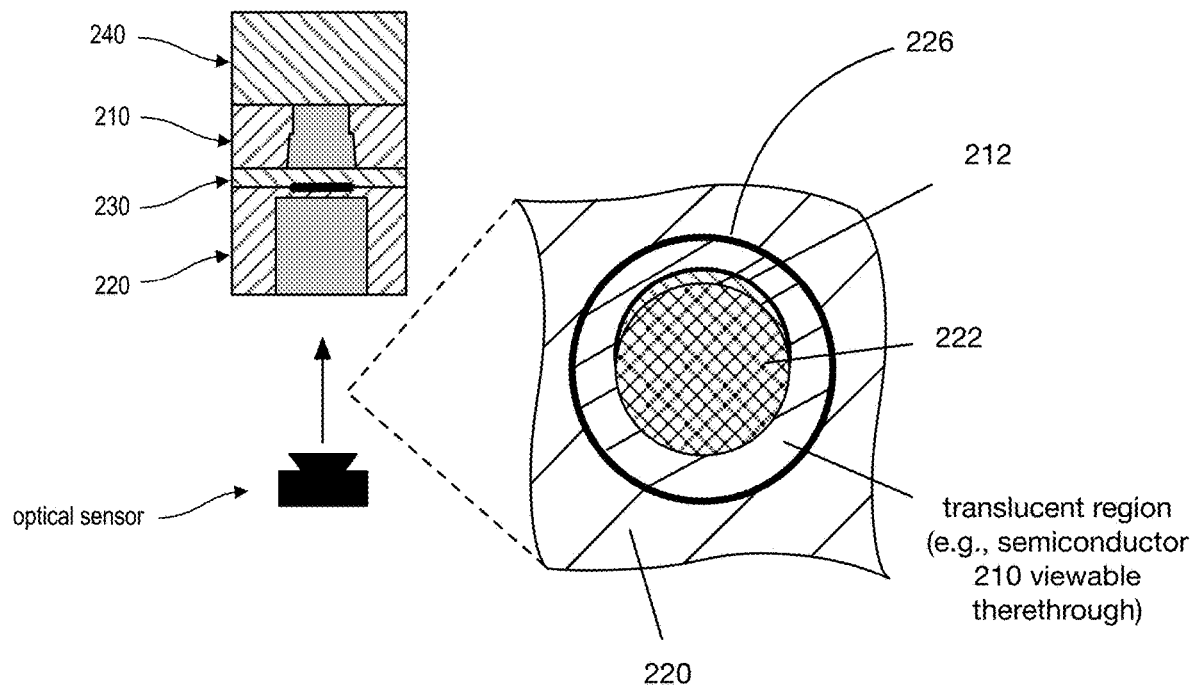
FIGS. 8A and 8B illustrate a first and second schematic representation, respectively, of an alignment of an alignment feature set and a view from a perspective through a PCB substrate in accordance with one or more embodiments of the present application.
Figure 8B:
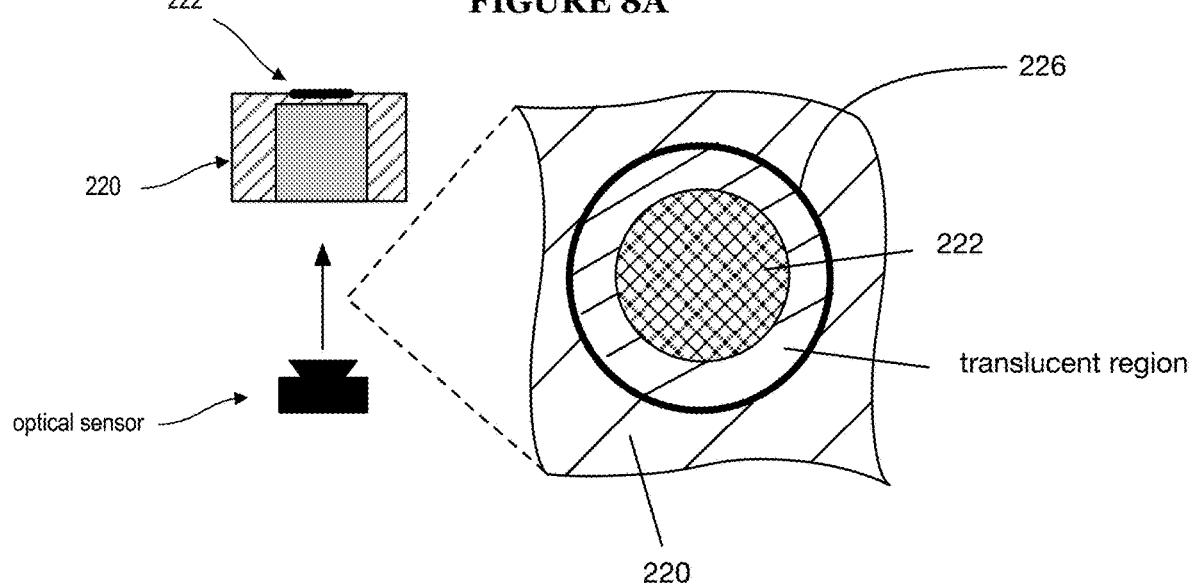

Accordingly, during an alignment of the first alignment feature and the second alignment feature in this variant, S330 can function to perform an alignment of the first alignment feature of the substrate and the second alignment feature of the silicon component by a visual inspection and/or optical analysis that determines an alignment of the first alignment feature and the second alignment feature based on visually or optically confirming that the second alignment feature (e.g., the high-contrast material) can be optically detected through the remnant depth of material and through the hole (i.e., the first alignment feature) of the of the substrate (an example is shown in FIGS. 8A and 8B).

It shall be understood that the methods S200 and S300 are exemplary methods that may be implemented in any suitable order to achieve the inventions and/or embodiments of the inventions within the purview or that may be easily contemplated in view of the disclosure provided herein. Thus, the order and process steps should not be limited to the exemplary order provided herein.

The methods of the preferred embodiment and variations thereof can be embodied and/or implemented at least in part as a machine configured to receive a computer-readable medium storing computer-readable instructions. The instructions are preferably executed by computer-executable components preferably integrated with the lithography system and one or more portions of the processors and/or the controllers implemented thereby. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the embodiments of the system and/or method can include every combination and permutation of the various system components and the various method processes, wherein one or more instances of the method and/or processes described herein can be performed asynchronously (e.g., sequentially), concurrently (e.g., in parallel), or in any other suitable order by and/or using one or more instances of the systems, elements, and/or entities described herein.

As a person skilled in the art will recognize from the previous detailed description and from the figures and claims, modifications and changes can be made to the preferred embodiments of the invention without departing from the scope of this invention defined in the following claims.

We claim:

1. A method comprising:
   aligning a front face of a printed circuit board (PCB) against a front face of a semiconductor, comprising:
      recording a first image comprising the front face of the PCB viewed through an orifice in the semiconductor;
      based on the first image, determining whether a contrast material, arranged on the front face of the PCB, is within a threshold offset from the orifice; and
      when the contrast material is within the threshold offset from the orifice, connecting the semiconductor to the PCB, comprising compressing a compliant connector between the semiconductor and the PCB by applying a compression force;
   before connecting the semiconductor to the PCB, covering the first orifice with an opaque layer at a first broad face; and
   validating alignment of the PCB and the semiconductor, comprising:
      recording a second image from a back face of the PCB; and
      based on the second image, determining that the contrast material is within the threshold offset of the orifice.

2. The method of claim 1, further comprising, when the contrast material is not within the threshold offset, adjusting the semiconductor relative to the PCB based on a difference between a position of the contrast material and a position of the orifice.

3. The method of claim 1, further comprising: after validating alignment of the PCB and the semiconductor, ceasing application of the compression force.

4. The method of claim 1, further comprising, along an orifice axis normal to the front face of the semiconductor:
   fabricating a cavity in the semiconductor using a first material removal technique, the cavity comprising a first radius about the orifice axis and a first depth along the orifice axis; and
   subsequently fabricating the orifice in the semiconductor using a second material removal technique, the orifice comprising a second radius about the orifice axis, wherein the second radius is smaller than the first radius, wherein the first and second material removal techniques remove material in the same direction along the orifice axis.

5. The method of claim 4, further comprising lithographically fabricating a plurality of die at the front face of the semiconductor.

6. The method of claim 1, further comprising: forming a metal layer on the front face of the PCB, the metal layer comprising a plurality of conductive pads and the contrast material.

7. The method of claim 1, wherein validating alignment of the PCB and the semiconductor further comprises: determining an alignment of a first Vernier element on the front face of the semiconductor with a second Vernier element on a front face of the PCB.

8. The method of claim 7, wherein determining the alignment of the first Vernier element with the second Vernier element comprises:
   providing an electrical signal at the first Vernier element; and
   measuring the electrical signal at the second Vernier element.

9. The method of claim 8, further comprising: determining thermal strain of the semiconductor based on the measurement of the electrical signal at the second Vernier element.

10. The method of claim 7, wherein the first Vernier element comprises an inspection orifice extending through a thickness of the PCB, wherein the first Vernier element establishes an optical pathway through the PCB to the second Vernier element, wherein determining the alignment of the first Vernier element and the second Vernier element comprises a human visually inspecting the second Vernier element.

11. The method of claim 1, wherein the first and second images are visible light images.

12. A system comprising:
   an integrated circuit comprising:
      a semiconductor defining a front face, a back face, and an orifice extending from the front face to the back face;
      a die formed on the front face;
      a first plurality of conductive pads arranged along the front face and electrically connected to the die;
   a printed circuit board (PCB) defining a front PCB face, a back PCB face, and a cavity extending from the back PCB face through a partial thickness of the PCB, the PCB comprising:
      a second plurality of conductive pads arranged along the front face; and a contrast material arranged along the front face, the contrast material aligned with the cavity and the orifice; and a compliant connector arranged between the front faces of the semiconductor and the PCB, the compliant connector electrically connecting each of the first plurality of conductive pads to a respective conductive pad of the second plurality, wherein the PCB is substantially opaque, and wherein a remaining thickness of the PCB between a base of the cavity and the front PCB face is translucent.

13. The system of claim 12, wherein the orifice defines an orifice diameter within a threshold tolerance of a diameter of the contrast material.

14. The system of claim 12, wherein the contrast material is aligned with the cavity and the orifice using an optical sensor opposing the semiconductor across a thickness of the PCB, the optical sensor oriented towards the semiconductor and configured to detect an alignment of the contrast material relative to the orifice.

15. The system of claim 12, wherein the second plurality of conductive pads are formed with the contrast material.

16. The system of claim 12, wherein the cavity and the contrast material cooperatively define a translucent annulus along the front PCB face.

17. The system of claim 12, wherein the contrast material is offset from a color of the PCB by greater than a threshold color distance.

18. The system of claim 12, a heat sink arranged along the back face of the semiconductor, wherein the heat sink is opaque.

19. The system of claim 18, wherein the cavity, the heat sink, and the compliant connector cooperatively enclose a volume of air.

20. A system comprising:
an integrated circuit comprising:
a semiconductor defining a front face, a back face, and an orifice extending from the front face to the back face;
a die formed on the front face;
a first plurality of conductive pads arranged along the front face and electrically connected to the die;
a printed circuit board (PCB) defining a front PCB face, a back PCB face, and a cavity extending from the back PCB face through a partial thickness of the PCB, the PCB comprising:
a second plurality of conductive pads arranged along the front face; and
a contrast material arranged along the front face, the contrast material aligned with the cavity and the orifice; and
a compliant connector arranged between the front faces of the semiconductor and the PCB, the compliant connector electrically connecting each of the first plurality of conductive pads to a respective conductive pad of the second plurality; and
a thermal management component arranged along the back face of the semiconductor, wherein the thermal management component is opaque, wherein the cavity, the thermal management component, and the compliant connector cooperatively enclose a volume of air.

21. The system of claim 20, wherein the thermal management component comprises a heat sink.

* * * * *